US012782458B2

(12) United States Patent
Shimizu et al.

(10) Patent No.: US 12,782,458 B2
(45) Date of Patent: Nov. 3, 2026

(54) BATTERY MONITORING DEVICE, AND BATTERY MANAGEMENT UNIT

(71) Applicant: DENSO CORPORATION, Kariya-city (JP)

(72) Inventors: Satoru Shimizu, Kariya-city (JP); Kazuaki Mawatari, Kariya-city (JP); Kazuyuki Ono, Kariya-city (JP); Kumiko Kawabata, Kariya-city (JP); Hiroshige Matsui, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 211 days.

(21) Appl. No.: 18/750,795

(22) Filed: Jun. 21, 2024

(65) Prior Publication Data

US 2024/0345174 A1 Oct. 17, 2024

Related U.S. Application Data

(63) Continuation of application No. PCT/JP2022/045716, filed on Dec. 12, 2022.

(30) Foreign Application Priority Data

Dec. 24, 2021 (JP) ................................ 2021-211047
Jun. 29, 2022 (JP) ................................ 2022-104707

(51) Int. Cl.
*G01R 31/36* (2020.01)
*G01R 31/374* (2019.01)
(Continued)

(52) U.S. Cl.
CPC ......... *G01R 31/392* (2019.01); *G01R 31/374* (2019.01); *G01R 31/389* (2019.01);
(Continued)

(58) Field of Classification Search
CPC .. G01R 31/392; G01R 31/374; G01R 31/389; G01R 31/396; G01R 31/367;
(Continued)

(56) References Cited

U.S. PATENT DOCUMENTS 11,152,652 B2 10/2021 Wang et al.
2014/0322576 A1* 10/2014 Okumura .......... H01M 10/0567 429/94

(Continued)

FOREIGN PATENT DOCUMENTS

CN 112751102 A 5/2021
JP 2010086901 A 4/2010

(Continued)

OTHER PUBLICATIONS

U.S. Appl. No. 19/693,743, filed Jun. 1, 2026, to Satoru Shimizu et al. (101 pages).

(Continued)

*Primary Examiner* — Alesa Allgood
(74) *Attorney, Agent, or Firm* — Nixon & Vanderhye P.C.

(57) ABSTRACT

A battery monitoring device monitors a lithium precipitation amount in a lithium ion battery. The battery monitoring device includes a precipitation amount detection unit that has a short circuit for discharging the lithium ion battery by temporarily shorting both ends of the lithium ion battery. The lithium precipitation amount detection unit calculates an estimation value of the lithium precipitation amount based on a change in at least one of current or voltage when both the ends of the lithium ion battery is shorted by the short circuit. The battery monitoring device includes a temperature sensor that detects a battery temperature of the lithium ion battery.

14 Claims, 32 Drawing Sheets

(51) Int. Cl.

| | |
|---|---|
| ***G01R 31/389*** | (2019.01) |
| ***G01R 31/392*** | (2019.01) |
| ***H01M 10/0525*** | (2010.01) |
| ***H01M 10/42*** | (2006.01) |
| ***H01M 10/48*** | (2006.01) |
| ***H01M 10/615*** | (2014.01) |
| ***H01M 10/625*** | (2014.01) |
| ***H01M 10/63*** | (2014.01) |
| ***H01M 10/6571*** | (2014.01) |
| ***H02J 7/80*** | (2026.01) |
| *B60L 58/10* | (2019.01) |

(52) U.S. Cl.
CPC ... *H01M 10/0525* (2013.01); *H01M 10/4285* (2013.01); *H01M 10/486* (2013.01); *H01M 10/615* (2015.04); *H01M 10/625* (2015.04); *H01M 10/63* (2015.04); *H01M 10/6571* (2015.04); *H02J 7/80* (2026.01); *B60L 58/10* (2019.02)

(58) Field of Classification Search
CPC .. G01R 31/386; G01R 31/387; G01R 31/378; H01M 10/0525; H01M 10/4285; H01M 10/486; H01M 10/615; H01M 10/625; H01M 10/63; H01M 10/6571; H01M 10/44; H01M 10/425; H01M 10/443; H01M 10/48; H02J 7/80; H02J 7/00; B60L 58/10; Y02E 60/10
See application file for complete search history.

(56) References Cited

U.S. PATENT DOCUMENTS

| | | | |
|---|---|---|---|
| 2017/0234930 | A1 | 8/2017 | Lee et al. |
| 2018/0340984 | A1 | 11/2018 | Kanada et al. |
| 2022/0131400 | A1 | 4/2022 | Nakao et al. |

FOREIGN PATENT DOCUMENTS

| | | | |
|---|---|---|---|
| JP | 2010212019 | A | 9/2010 |
| JP | 2014032826 | A | 2/2014 |
| JP | 2014102076 | A | 6/2014 |
| JP | 2020-169968 | | 10/2020 |
| JP | 2021021579 | A | 2/2021 |
| JP | 2021190307 | A | 12/2021 |
| KR | 10-2021-0046890 | | 4/2021 |
| WO | 2013024533 | A1 | 2/2013 |
| WO | 2023127602 | A1 | 7/2023 |
| WO | 2024004716 | A1 | 1/2024 |

OTHER PUBLICATIONS

U.S. Appl. No. 18/999,591 to Satoru Shimizu, filed Dec. 23, 2024 (97 pages).
U.S. Appl. No. 18/999,761 to Satoru Shimizu, filed Dec. 23, 2024 (98 pages).
U.S. Appl. No. 18/750,764, to Shimizu et al., filed Jun. 21, 2024 (100 pages).
U.S. Appl. No. 18/750,771, to Shimizu et al., filed Jun. 21, 2024 (45 pages).

* cited by examiner

BATTERY MONITORING DEVICE, AND BATTERY MANAGEMENT UNIT

CROSS REFERENCE TO RELATED APPLICATIONS

The present application is a continuation application of International Patent Application No. PCT/JP2022/045716 filed on Dec. 12, 2022, which designated the U.S. and claims the benefit of priority from Japanese Patent Application No. 2021-211047 filed on Dec. 24, 2021 and Japanese Patent Application No. 2022-104707 filed on Jun. 29, 2022. The entire disclosures of all of the above applications are incorporated herein by reference.

TECHNICAL FIELD

The present disclosure relates to a battery monitoring device, and a battery management unit.

BACKGROUND

As a technology of diagnosing an internal short in a lithium ion battery, there is a device having a switch that shorts both ends of the lithium ion battery, a resistor, a coil and the like.

SUMMARY

The present disclosure describes a battery monitoring device that monitors a lithium precipitation amount in a lithium ion battery, and a battery management unit that manages a storage battery including a lithium ion battery.

BRIEF DESCRIPTION OF DRAWINGS

Features and advantages of the present disclosure will become more apparent from the following detailed description made with reference to the accompanying drawings, in which.

DETAILED DESCRIPTION

Figure 1:
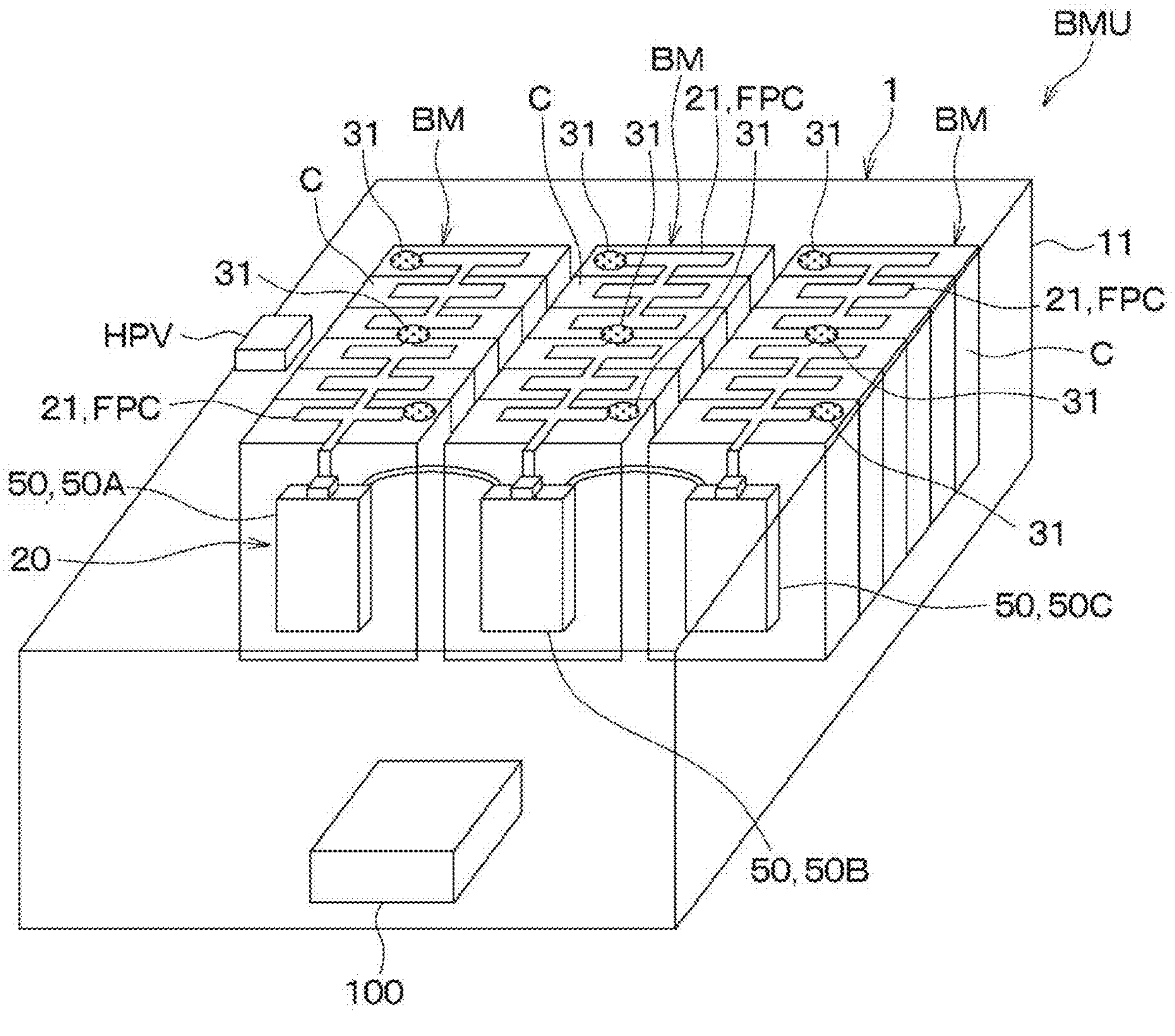
FIG. 1 is a schematic diagram showing a battery pack to which a battery monitoring device according to a first embodiment is applied.

The inventors of the present disclosure has turned their attention to the correlation between a lithium precipitation amount in a lithium ion battery and the behavior of current and voltage when both ends of the lithium ion battery are shorted, and thus has studied to estimate the lithium precipitation amount from the behavior.

However, an internal resistance of the lithium ion battery is on the order of several mΩ to several hundred mΩ, and is susceptible to disturbances, so it was found difficult to accurately obtain the lithium precipitation amount using the above-described estimation method, which is thus unreliable. This fact has been found as a result of intensive study by the inventors.

The present disclosure provides a battery monitoring device that is capable of securing the reliability of a precipitation amount detection unit detecting a lithium precipitation amount. The present disclosure also provides a battery monitoring device that is capable of accurately detecting a lithium precipitation amount or a battery management unit that is capable of adequately restricting an increase in the lithium precipitation amount.

According to an aspect of the present disclosure, a battery monitoring device includes: a precipitation amount detection unit that includes a short circuit that temporarily shorts both ends of a lithium ion battery to discharge the lithium ion battery, and calculates an estimation value of a lithium precipitation amount based on a change in at least one of current or voltage when both the ends of the lithium ion battery is shorted by the short circuit; and a temperature sensor that detects a battery temperature of the lithium ion battery, in which the precipitation amount detection unit calculates, as the lithium precipitation amount, a correction value obtained by correcting the estimation value by the battery temperature.

According to the above aspect, since the influence of the battery temperature included in the estimation value of the lithium precipitation amount is reduced and the detection accuracy of the lithium precipitation amount can be improved, the reliability of the precipitation amount detection unit can be secured.

According to another aspect of the present disclosure, a battery monitoring device includes: a precipitation amount detection unit that includes a short circuit that temporarily shorts both ends of a lithium ion battery to discharge the lithium ion battery, and calculates an estimation value of a lithium precipitation amount based on a change in at least one of current or voltage when both the ends of the lithium ion battery is shorted by the short circuit; and a storage unit in which a parasitic resistance value occurring between the lithium ion battery and the short circuit is stored in advance, in which the precipitation amount detection unit calculates, as the lithium precipitation amount, a correction value obtained by correcting the estimation value with the parasitic resistance value.

According to the above aspect, since the influence of parasitic impedance included in the estimation value of the lithium precipitation amount is reduced and the detection accuracy of the lithium precipitation amount can be improved, the reliability of the precipitation amount detection unit can be secured.

According to a further another aspect of the present disclosure, a battery monitoring device includes: a precipitation amount detection unit that includes a short circuit that temporarily shorts both ends of a lithium ion battery to discharge the lithium ion battery, and calculates an estimation value of a lithium precipitation amount based on a change in at least one of current or voltage when both the ends of the lithium ion battery is shorted by the short circuit; and a diagnosis unit that diagnoses of an appropriateness of the precipitation amount detection unit by comparing a predetermined battery state estimated from the lithium precipitation amount with a battery state estimated from another element other than the lithium precipitation amount.

According to the above aspect, since the certainty of the precipitation amount detection unit can be diagnosed by the diagnosis unit, the reliability of the precipitation amount detection unit can be secured.

According to a still another aspect of the present disclosure, a battery monitoring device includes: a precipitation amount detection unit that calculates a lithium precipitation amount using an output of a sensor installed in a storage battery; and a storage unit that stores a temporal change in the lithium precipitation amount as one of usage histories of the lithium ion battery.

According to the above aspect, the lithium precipitation amount can be appropriately detected nondestructively and in a short time, and the lithium precipitation state can be inspected. In particular, since the sensor for detecting the lithium precipitation is installed in the battery module BM, the lithium precipitation state can be detected regardless of time or place. By storing the temporal change in the lithium precipitation amount as one of the usage histories, it is possible to clearly grasp when lithium is precipitated. This configuration has the advantage of clarifying a location of responsibility for the lithium precipitation.

According to a yet another aspect of the present disclosure, a battery management unit includes: a sensor unit that monitors a battery state including a lithium precipitation amount in a lithium ion battery; and a battery control device that executes charging control for a storage battery, in which the battery control device heats the storage battery via a heating element for rising a temperature of the storage battery when the lithium precipitation amount increases beyond a predetermined threshold.

According to the above aspect, since the lithium ion battery is heated at a timing when the lithium precipitation amount increases, to appropriately restrict the increase in the lithium precipitation amount, the lithium ion battery can be used in a safe and highly efficient manner. In particular, the battery management unit of the present disclosure is suitable for a large-scale power storage equipment in which the temperature distribution is likely to expand.

Hereinafter, embodiments of the present disclosure will be described with reference to the drawings. In the following embodiments, parts that are the same as or equivalent to parts described in the preceding embodiment are denoted by the same reference numerals, and description thereof may be omitted. When only a part of components is described in the embodiment, components described in the preceding embodiment can be applied to other parts of the components. In the following embodiments, the embodiments can be partially combined with each other as long as the embodiments do not cause any trouble in combination, unless otherwise noted.

First Embodiment

In the present embodiment, first, a case where a battery monitoring device 20 and a battery monitoring method of the present disclosure are applied to a battery management unit (hereinafter, referred to as BMU) of a vehicle on which a battery pack 1 as a high-voltage battery is mounted will be described with reference to FIGS. 1 to 13. Then, in the present embodiment, a charging system BCS and a battery evaluation system BRS including the battery monitoring device 20 will be described.

[BMU]

The BMU includes the battery pack 1 shown in FIG. 1. The battery pack 1 includes an airtight container 11 forming an outer shell, and multiple battery modules BM, the battery monitoring device 20, and a battery ECU 100 are stored inside the airtight container 11. The airtight container 11 is provided with a high-pressure protection valve HPV for internal exhausting gas inside the airtight container 11 to the outside when a pressure inside the airtight container 11 increases. In the battery pack 1, each battery module BM is adjusted to an appropriate temperature by a temperature adjustment device (not shown).

The multiple battery modules BM are connected to an electric device such as an electric motor for traveling of a vehicle (not shown), and are power supplies that supply electric power to the electric device. The multiple battery modules BM are electrically connected in series. The multiple battery modules BM are assembled batteries in which multiple battery cells C are electrically connected in series. In the present embodiment, although the battery pack 1 provided with three battery modules BM is shown, the number of battery modules BM is not limited to this, and any number of battery modules BM can be used. Any number of battery cells C forming the battery module BM can also be used. Some of the battery modules BM may be electrically connected in parallel. Hereinafter, the battery cell C or the battery module BM may be simply referred to as a battery. The battery module BM of the present embodiment is a storage battery including a lithium ion battery.

Figure 2:
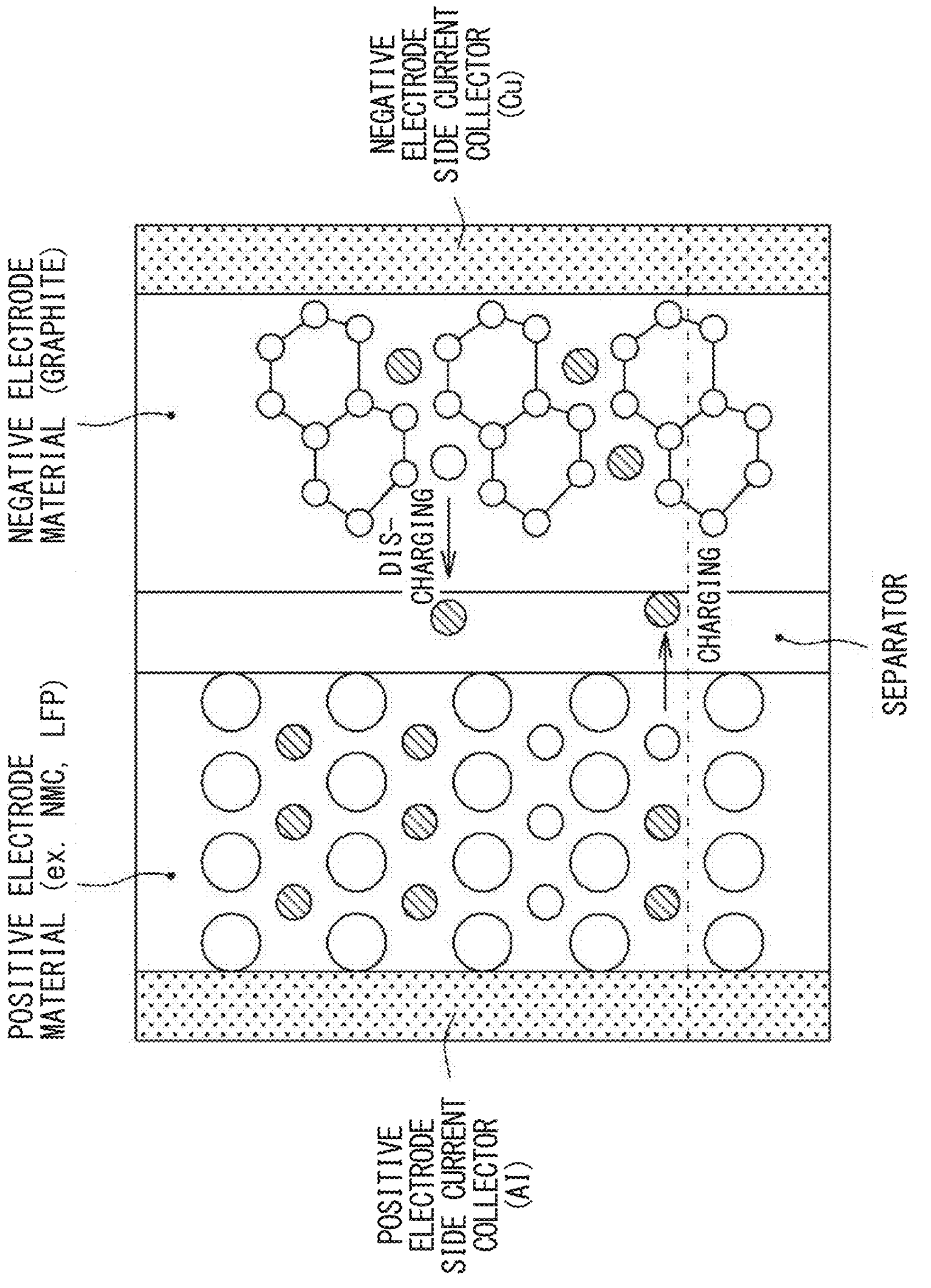
FIG. 2 is an explanatory diagram showing a lithium ion battery.

The battery cell C is a rechargeable and dischargeable secondary battery. The battery cell C is formed by the lithium ion battery. For example, as shown in FIG. 2, the lithium ion battery is formed by using lithium iron phosphate LFP or nickel manganese cobalt NMC as a positive electrode material and using graphite as a negative electrode material. In the lithium ion battery, for example, a positive electrode side current collector is made of aluminum, and a negative electrode side current collector is made of copper. The lithium ion battery formed in this manner has excellent charging-discharging cycle characteristics, and has features in which an electrode potential is very close to a lithium precipitation potential and lithium is easily precipitated in a charging state.

Figure 3:
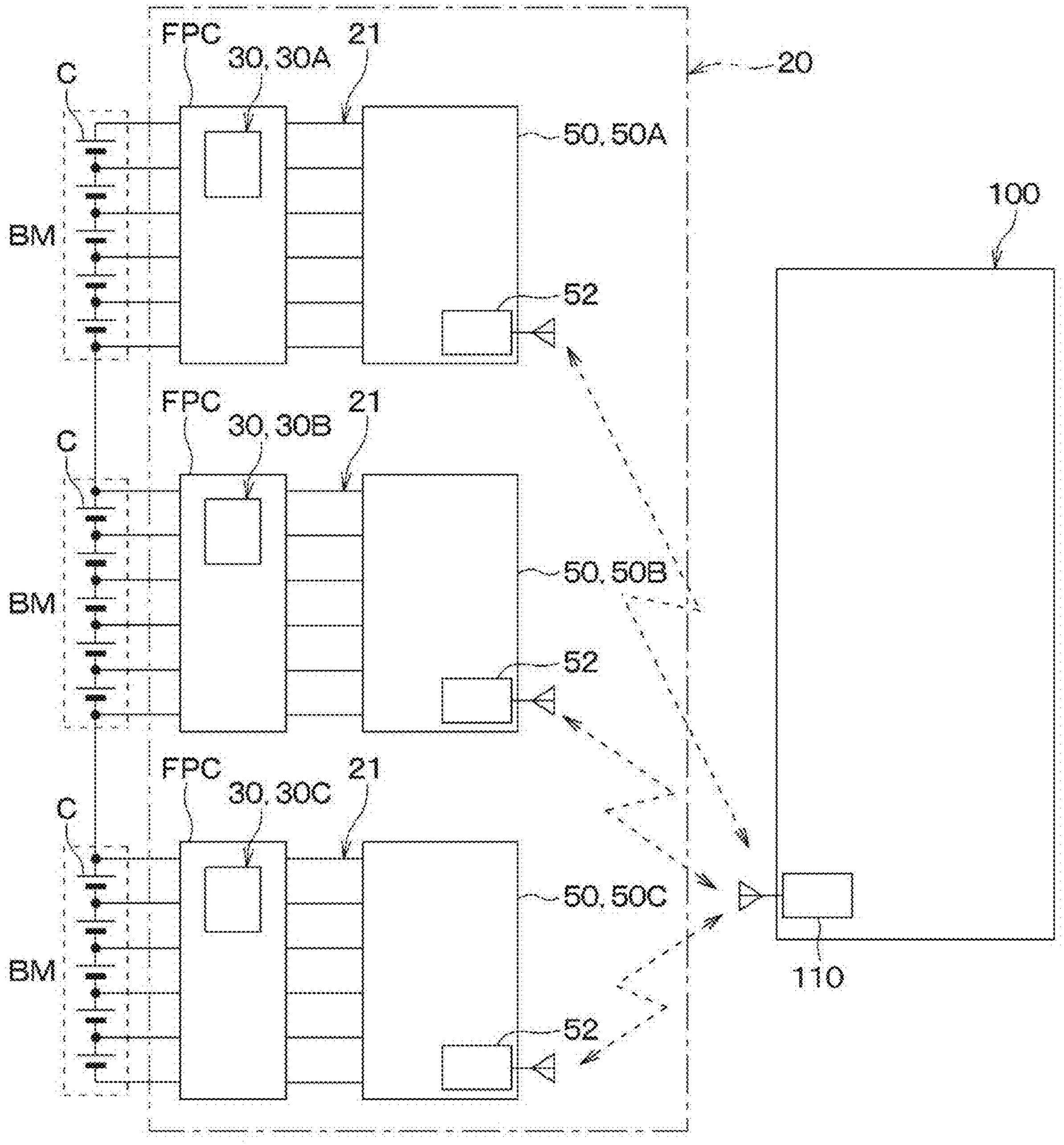
FIG. 3 is a schematic configuration diagram of a battery management unit including the battery monitoring device.

As shown in FIG. 3, the battery monitoring device 20 is electrically connected to each battery module BM via a connection member 21. The connection member 21 includes a flexible board FPC on which a wiring pattern is printed. The battery monitoring device 20 includes sensor units 30A, 30B, and 30C as many as the same number as the battery modules BM, and monitoring modules 50A, 50B, and 50C as many as the same number as the battery modules BM. Since the sensor units 30A, 30B, and 30C have the same basic configuration, the sensor units 30A, 30B, and 30C will not be described individually, but will be described together as the sensor unit 30. Since the monitoring modules 50A, 50B, and 50C have the same basic configuration, the monitoring modules 50A, 50B, and 50C will not be described individually, but will be described together as the monitoring module 50.

Figure 4:
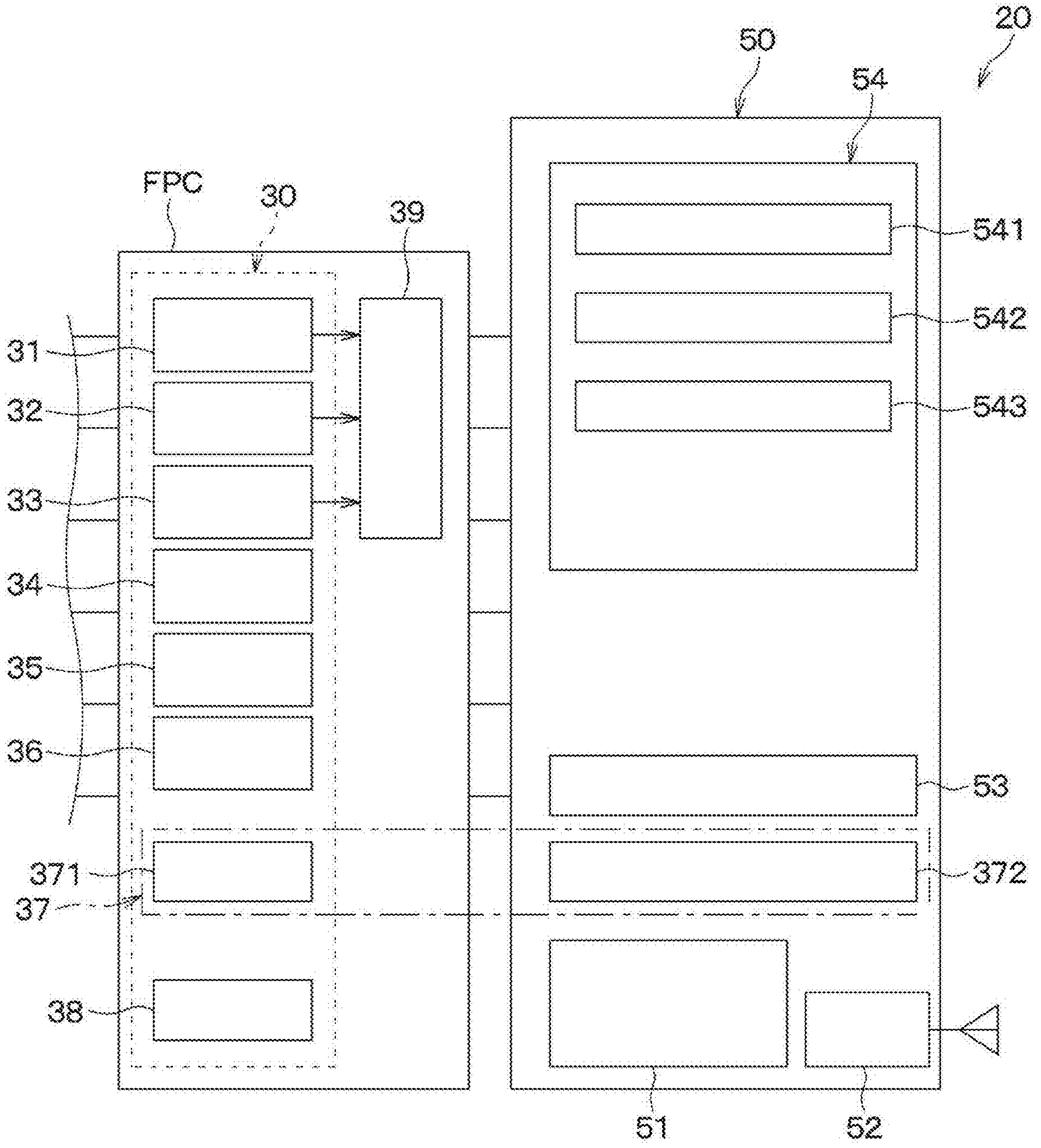
FIG. 4 is an explanatory diagram showing the battery monitoring device.

The sensor unit 30 detects a battery state of each battery module BM. As shown in FIG. 4, the sensor unit 30 includes a temperature sensor 31, a current sensor 32, a voltage sensor 33, a strain sensor 34, a gas sensor 35, a pack internal pressure sensor 36, a precipitation amount detection unit 37, and a film detection unit 38. At least some of the various sensors forming the sensor unit 30 are mounted on the flexible board FPC. All the various sensors forming the sensor unit 30 do not need to be mounted on the flexible board FPC. However, since it is better for the temperature sensor 31, the strain sensor 34, and the gas sensor 35 to be located near the battery cell C, it is desirable to mount the temperature sensor 31, the strain sensor 34, and the gas sensor 35 on the flexible board FPC.

The temperature sensor 31 is a sensor that detects a battery temperature of the lithium ion battery. As shown in FIG. 1, multiple temperature sensors 31 are mounted on the flexible board FPC. The temperature sensor 31 as many as the same number as the battery cell C or a slightly smaller number than the battery cell C is mounted on the flexible board FPC such that the battery temperatures of all the lithium ion batteries forming the battery module BM can be grasped. The battery temperature may be estimated from a measurement result of an internal impedance of the battery cell C. In this case, means for estimating the battery temperature functions as the temperature sensor 31.

The current sensor 32 is a sensor that detects a current flowing through the battery module BM. When the battery modules BM are electrically connected in series, it is sufficient one current sensor 32 is provided in the battery pack 1.

The voltage sensor 33 is capable of detecting a voltage of the battery module BM as a block voltage in addition to a function of detecting a cell voltage of each battery cell C. The voltage sensor 33 can be formed, for example, by a flying capacitor type circuit that sequentially charges a capacitor with the cell voltage of each battery cell C and detects an inter-terminal voltage of the capacitor as the cell voltage.

The strain sensor 34 is a sensor that detects strain in each battery cell C caused by gas generation inside each battery cell C or the like. The strain in the battery cell C may be detected not by the strain sensor 34 but by another sensor such as an ultrasonic sensor.

The gas sensor 35 is a sensor for detecting a gas leak from each battery cell C. The gas sensor 35 is configured to detect, for example, at least one of hydrogen, carbon monoxide, carbon dioxide, or hydrogen fluoride, which are generated when an abnormality occurs in the lithium ion battery.

The pack internal pressure sensor 36 is a sensor that detects the pressure inside the airtight container 11 of the battery pack 1 as a pack internal pressure. The pack internal pressure sensor 36 is, for example, an atmospheric pressure range type pressure sensor based on an atmospheric pressure.

The precipitation amount detection unit 37 is a device that detects lithium precipitation in the lithium ion battery. The precipitation amount detection unit 37 uses a correlation between a lithium precipitation amount in the lithium ion battery and the behavior of the current and the voltage when both ends of the lithium ion battery are shorted, to estimate the lithium precipitation amount from the behavior.

Figure 5:
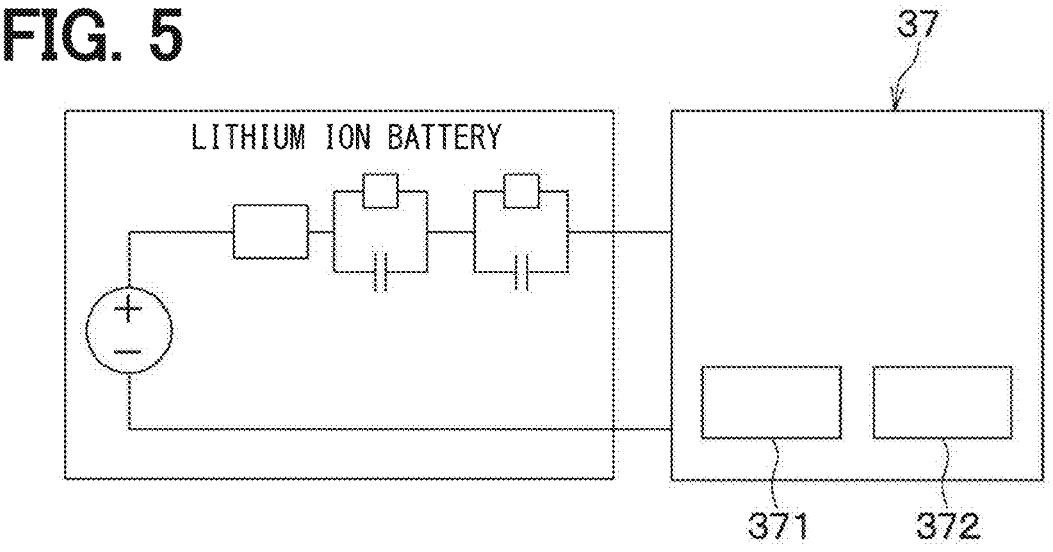
FIG. 5 is an explanatory diagram showing a precipitation amount detection unit included in the battery monitoring device.

As shown in FIG. 5, the precipitation amount detection unit 37 includes a short circuit 371 that temporarily shorts both ends of the lithium ion battery and discharges the lithium ion battery, and an arithmetic unit 372 that estimates the lithium precipitation amount based on the behavior of the current and the voltage when the lithium ion battery is shorted in the short circuit 371. The short circuit 371 is mounted on the flexible board FPC. The arithmetic unit 372 is mounted in the monitoring module 50.

Although not shown, the short circuit 371 includes a short-circuit switch, a coil, and a capacitor for shorting both ends of the lithium ion battery. A self-resonant circuit is formed by an internal resistance of the lithium ion battery, and the coil and the capacitor of the short circuit 371.

The arithmetic unit 372 extracts a resistance change component having a correlation with the lithium precipitation amount included in a signal waveform of at least one of the current or the voltage flowing through the short circuit 371 when both ends of the lithium ion battery are shorted, and calculates an estimation value of the lithium precipitation amount from the extracted component.

The above-described estimation method has a very simple configuration and is a very useful method in that a specific battery deterioration mode can be detected by adjusting a discharge frequency from the lithium ion battery.

Meanwhile, the internal resistance of the lithium ion battery is on the order of several mΩ to several hundred mΩ, and is susceptible to disturbances such as the temperature and a parasitic impedance, so it is difficult to accurately obtain the lithium precipitation amount using the above-described estimation method. This fact has been found as a result of intensive study by the inventors.

Figure 6:
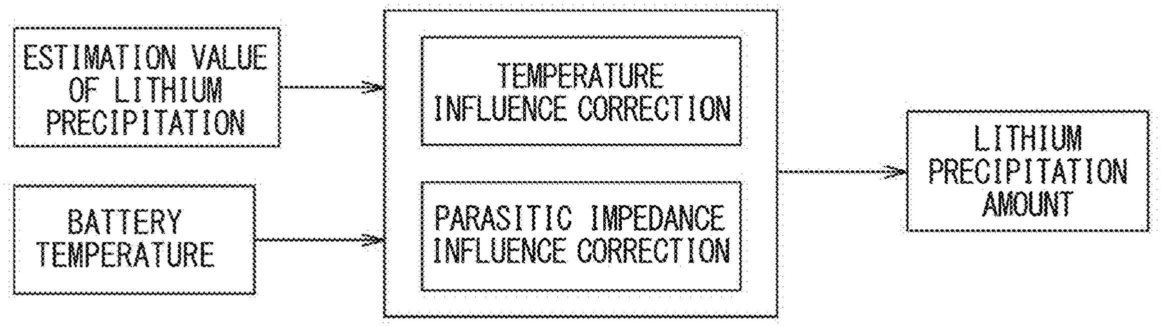
FIG. 6 is an explanatory diagram showing a method of calculating a lithium precipitation amount.

Taking this fact into account, as shown in FIG. 6, the arithmetic unit 372 of the precipitation amount detection unit 37 calculates, as the lithium precipitation amount, a correction value obtained by correcting the estimation value with both the battery temperature detected by the temperature sensor 31 and the parasitic resistance value stored in advance in a storage unit 51 of a monitoring module 50.

The parasitic resistance value is part of the parasitic impedance generated between the lithium ion battery and the short circuit 371. The parasitic resistance value changes depending on the battery temperature. Therefore, the arithmetic unit 372 corrects the parasitic resistance value stored in the storage unit 51 depending on the battery temperature, and calculates the lithium precipitation amount using the corrected parasitic resistance value. The arithmetic unit 372 also functions as calibration means for correcting the estimation value of the lithium precipitation amount in addition to a function of estimating the lithium precipitation amount.

Figure 7:
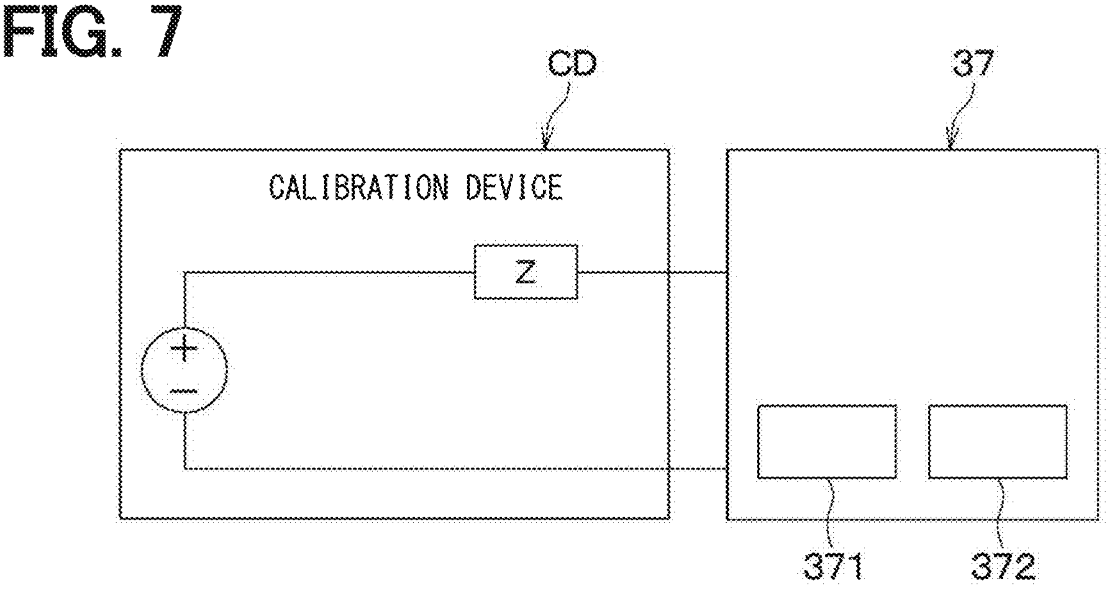
FIG. 7 is an explanatory diagram showing a method of obtaining a parasitic resistance value.
Figure 8:
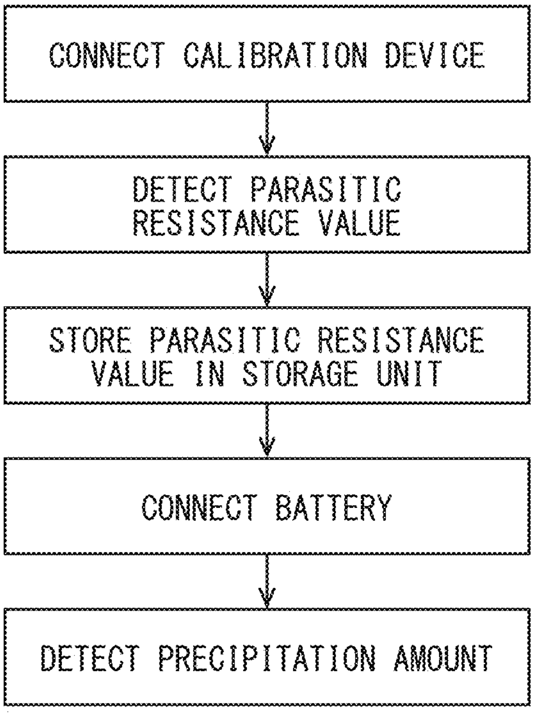
FIG. 8 is an explanatory diagram showing a flow of calculating the lithium precipitation amount.

The parasitic resistance value is obtained by connecting the precipitation amount detection unit 37 to a calibration device CD having a known impedance Z before connecting the precipitation amount detection unit 37 to the lithium ion battery, as shown in FIG. 7. Specifically, as shown in FIG. 8, the short circuit 371 is connected to the calibration device CD, and the parasitic resistance value is obtained in this state. The parasitic resistance value is stored in the storage unit 51 of the monitoring module 50. Next, the short circuit 371 is connected to the battery module BM, and the lithium precipitation amount is calculated in this state.

The precipitation amount detection unit 37 formed in this manner can secure robustness against the parasitic impedance and the temperature change. This configuration is very effective when the lithium precipitation amount is accurately detected.

The short circuit 371 of the present embodiment includes the coil and is large in size, so it is necessary to appropriately reduce the size by taking mounting characteristics into account. The size reduction can be achieved, for example, by improving a saturation magnetic flux density of the coil. Specific means for the size reduction include, for example, using a coil made of a material with a high magnetic flux density, or improving the saturation magnetic flux density by providing a gap.

The film detection unit 38 detects a thickness of the film formed at an interface between a negative electrode and an electrolytic solution during the charging of the lithium ion battery. This film is also called an SEI layer. SEI is an abbreviation for Solid Electrolyte Interphase.

The thickness of the SEI layer has a correlation with the behavior of the current and the voltage when both ends of the lithium ion battery are shorted by the short circuit 371. The film detection unit 38 estimates the thickness of the SEI layer from the behavior of the current and the voltage when both ends of the lithium ion battery are shorted by the short circuit 371. Specifically, the film detection unit 38 extracts a component having a correlation with the thickness of the SEI layer included in the signal waveform of at least one of the current or the voltage flowing through the short circuit 371 when both ends of the battery are shorted by the short circuit 371, and estimates the thickness of the SEI layer from the extracted component. When the thickness of the SEI layer is detected, it is desirable to execute the correction based on the battery temperature, as in the detection of the lithium precipitation amount.

The lithium precipitation amount and the thickness of the SEI layer are physical quantities having a higher correlation with capacity deterioration of the battery than the voltage and the current of the battery. In the present embodiment, the precipitation amount detection unit 37 and the film detection unit 38 form a "deterioration detection unit" that detects the physical quantity having a higher correlation with the capacity deterioration of the battery than the voltage and the current of the battery. The lithium precipitation amount is one of factors that lead to an abnormal heat generation phenomenon in which the temperature of the battery continues to rise unintentionally. Therefore, the precipitation amount detection unit 37 forms a "factor monitoring unit" that monitors the factor that leads to the abnormal heat generation phenomenon.

As shown in FIG. 4, a battery state detection unit 39 that detects the battery state is mounted on the flexible board FPC. The battery state detection unit 39 detects, for example, a battery state in which the battery temperature rises excessively, a battery state in which the battery is overcharged, a battery state in which the internal resistance greatly changes, and the like based on the sensor output of each of the temperature sensor 31, the current sensor 32, and the voltage sensor 33.

Next, the monitoring module 50 will be described. The monitoring module 50 is a satellite module that is directly attached to the battery module BM. The monitoring module 50 is a device on a high voltage side of the BMU. The monitoring module 50 forms an "abnormality detection unit" that is electrically connected to the battery and detects the abnormality in the battery.

The monitoring module 50 includes the storage unit 51, a wireless communication unit 52, an internal resistance detection unit 53, a monitoring IC 54, and the like. The storage unit 51 stores various information such as a unique ID set for each monitoring module 50, a monitoring result of the battery module BM, and the above-described parasitic resistance value. The storage unit 51 is formed by a non-transitory tangible storage medium.

The wireless communication unit 52 is a communication device that enables bidirectional communication with the battery ECU 100. The monitoring module 50 receives various signals from the battery ECU 100 and transmits the monitoring result of the monitoring module 50 and the like to the battery ECU 100.

The internal resistance detection unit 53 is a device that detects the internal resistance of the battery based on various information output from the sensor unit 30. A change in the internal resistance of the battery is one of the factors that lead to the abnormal heat generation phenomenon. Therefore, the internal resistance detection unit 53 forms a "factor monitoring unit" that monitors the factor that leads to the abnormal heat generation phenomenon.

The monitoring IC 54 is electrically connected to the battery and detects the abnormality in the battery. The monitoring IC 54 reduces the occurrence of the abnormal heat generation phenomenon in advance based on the monitoring result of the factor that leads to the abnormal heat generation phenomenon, and detects an abnormal state occurring in the battery at an initial stage of the occurrence of the abnormal heat generation phenomenon to implement a countermeasure against the abnormal heat generation phenomenon based on a detection result of the abnormal state.

The monitoring IC 54 includes an ASIC circuit having an algorithm that executes at least a part of the monitoring of the factor that leads to the abnormal heat generation phenomenon and the detection of the abnormal state occurring in the battery at the initial stage of the occurrence of the abnormal heat generation phenomenon. Specifically, the monitoring IC 54 includes a diagnosis unit 541, an SOH estimation unit 542, and a monitoring control unit 543 as functional units that execute various types of control.

Since the lithium precipitation amount is a parameter that greatly affects the residual value of the battery, it is also important to verify the certainty of this parameter. The diagnosis unit 541 compares a predetermined battery state estimated from the lithium precipitation amount with the battery state estimated from another element other than the lithium precipitation amount, and diagnoses the appropriateness of the precipitation amount detection unit 37.

Figure 9:
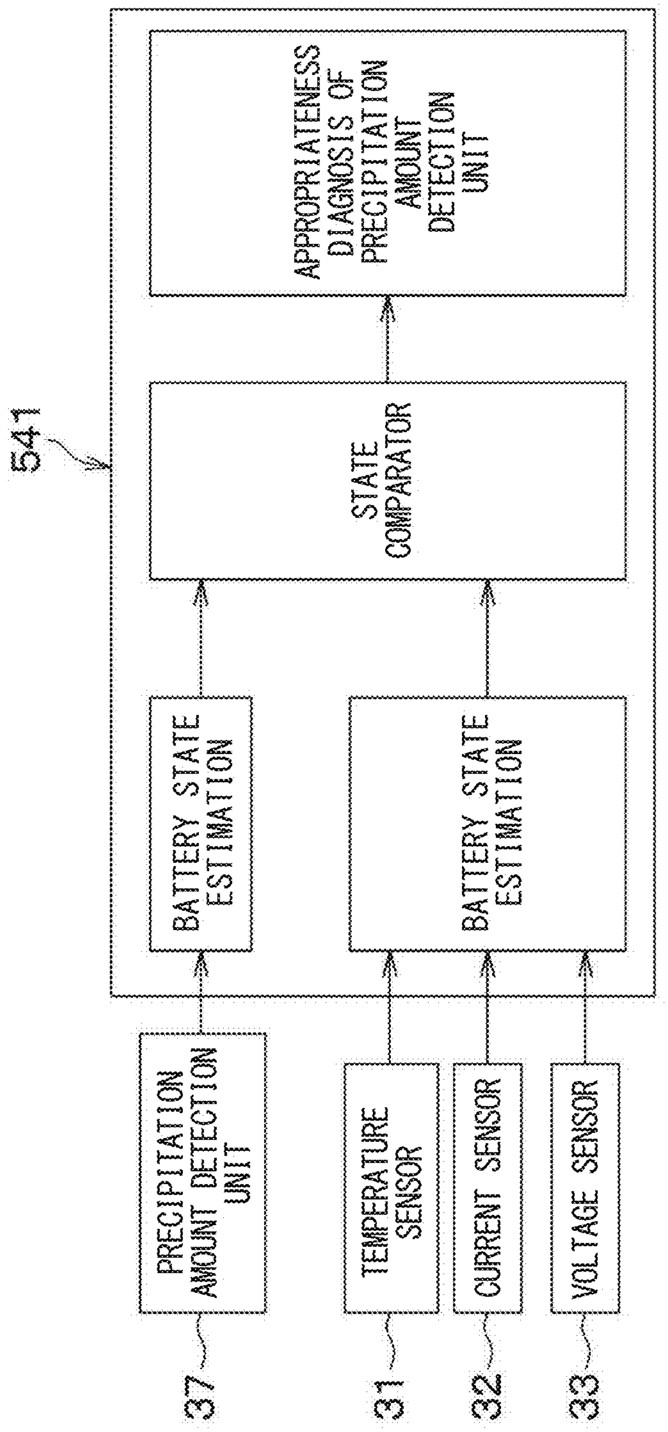
FIG. 9 is an explanatory diagram showing a diagnosis of the precipitation amount detection unit via a diagnosis unit.

For example, as shown in FIG. 9, the diagnosis unit 541 estimates a capacity ratio SOH of the battery from the lithium precipitation amount detected by the precipitation amount detection unit 37. The diagnosis unit 541 estimates the capacity ratio SOH of the battery based on the sensor output of each of the temperature sensor 31, the current sensor 32, and the voltage sensor 33. SOH is an abbreviation for State of Health.

Subsequently, the diagnosis unit 541 compares the capacity ratio SOH estimated from the lithium precipitation amount with the capacity ratio SOH estimated from the temperature, the current, and the voltage of the battery by using a state comparator, and diagnoses the appropriateness of the precipitation amount detection unit 37. For example, the diagnosis unit 541 diagnoses that the precipitation amount detection unit 37 is appropriate when a discrepancy between the capacity ratio SOH estimated from the lithium precipitation amount and the capacity ratio SOH estimated from the temperature, the current, and the voltage of the battery is within a predetermined range. On the other hand, the diagnosis unit 541 diagnoses that the precipitation amount detection unit 37 is inappropriate when the discrepancy between the capacity ratio SOH estimated from the lithium precipitation amount and the capacity ratio SOH estimated from the temperature, the current, and the voltage of the battery exceeds the predetermined range. When the precipitation amount detection unit 37 is diagnosed as being inappropriate, the monitoring IC 54 prohibits the detection of the lithium precipitation amount and the control process using the lithium precipitation amount, or transmits a signal indicating a failure of the precipitation amount detection unit 37 via the wireless communication unit 52 to the battery ECU 100. In the present embodiment, the battery capacity ratio SOH is described as the battery state estimated by the diagnosis unit 541, but the diagnosis unit 541 may estimate the battery state other than the capacity ratio.

JP 2014-102076 A discloses a calculation method of a full charging amount of a battery. In this calculation method, first, a change amount of a charging-discharging amount between a first point in time and a second point in time is calculated by time-integrating a current value of an output current of the battery. An OCV at the first point in time and the second point in time is measured, and a residual capacity SOC at the first point in time and the second point in time is calculated by using a SOC-OCV curve to calculate a change amount ΔSOC that is calculated as a deviation of the residual capacity SOC at each point in time. Next, the full charging amount of the battery is calculated by dividing the change amount of the charging-discharging amount by the change amount ΔSOC in the residual capacity SOC. The capacity ratio SOH of the battery can be obtained by dividing the full charging amount of the battery by an initial value of the full charging amount.

However, in order to avoid the influence of errors in the current sensor 32 and the voltage sensor 33, in the above-described calculation method of the residual capacity SOC or the capacity ratio SOH, the charging-discharging amount of the battery cannot be calculated unless there is a certain charging amount or discharging amount, so that the above-described calculation method lacks real-time performance, and has problems with practicality. When the charging-discharging amount is calculated, there is also a problem that a calculation error of the capacity ratio SOH increases over time due to an offset error of the current sensor 32.

Taking these problems into account, the SOH estimation unit 542 estimates the capacity ratio SOH of the battery based on the physical quantity having a higher correlation with the capacity deterioration of the battery than the voltage and the current of the battery. The SOH estimation unit 542 forms a "capacity ratio estimation unit".

One factor in the battery deterioration is an increase in the internal resistance of the battery. The internal resistance of the battery has a higher correlation with the physical quantities such as the lithium precipitation amount and the internal resistance of the battery. The internal resistance of the battery is temperature dependent and affects the current and the voltage of the battery.

Figure 10:
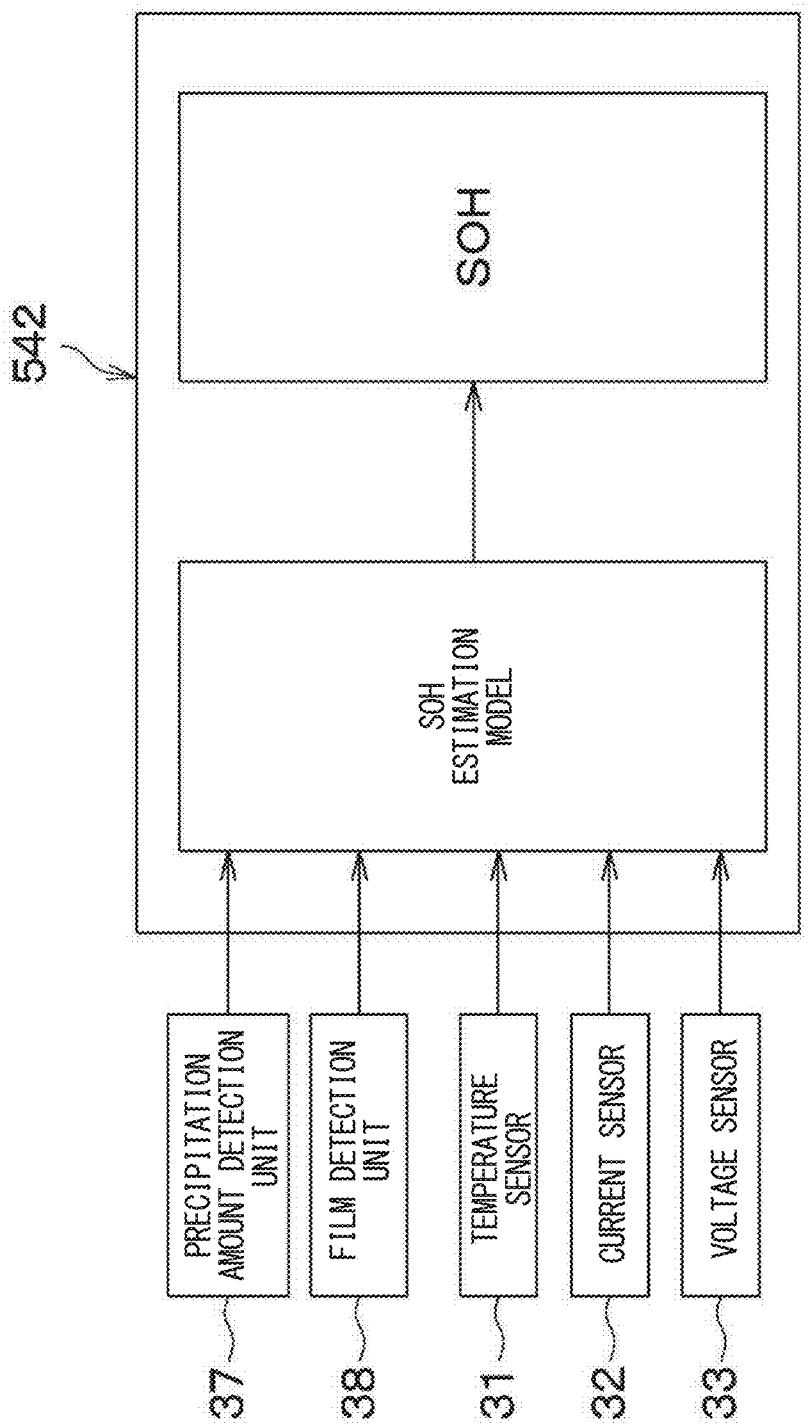
FIG. 10 is an explanatory diagram showing a method of calculating a capacity ratio SOH of the battery.

Taking these facts into account, the SOH estimation unit 542 of the present embodiment estimates the capacity ratio SOH by using an estimation model for the capacity ratio SOH based on the lithium precipitation amount, the thickness of the SEI layer, and the temperature, the current, and the voltage of the battery, as shown in FIG. 10. The estimation model for the capacity ratio SOH is, for example, a control map or a function that defines a relationship among the capacity ratio SOH, the lithium precipitation amount, the thickness of the SEI layer, and the temperature, the current, and the voltage of the battery. The estimation model may be, for example, a model obtained by deep learning, reinforcement learning, or deep reinforcement learning using a neural network.

Accordingly, it is possible to diagnose the battery state in real time, which is difficult to execute in the estimation of the capacity ratio SOH based on the charging-discharging amount. By accurately measuring the temperature, the influence of the temperature on the internal resistance of the battery can be excluded and deterioration information can be appropriately extracted, thereby improving accuracy.

The monitoring control unit 543 reduces the occurrence of the abnormal heat generation phenomenon in advance based on the monitoring result of the factor that leads to the abnormal heat generation phenomenon, and detects an abnormal state occurring in the battery at an initial stage of the occurrence of the abnormal heat generation phenomenon to implement the countermeasure against the abnormal heat generation phenomenon based on a detection result of the abnormal state. Although not shown, the monitoring IC 54 controls a circuit that equalizes the voltages of the multiple battery cells C, and the like.

Next, the battery ECU 100 will be described. The battery ECU 100 is a main module in the BMU, and executes charging-discharging control of each battery module BM. The battery ECU 100 is a device on a low voltage side of the BMU.

Specifically, the battery ECU 100 includes a microcomputer including a processor, a memory, an I/O, a wireless communication device 110, and the like. The battery ECU 100 is configured to communicate with each of the monitoring modules 50A, 50B, and 50C via the wireless communication device 110. The battery ECU 100 is connected to various ECUs via communication paths such as a CAN. Examples of the various ECUs include a heat management ECU that controls the temperature adjustment device of the battery, an ECU of an HMI device mounted in the vehicle, and the like. The battery ECU 100 is capable of notifying the outside of various battery states via the HMI device or the like.

The battery pack 1 formed in this manner includes a rechargeable and dischargeable battery such as the lithium ion battery. In this type of battery, the abnormal heat generation phenomenon may occur in which a specific member inside the battery generates heat for some reason, another member further generates heat due to this heat generation, and thus the temperature of the battery continues to rise unintentionally. When such an abnormal heat generation phenomenon occurs, the thermal reliability of the battery is significantly lowered, which is not preferable. Therefore, in the lithium ion battery and the like, it is important to secure the thermal reliability by detecting the presence or absence of the abnormal heat generation phenomenon in the battery.

Figure 11:
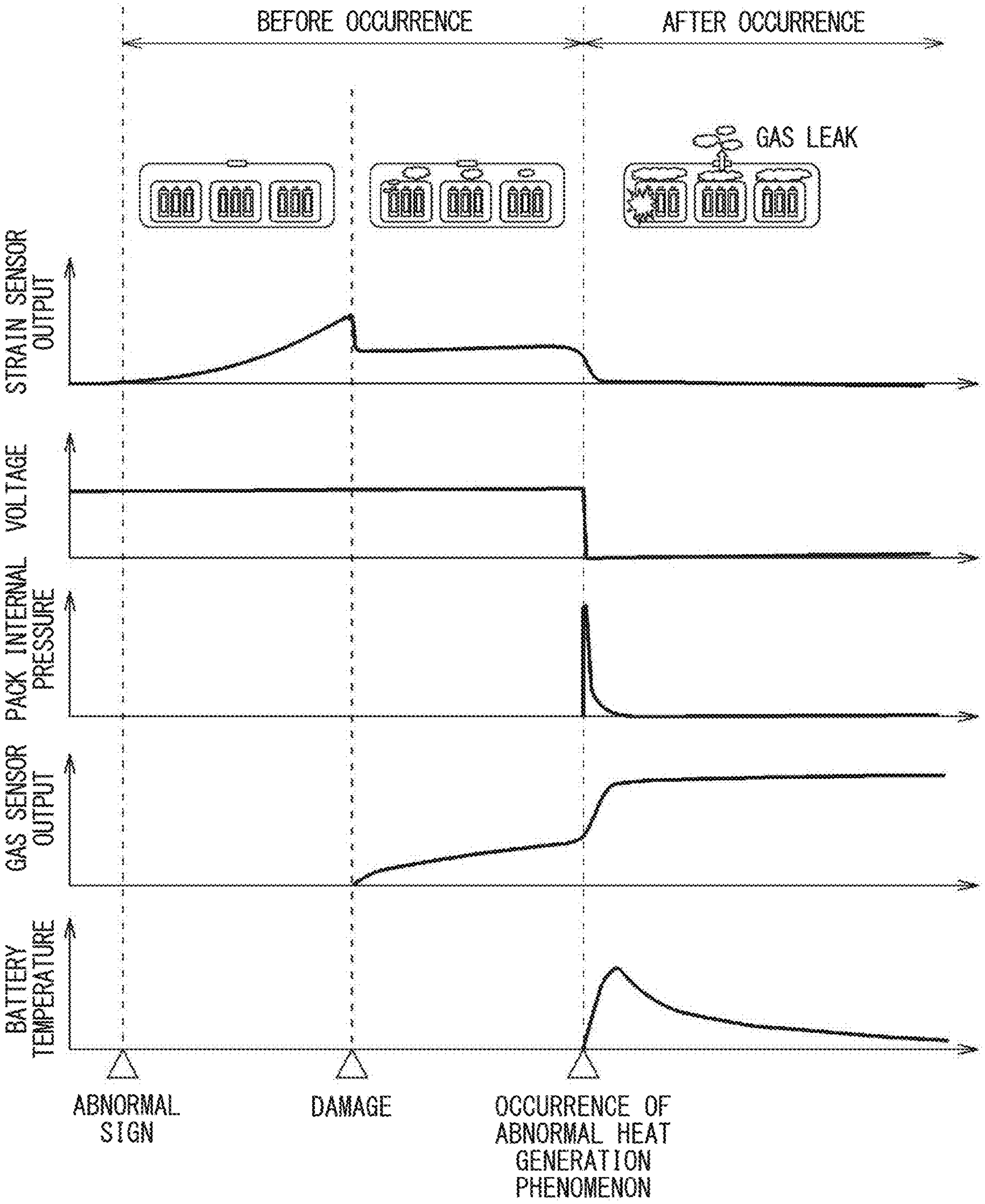
FIG. 11 is a timing chart showing changes in outputs of various sensors before and after an abnormal heat generation phenomenon occurs.

Changes in the outputs of the various sensors before and after the abnormal heat generation phenomenon will be described with reference to FIG. 11. FIG. 11 shows an example of results of verification performed by the present inventors about the changes in the outputs of the various sensors before and after the abnormal heat generation phenomenon.

As shown in FIG. 11, before the abnormal heat generation phenomenon occurs, a volume of the battery begins to change due to an increase in a gas pressure inside the battery cell, which is a sign of the abnormality in the battery. Accordingly, the output of the strain sensor 34 tends to increase.

Thereafter, when the volume change of the battery increases, the battery is damaged and the gas inside the battery cell begins to leak. Accordingly, the output of the gas sensor 35 tends to increase. When the battery is damaged, the gas pressure inside the battery decreases, and the output of the strain sensor 34 tends to decrease.

Although not shown in FIG. 11, as the battery deteriorates, the lithium precipitation occurs inside the battery and the thickness of the SEI layer increases, resulting in the increase in the internal resistance of the battery.

When the abnormal heat generation phenomenon occurs, the battery temperature and the pressure inside the battery pack 1 (that is, the pack internal pressure) rise rapidly, and the voltage of the battery suddenly drops. The output of the gas sensor 35 tends to increase. These signs are noticeable in the initial stage of the abnormal heat generation phenomenon.

Taking these facts into account, the battery monitoring device 20 executes control process for reducing the abnormal heat generation phenomenon in advance and early detection of the abnormal heat generation phenomenon. An example of the control process executed by the battery monitoring device 20 will be described below with reference to FIG. 12.

Figure 12:
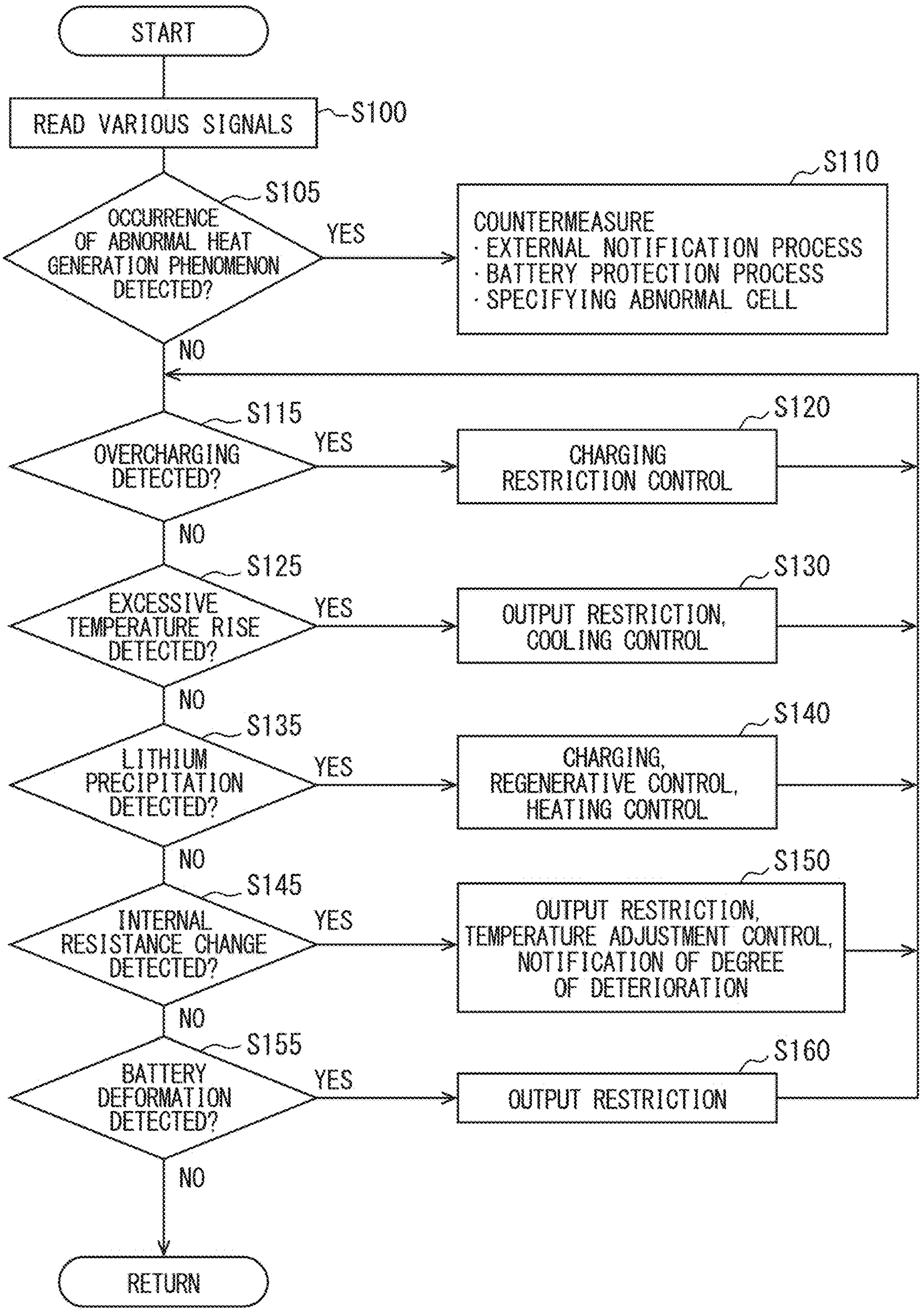
FIG. 12 is an explanatory diagram showing a flow of a control process executed by the battery monitoring device.
Figure 13:
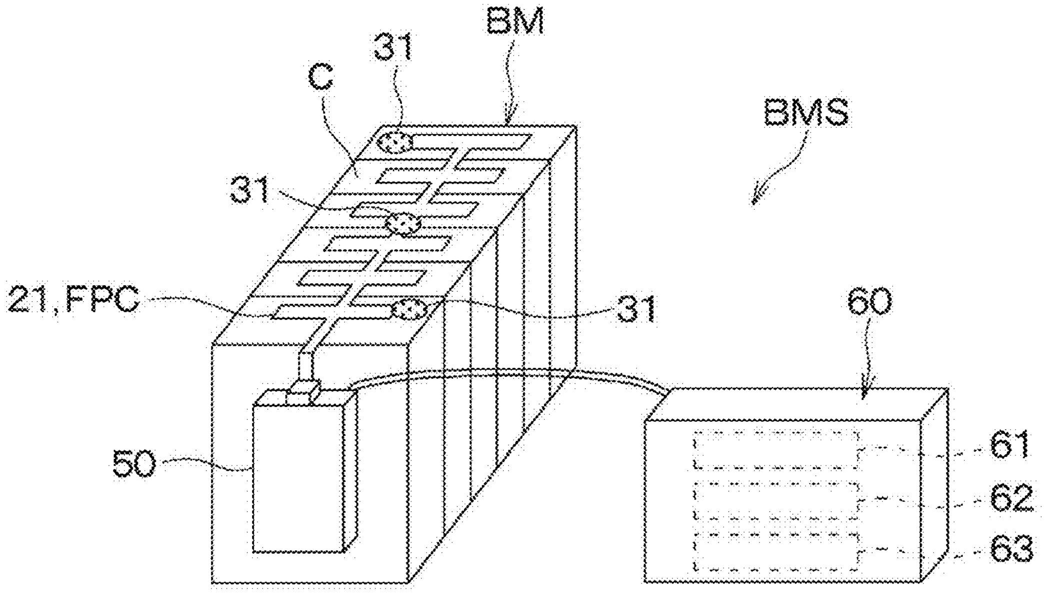
FIG. 13 is a schematic configuration diagram of a battery management system including the battery monitoring device.

The control process shown in FIG. 12 is executed by the battery monitoring device 20 periodically or irregularly, for example, during startup of the vehicle and during a period from the stop of the vehicle to the elapse of a predetermined time. Each process shown in this flowchart is realized by each functional unit of the battery monitoring device 20. Each step for realizing this process can also be grasped as each step for realizing the battery monitoring method.

As shown in FIG. 12, the battery monitoring device 20 reads various signals from the sensor unit 30 and the like in step S100. In step S105, the battery monitoring device 20 determines whether the abnormal heat generation phenomenon has occurred. As described above, at the initial stage of the occurrence of the abnormal heat generation phenomenon, the battery temperature, the pack internal pressure, and the output of the gas sensor 35 rise rapidly, and the voltage of the battery rapidly drops. Taking this fact into account, the battery monitoring device 20 determines whether the abnormal heat generation phenomenon has occurred, based on the sensor output of at least a part of the temperature sensor 31, the voltage sensor 33, the gas sensor 35, and the pack internal pressure sensor 36.

When the occurrence of the abnormal heat generation phenomenon is detected, the battery monitoring device 20 proceeds to step S110 and implements the countermeasure against the abnormal heat generation phenomenon. This countermeasure includes an external notification process of notifying the outside of the occurrence of the abnormal heat generation phenomenon, and a battery protection process of using at least one of cooling or charging-discharging control of the battery.

In the external notification process, for example, a signal indicating the occurrence of the abnormal heat generation phenomenon is output to the battery ECU 100, and a device having a notification function, such as the HMI device, is operated via the battery ECU 100 to notify a user and a battery administrator of the occurrence of the abnormal heat generation phenomenon.

In the battery protection process, for example, a signal giving an instruction to cool the battery is output to the battery ECU 100, and the temperature adjustment device of the battery is operated via the battery ECU 100 to cool the battery. Such battery cooling makes it possible to delay the progress of the abnormal heat generation in the battery. In the battery protection process, for example, a signal giving an instruction to restrict the charging and discharging of the battery is output to the battery ECU 100, and the battery operation is restricted, thereby reducing self-heat generation of the battery. Such charging-discharging control also makes it possible to delay the progress of the abnormal heat generation in the battery. The battery protection process forms an extension process of extending a lifetime of the battery.

As one of the countermeasures against the abnormal heat generation phenomenon, the battery monitoring device 20 specifies, as an abnormal cell, the abnormal battery cell among the multiple battery cells C based on at least one of the monitoring result of each of the multiple battery cells C or the detection result of the abnormal state of the battery. Accordingly, it is possible to restrict the use of the abnormal cell and delay the progress of the abnormal heat generation phenomenon.

The countermeasure against the abnormal heat generation phenomenon is not limited to the above-described process, and may be realized by a process other than the above-described process. The countermeasure against the abnormal heat generation phenomenon may include, for example, turning on a warning light or sounding an alarm.

On the other hand, when the occurrence of the abnormal heat generation phenomenon is not detected, the battery monitoring device 20 proceeds to the processes from step S115 onwards. The processes from step S115 onwards are processes for reducing the occurrence of the abnormal heat generation phenomenon in advance.

In step S115, the battery monitoring device 20 determines whether overcharging of the battery is detected. The overcharging of the battery can be detected, for example, by monitoring the sensor output of the voltage sensor 33. When the overcharging of the battery is detected, the battery monitoring device 20 executes a charging restriction process in step S120, and returns to step S115. In this charging restriction process, the charging of the battery is restricted or the battery is discharged.

When the overcharging of the battery is not detected, the battery monitoring device 20 determines in step S125 whether excessive temperature rise of the battery is detected. The excessive temperature rise of the battery can be detected, for example, by monitoring the sensor output of the temperature sensor 31. When the excessive temperature rise of the battery is detected, the battery monitoring device 20 executes the output restriction or the cooling control in step S130, and returns to step S115. In the output restriction, for example, the charging and discharging of the battery is restricted. In the cooling control, for example, the battery is cooled by the temperature adjustment device of the battery.

When the excessive temperature rise of the battery is not detected, the battery monitoring device 20 determines in step S135 whether the lithium precipitation is newly detected. The lithium precipitation can be detected, for example, by monitoring the increment in the lithium precipitation amount detected by the precipitation amount detection unit 37.

When the lithium precipitation is newly detected, the battery monitoring device 20 executes charging, regenerative control, and heating control in step S140, and returns to step S115. In the charging and regenerative control, for example, the charging of the battery is restricted. In the heating control, for example, the battery is warmed by the temperature adjustment device of the battery. Each process executed when the lithium precipitation is detected forms an extension process of extending the lifetime of the battery.

When the lithium precipitation is not newly detected, the battery monitoring device 20 determines in step S145 whether the change in the internal resistance of the battery is detected. The internal resistance of the battery can be detected, for example, by monitoring the increment in the internal resistance detected by the internal resistance detection unit 53.

When the change in the internal resistance of the battery is detected, the battery monitoring device 20 executes the battery output restriction, temperature adjustment control, and notification of a degree of deterioration of the battery in step S150, and returns to step S115. In the output restriction, for example, the discharging of the battery is restricted. In the temperature adjustment control, for example, the temperature adjustment device adjusts the battery temperature such that the battery temperature is maintained within an appropriate range. In the notification of the degree of deterioration, the degree of deterioration of the battery is determined based on the internal resistance of the battery, and a determination result of the degree of deterioration or a replacement time of the battery estimated from the determination result is notified to the outside. Each process executed when the change in the internal resistance is detected forms the extension process of extending the lifetime of the battery.

When the change in the internal resistance of the battery is not detected, the battery monitoring device 20 determines in step S155 whether the deformation of the battery is detected. The deformation of the battery can be detected by monitoring the sensor output amount of the strain sensor 34.

When the deformation of the battery is detected, the battery monitoring device 20 executes the battery output restriction in step S160, and returns to step S115. In the output restriction, for example, the charging and discharging of the battery is restricted.

When the deformation of the battery is not detected, no signs of the abnormal heat generation phenomenon are observed and the battery is considered to be in a normal state. Therefore, when the deformation of the battery is not detected, the battery monitoring device 20 terminates the control process shown in FIG. 12.

By the way, with the rapid electrification of vehicles, it is expected that a large number of used batteries is generated in the near future. Manufacturing batteries involves the emission of large amounts of $CO_2$ and the use of rare metals, so there is a high expectations for the construction of a battery ecosystem adapted to a recycling-oriented society by selecting the reusing, rebuilding, or recycling of the used batteries depending on the residual capacity SOC and the capacity ratio SOH of the battery. In order to construct such a battery ecosystem, it is important to correctly diagnose battery values such as the residual capacity SOC and the capacity ratio SOH. It is assumed that the battery is stored after the end of in-vehicle use until a secondary use is determined, but it is also assumed that the battery continues to be discharged even when not in use, and the battery deteriorates depending on a storage state. Therefore, as a secondary user, it is necessary to grasp the residual capacity SOC and the capacity ratio SOH of the battery at the moment, and the real-time performance of the battery diagnosis is important.

As described above, the battery monitoring device 20 of the present embodiment can obtain the residual capacity SOC and the capacity ratio SOH in real time. Taking this fact into account, it is desirable that the battery module BM and the battery monitoring device 20 are used as a battery unit UT, and that the battery unit UT is distributed in the market. It is desirable that the battery module BM is managed by, for example, a battery management system BMS shown in FIG. 13.

The battery management system BMS includes the battery monitoring device 20 and a battery management device 60 attached to the battery module BM. The battery management device 60 includes a performance determination unit 61, a value setting unit 62, and a performance notification unit 63.

The performance determination unit 61 determines whether the secondary use of the battery is possible, based on the capacity ratio SOH estimated by the SOH estimation unit 542 of the battery monitoring device 20. For example, the performance determination unit 61 determines that the secondary use is possible when the capacity ratio SOH estimated by the SOH estimation unit 542 is equal to or greater than a predetermined value, and determines that the secondary use is not possible when the capacity ratio SOH is less than the predetermined value. The performance determination unit 61 may determine whether the secondary use of the battery is possible based on the battery state other than the capacity ratio SOH.

The value setting unit 62 determines whether there is the abnormality in the battery based on the capacity ratio SOH estimated by the SOH estimation unit 542 of the battery monitoring device 20, and sets the residual value of the battery when there is the abnormality in the battery. For example, the value setting unit 62 estimates the residual value of the battery to be low as the capacity ratio SOH decreases. The value setting unit 62 may set the residual value of the battery based on the battery state other than the capacity ratio SOH.

The performance notification unit 63 determines whether the capacity ratio SOH estimated by the SOH estimation unit 542 of the battery monitoring device 20 is within an allowable range of the capacity ratio SOH indicated in the battery specification data, and outputs a result of this determination to the outside.

The performance notification unit 63 acquires the battery specification data provided by a battery manufacturer or the like, and stores the battery specification data in the memory. For example, when the capacity ratio SOH estimated by the SOH estimation unit 542 is within the allowable range indicated in the specification data, the performance notification unit 63 notifies a seller of the battery, the secondary user, and the like of this fact. For example, when the capacity ratio SOH estimated by the SOH estimation unit 542 is outside the allowable range indicated in the specification data, the performance notification unit 63 notifies the seller of the battery, the secondary user, and the like that the secondary use of the battery is difficult.

With the battery monitoring device 20 and the battery monitoring method described above, an effective countermeasure against the abnormal heat generation, effective detection of the lithium precipitation amount, and effective estimation of the capacity ratio SOH can be executed. Specific examples will be described as follows.

[Countermeasure Against Abnormal Heat Generation]

In the battery monitoring device 20 and the battery monitoring method, the factor that leads to the abnormal heat generation phenomenon is monitored, and the occurrence of the abnormal heat generation phenomenon is reduced in advance based on the monitoring result of the factor. Additionally, in the battery monitoring device 20 and the battery monitoring method, the abnormal state occurring in the battery at an initial stage of the occurrence of the abnormal heat generation phenomenon is detected to implement the countermeasure against the abnormal heat generation phenomenon based on the detection result of the abnormal state. Accordingly, the occurrence of the abnormal heat generation phenomenon can be reduced in advance, and even when the abnormal heat generation phenomenon occurs, an effective heat countermeasure can be implemented, such as implementing the countermeasure from the initial stage of the occurrence of the abnormal heat generation phenomenon.

The battery monitoring device 20 provides the following effects.

(1) The monitoring module 50 of the battery monitoring device 20 performs the detection of the abnormal state of the battery in parallel with the monitoring of the factor that leads to the abnormal heat generation phenomenon. In other words, the monitoring module 50 detects the abnormal state of the battery regardless of the monitoring result of the factor that leads to the abnormal heat generation phenomenon. Accordingly, for example, as compared with a case where the abnormal state is detected after monitoring the factor that leads to the abnormal heat generation phenomenon, the abnormal state can be detected at an early stage, so that the countermeasure against the abnormal heat generation phenomenon can be implemented at an early stage.

(2) The countermeasure when the abnormal heat generation phenomenon occurs includes the external notification process of notifying the outside of the occurrence of the abnormal heat generation phenomenon, and the battery protection process of using at least one of the temperature adjustment control or the charging-discharging control of the battery. When the countermeasure against the abnormal heat generation phenomenon include the external notification process, in addition to the countermeasure that can be taken by the battery monitoring device 20 itself, it is easier to implement the countermeasure using an external device of the battery monitoring device 20 or the countermeasure in cooperation with the external device. When the battery protection process is included in the countermeasure against the abnormal heat generation phenomenon, it is possible to appropriately protect the battery.

(3) The monitoring module 50 executes the extension process of extending the lifetime of the battery according to the monitoring result of the factor of the abnormal heat generation phenomenon. In this way, in the configuration in which the extension process of extending the lifetime of the battery according to the monitoring result of the factor that leads to the abnormal heat generation phenomenon, the lifetime of the battery can be extended appropriately.

(4) The factor that leads to the abnormal heat generation phenomenon include at least one of the lithium precipitation inside the battery or the internal resistance of the battery. The lithium precipitation inside the lithium ion battery and the increase in the internal resistance are the factors that lead to the abnormal heat generation phenomenon in the battery. Therefore, by monitoring the lithium precipitation and the internal resistance, it is easier to reduce the occurrence of the abnormal heat generation phenomenon of the battery in advance.

(5) The monitoring module 50 specifies, as the abnormal cell, the abnormal battery cell among the multiple battery cells C based on at least one of the monitoring result of each of the multiple battery cells C or the detection results of the abnormal states of the multiple battery cells C. In this way, in the configuration in which the abnormal cell can be specified from among the multiple battery cells C, for example, the use of the abnormal cell can be restricted to reduce the occurrence of the abnormal heat generation phenomenon in advance, or to delay the progress of the abnormal heat generation phenomenon.

(6) The monitoring module 50 is configured to detect, as the abnormal state of the battery, at least one of an internal pressure abnormality in the airtight container 11, a temperature abnormality in the battery, a voltage abnormality in the battery, or a gas abnormality in the airtight container 11. At the initial stage of the occurrence of the abnormal heat generation phenomenon, the internal pressure of the airtight container 11 that stores the battery, the temperature of the battery, the voltage of the battery, and the gas state inside the airtight container 11 are in the abnormal state. Therefore, when the monitoring module 50 is configured to detect, as the abnormal state of the battery, at least one of an internal pressure abnormality in the airtight container 11, a temperature abnormality in the battery, a voltage abnormality in the battery, or a gas abnormality in the airtight container 11, it is easy to detect the abnormal heat generation phenomenon at the initial stage of the occurrence.

(7) The battery monitoring device 20 includes an ASIC circuit having the algorithm that executes at least a part of the monitoring of the factor that leads to the abnormal heat generation phenomenon and the detection of the abnormal state of the battery. Accordingly, it is possible to realize the monitoring of the factor that leads to the abnormal heat generation phenomenon or the detection of the abnormal state with a simple configuration.

(8) The monitoring module 50 is configured to determine the degree of deterioration of the battery based on the monitoring result of the factor that leads to the abnormal heat generation phenomenon, and notify the outside of the determination result of the degree of deterioration or the replacement time of the battery estimated from the determination result. In the configuration in which the degree of deterioration of the battery is determined based on the monitoring result of the factor that leads to the abnormal heat generation phenomenon, a dedicated device for determining the degree of deterioration of the battery is unnecessary. This configuration contributes to simplifying the battery monitoring device 20.

(9) The connection member 21 that connects the battery and the monitoring module 50 includes the flexible board FPC on which a part of the sensor unit 30 is mounted. In this way, by mounting a part of the sensor unit 30 on the flexible board FPC forming the connection member 21, it is possible to monitor the factor that leads to the abnormal heat generation phenomenon of the battery, at a position close to the battery.

[Detection of Lithium Precipitation Amount]

The precipitation amount detection unit 37 of the battery monitoring device 20 calculates the estimation value of the lithium precipitation amount based on the change in at least one of the current or the voltage when both ends of the lithium ion battery are shorted by the short circuit 371. The precipitation amount detection unit 37 corrects the estimation value of the lithium precipitation amount based on the battery temperature. Accordingly, the influence of the battery temperature included in the estimation value of the lithium precipitation amount can be reduced, and the detection accuracy of the lithium precipitation amount can be improved, so that the reliability of the precipitation amount detection unit 37 can be secured.

The precipitation amount detection unit 37 corrects the estimation value of the lithium precipitation amount using the parasitic resistance value stored in the storage unit 51. Accordingly, the influence of the parasitic impedance included in the estimation value of the lithium precipitation amount can be reduced, and the detection accuracy of the lithium precipitation amount can be improved, so that the reliability of the precipitation amount detection unit 37 can be secured.

(1) Specifically, the precipitation amount detection unit 37 corrects the parasitic resistance value stored in the storage unit 51 based on the battery temperature, and calculates the lithium precipitation amount using the corrected parasitic resistance value. Accordingly, the influence of the battery temperature and the parasitic impedance included in the estimation value of the lithium precipitation amount can be reduced, and the detection accuracy of the lithium precipitation amount can be improved.

(2) The parasitic resistance value is obtained by connecting the short circuit 371 to the calibration device CD having the known impedance Z before connecting the short circuit 371 to the lithium ion battery. Accordingly, the parasitic resistance value of the precipitation amount detection unit 37 can be obtained with high accuracy. This configuration greatly contributes to improving the detection accuracy of the lithium precipitation amount.

(3) The battery monitoring device 20 includes the diagnosis unit 541 that compares the predetermined battery state estimated from the lithium precipitation amount with the predetermined battery state estimated from another element other than the lithium precipitation amount, and diagnoses the appropriateness of the precipitation amount detection unit 37. Accordingly, the certainty of the precipitation amount detection unit 37 can be diagnosed by the diagnosis unit 541, so that the reliability of the precipitation amount detection unit 37 can be secured.

[Modification of Battery Monitoring Device 20]

The battery monitoring device 20 need not be the same as the above-described battery monitoring device 20, and may be partially different from the above-described battery monitoring device 20. The above-described technical matters can be applied to a device or a system other than an in-vehicle device.

[Estimation of Capacity Ratio SOH]

The battery monitoring device 20 detects the physical quantity having a higher correlation with the capacity deterioration of the battery than the voltage and the current of the battery, and estimates the battery capacity ratio SOH based on the physical quantity. In this way, in the configuration in which the capacity ratio SOH is estimated using the physical quantity having a higher correlation with the capacity deterioration of the battery, it is necessary to avoid the influence of errors as compared with a case where the capacity ratio SOH is obtained based on the current and the voltage of the battery, and thus the capacity ratio SOH can be estimated in a short time. Therefore, with the battery monitoring device 20 of the present disclosure, it is possible to grasp the battery state in a practical manner.

(1) The lithium precipitation amount and the thickness of the SEI layer are physical quantities that directly affect the capacity deterioration of the battery. Therefore, the real-time performance can be secured by detecting the lithium precipitation amount or the thickness of the SEI layer and obtaining the capacity ratio SOH based on the lithium precipitation amount or the thickness of the SEI layer. A degree of cracking of a positive electrode active material inside the battery is the physical quantity that directly affects the capacity deterioration of the battery. Therefore, even in the configuration in which the capacity ratio SOH is obtained based on the degree of cracking of the positive electrode active material in addition to the lithium precipitation amount or the thickness of the SEI layer, the detection accuracy of the capacity ratio SOH can be improved. The degree of cracking of the positive electrode active material can be estimated based on the behavior of the current and the voltage when both ends of the lithium ion battery are shorted, or the sensor output of the strain sensor or the ultrasonic sensor.

(2) The lithium precipitation amount or the thickness of the SEI layer in the lithium ion battery has a correlation with the behavior of the current and the voltage when both ends of the lithium ion battery are shorted. Taking this fact into account, the battery monitoring device 20 calculates at least one of the lithium precipitation amount or the thickness of the SEI layer based on the change in at least one of the current or the voltage when both ends of the lithium ion battery are shorted in the short circuit 371.

(3) Specifically, the battery monitoring device 20 corrects at least one of the lithium precipitation amount or the thickness of the SEI layer based on the battery temperature. Accordingly, the influence of the battery temperature included in the estimation value of the lithium precipitation amount or the thickness of the SEI layer can be reduced, and the detection accuracy of the lithium precipitation amount or the thickness of the SEI layer can be improved.

(4) The battery management system BMS determines whether the secondary use of the battery is possible, based on the capacity ratio SOH estimated by the SOH estimation unit 542 of the battery monitoring device 20. Accordingly, it is easier to determine which of reusing, rebuilding, and recycling should be selected in the secondary use of the battery. This configuration greatly contributes to constructing the battery ecosystem adapted to the recycling-oriented society.

(5) The battery management system BMS determines whether there is the abnormality in the battery based on the capacity ratio SOH estimated by the SOH estimation unit 542 of the battery monitoring device 20, and sets the residual value of the battery when there is the abnormality in the battery. Accordingly, it is also easier to determine which of reusing, rebuilding, and recycling should be selected in the secondary use of the battery, and to contribute to constructing the battery ecosystem adapted to the recycling-oriented society.

(6) The battery management system BMS determines whether the capacity ratio SOH estimated by the SOH estimation unit 542 of the battery monitoring device 20 is within the allowable range of the capacity ratio SOH indicated in the battery specification data, and outputs the result of this determination to the outside. Accordingly, it is also easier to determine which of reusing, rebuilding, and recycling should be selected in the secondary use of the battery, and to greatly contribute to constructing the battery ecosystem adapted to the recycling-oriented society.

[Modification of Battery Management System BMS]

The battery management system BMS need not be the same as the above-described battery management system BMS, and may be partially different from the above-described battery management system BMS. The above-described technical matters can be applied to a device or a system other than an in-vehicle device.

The description regarding the BMU and the like is made so far. Hereinafter, the charging system BCS and the battery evaluation system BRS will be described.

[Charging System BCS]

The charging system BCS will be described below with reference to FIGS. 14 to 19. The charging system BCS is a system that charges the battery module BM included in the battery pack 1. The charging system BCS is applied to, for example, a vehicle charging station.

Figure 14:
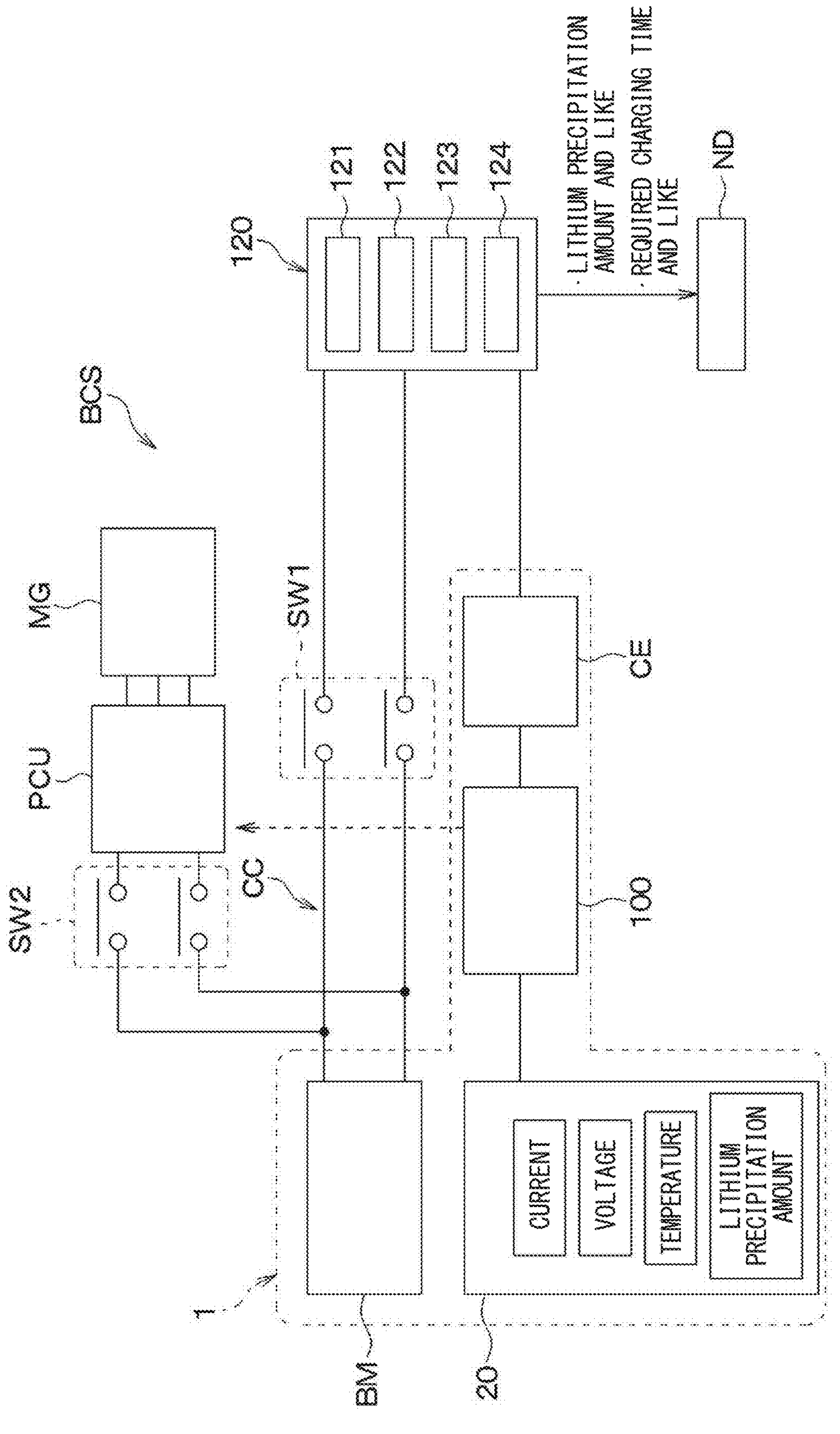
FIG. 14 is a schematic configuration diagram of a charging system including the battery monitoring device.

As shown in FIG. 14, the charging system BCS includes the battery monitoring device 20, the battery ECU 100, a charger 120, and a charging cable CC. In the present embodiment, the battery monitoring device 20 and the battery ECU 100 included in the battery pack 1 form a battery-side device that monitors the battery state including the lithium precipitation amount in the lithium ion battery.

The battery module BM is connected to a power control unit PCU and a motor generator MG of the vehicle via a switch SW2 such as a system main relay. For example, when a start switch of the vehicle is turned on, the switch SW2 is turned on, and the battery module BM is electrically connected to the motor generator MG via the power control unit PCU and is in a chargeable and dischargeable state.

The battery monitoring device 20 and the battery ECU 100 are basically formed in the same manner as described above. The battery ECU 100 is capable of communicating with the charger 120 via a communication device CE. In a state of being communicable with the charger 120, the battery ECU 100 notifies the charger 120 of battery information including the battery state such as the lithium precipitation amount and the residual capacity SOC. The battery ECU 100 determines whether the state is a chargeable state, and notifies the charger 120 of the determination result as one of the battery information. The battery ECU 100 further sets a CC charging current, which is a target current amount during constant current charging, and a CV charging voltage, which is a target voltage during constant voltage charging, and notifies the charger 120 of these set values. The communication between the communication device CE and the charger 120 is executed via the CAN and a communication line included in the charging cable CC.

The charging cable CC electrically connects the battery module BM and the charger 120. The charging cable CC includes a cable, a charging connector (not shown), a control box (not shown), and the like.

The charger 120 is a device that charges the battery module BM. The charger 120 is formed by a device that complies with charging standards such as CHAdeMO, CCS, and GB/T. A switch SW1 that turns on and off the electrical connection between the charger 120 and the battery module BM is provided between the charger 120 and the battery module BM. This switch SW1 may be provided on the charger 120 side, or may be provided on the vehicle side.

The charger 120 includes an information acquisition unit 121, a charging determination unit 122, a charging control unit 123, and a charging time calculation unit 124. The information acquisition unit 121, the charging determination unit 122, the charging control unit 123, and the charging time calculation unit 124 include, for example, a microcomputer including a processor, a memory, an I/O, and the like.

The information acquisition unit 121 acquires the battery information including the battery state such as the lithium precipitation amount and the residual capacity SOC from the battery monitoring device 20 and the battery ECU 100 when the battery module BM is charged. The information acquisition unit 121 also acquires the CC charging current and the CV charging voltage from the battery ECU 100.

The lithium precipitation amount is important information indicating the safety of the battery module BM. For this reason, the information acquisition unit 121 of the present embodiment notifies the outside of the battery information including information indicating the lithium precipitation amount, by using a notification device ND. The notification device ND is formed by, for example, a device such as a display, a speaker, and a lamp.

The charging determination unit 122 determines whether the battery module BM can be charged, based on the battery information acquired by the information acquisition unit 121. For example, the charging determination unit 122 determines whether the battery module BM can be charged, based on the result of the determination of whether the battery module BM is in the chargeable state, the determination being executed by the battery ECU 100. The charging determination unit 122 may determine whether the charging is possible, based on the lithium precipitation amount and the like acquired by the information acquisition unit 121.

The charging control unit 123 charges the battery module BM based on the determination result of the charging determination unit 122. The charging control unit 123 charges the battery module BM when the determination result of the charging determination unit 122 indicates that the battery module BM can be charged, and does not charge the battery module BM when the determination result of the charging determination unit 122 indicates that the battery module BM cannot be charged.

The charging control unit 123 of the present embodiment is configured to charge the battery module BM using a CCCV charging method in which the charging is executed with the constant current and then the charging is executed with the constant voltage. Hereinafter, the constant current charging may be referred to as CC charging, and the constant voltage charging may be referred to as CV charging.

The charging time calculation unit 124 estimates a required charging time required for the charging based on the battery state acquired by the information acquisition unit 121, and notifies the outside of information indicating the estimated required charging time by using the notification device ND. The charging time calculation unit 124 can be configured to estimate the required charging time, for example, by using a control map that defines a relationship between the residual amount of the battery module BM and the required charging time. When the charger 120 notifies the outside of the required charging time by using the notification device ND, it is desirable that the notification includes how much time can be shortened in this quick charging as compared with normal charging. It is desirable that the charger 120 notifies an information terminal owned by the user of a remaining time until the charging is completed.

The charging system BCS formed as described above is required to enable faster charging with a higher energy density. Recently, attempts have been made to shorten the charging time of the battery module BM by making the charger 120 compatible with 50 KW in the CHAdeMO 1.0 specification, 400 kW in the CHAdeMO 2.0 specification, and 900 KW in the CHAdeMO 3.0 specification.

The charging time can be shortened by increasing the charging output, but there is a possibility that the charging current increased due to the high-output charging accelerates the lithium precipitation on the negative electrode of the battery, which significantly impairs the lifetime of the battery and safety.

Figure 15:
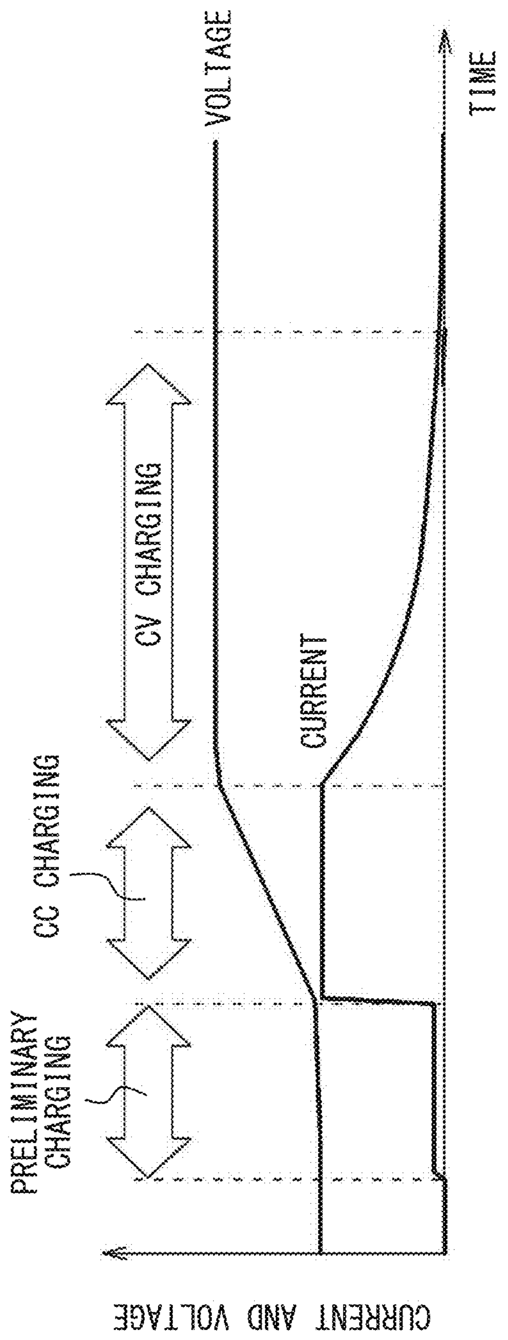
FIG. 15 is an explanatory diagram showing a current and a voltage during charging of a battery module in a charging system that is a comparative example of the first embodiment.

To avoid this possibility, as shown in FIG. 15, a charging profile that does not cause the deterioration-unsafe state can be considered in which preliminary charging with a small current is executed before the CC charging to detect the abnormality such as deep discharging of the battery.

However, when the preliminary charging is executed taking safety into account, the charging time increases accordingly, and thus there is a possibility that the user feels inconvenienced. There is a possibility that the user may feel uneasy or irritated when the charging time is longer than expected.

Taking these possibilities into account, the charging system BCS of the present embodiment is configured such that the charger 120 determines whether the battery module BM can be charged, based on the battery information acquired from the battery monitoring device 20 and the battery ECU 100.

Hereinafter, a control process on the battery ECU 100 side at the start of the charging of the battery module BM will be described with reference to FIG. 16. This control process is executed by the battery ECU 100 periodically or irregularly. Each control step of the control process shown in FIG. 16 forms a function realizing unit that realizes various functions executed by the battery ECU 100.

Figure 16:
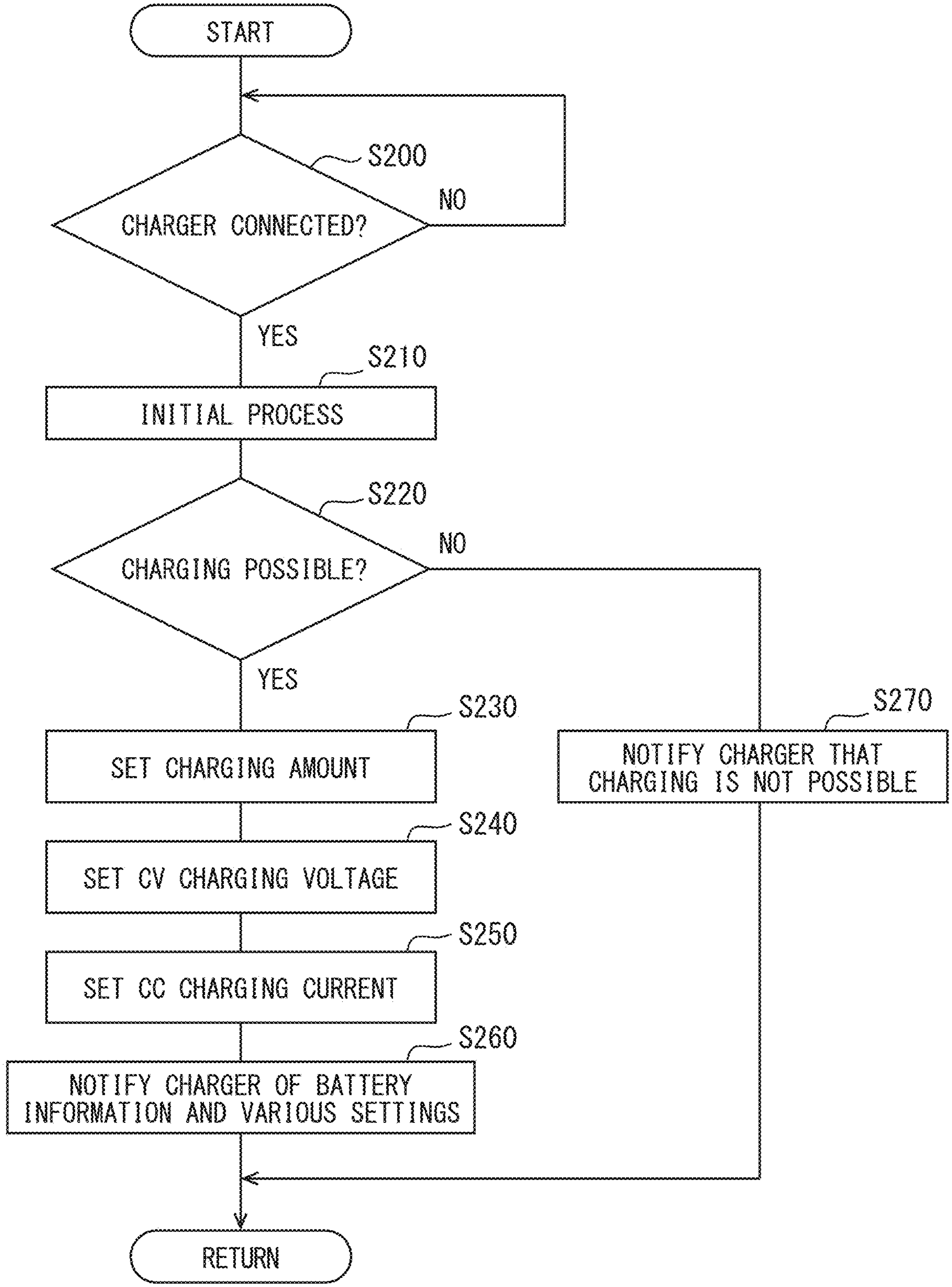
FIG. 16 is an explanatory diagram showing a flow of a control process executed by the battery monitoring device when the charging of the battery module is started.

As shown in FIG. 16, the battery ECU 100 determines in step S200 whether the charger 120 is connected. The battery ECU 100 waits until the charger 120 is connected, and proceeds to step S210 when the charger 120 is connected.

The battery ECU 100 executes an initial process in step S210. In the initial process, the battery ECU 100 initializes a flag and the like, and acquires the monitoring result from the battery monitoring device 20.

Subsequently, the battery ECU 100 determines whether the battery module BM is in the chargeable state. For example, the battery ECU 100 determines that the charging is possible when the lithium precipitation amount is within a predetermined value, and determines that the charging is not possible when the lithium precipitation amount exceeds the predetermined value. The battery ECU 100 may also determine that the charging is not possible, in an overcharging state or a deep discharging state.

When the battery module BM can be charged, the battery ECU 100 sets the charging amount of the battery module BM in step S230. The battery ECU 100 obtains the charging amount of the battery module BM based on, for example, the residual capacity SOC, the capacity ratio SOH, and the like of the battery module BM. The battery ECU 100 sets the CV charging voltage in step S240. For example, the battery ECU 100 sets a voltage value recommended as the charging voltage of the battery module BM as the CV charging voltage. The battery ECU 100 further sets the CC charging current in step S250. For example, the battery ECU 100 sets a current value recommended as the charging current of the battery module BM as the CC charging current. The battery ECU 100 notifies the charger 120 of the battery information indicating the battery state including the lithium precipitation amount, various settings including the CV charging voltage and the CC charging current, and exits from this control process.

On the other hand, when the battery module BM cannot be charged, in step S270, the battery ECU 100 notifies the charger 120 that the battery module BM cannot be charged, and exits from this control process.

Next, a control process on the charger 120 side when the battery module BM is charged will be described with reference to FIG. 17. This control process is executed by the charger 120 periodically or irregularly. Each control step of the control process shown in FIG. 17 forms a function realizing unit that realizes various functions executed by the charger 120.

Figure 17:
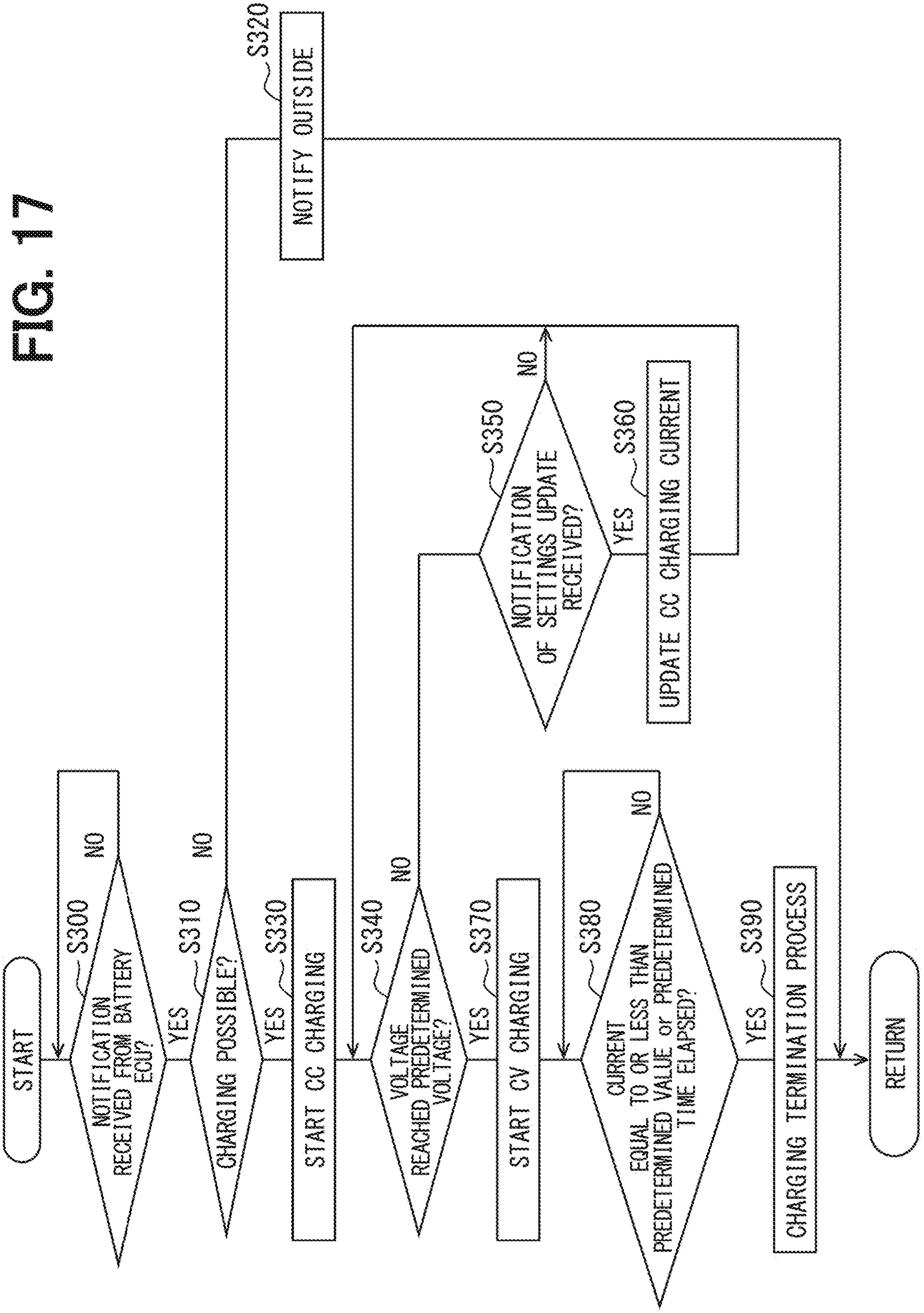
FIG. 17 is an explanatory diagram showing a flow of a control process executed by a charger.

As shown in FIG. 17, the charger 120 determines in step S300 whether the notification issued by the battery ECU 100 is received. The charger 120 waits until the notification is received from the battery ECU 100, and proceeds to step S310 when the notification is received from the battery ECU 100. In step S310, the charger 120 determines whether the battery module BM can be charged, based on the notification from the battery ECU 100. The process in step S310 is executed by the charging determination unit 122 of the charger 120.

When the notification from the battery ECU 100 indicates that the charging is not possible, in step S320, the charger 120 notifies the outside of the information indicating that the battery module BM cannot be charged and the information indicating the lithium precipitation amount by using the notification device ND, and does not execute charge the battery module BM.

On the other hand, when the notification from the battery ECU 100 indicates that the charging is possible, the charger

120 starts the CC charging in step S330. The charger 120 charges the battery module BM using the CC charging current set by the battery ECU 100 as the target current amount.

Subsequently, the charger 120 determines in step S340 whether the voltage of the battery module BM has reached a predetermined voltage. In this determination process, it is determined whether a timing to switch from the CC charging to the CV charging has arrived. The predetermined voltage is set to, for example, the CV charging voltage.

When the voltage of the battery module BM has not reached the predetermined voltage, the charger 120 determines in step S350 whether the notification of the setting update of the CC charging current is received from the battery ECU 100.

Figure 18:
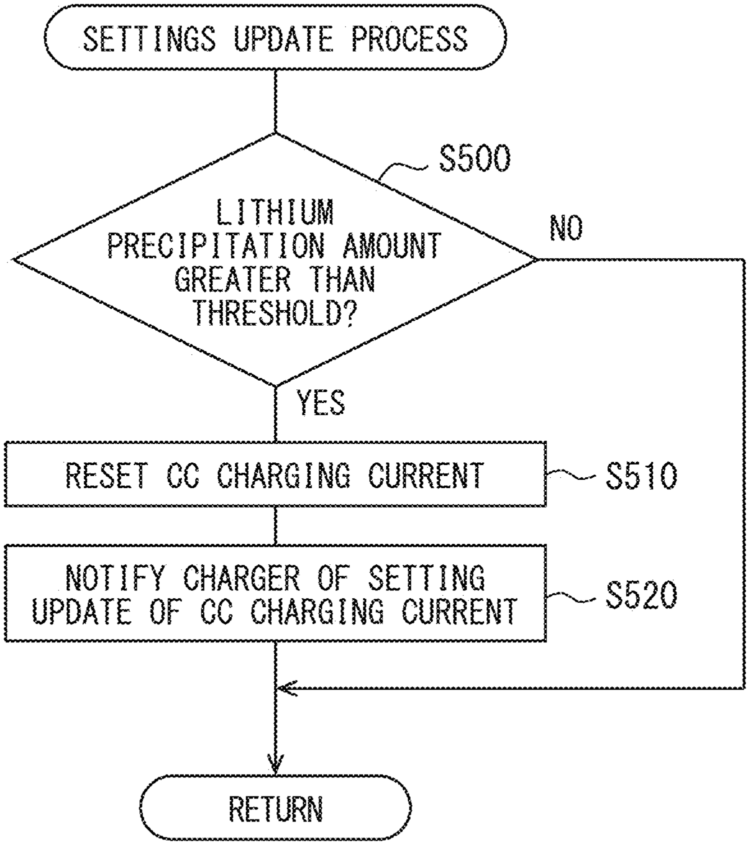
FIG. 18 is an explanatory diagram showing a flow of a control process executed by the battery monitoring device during the charging of the battery module.

The battery ECU 100 periodically or irregularly executes the setting update process shown in FIG. 18 during the CC charging. Specifically, as shown in FIG. 18, the battery ECU 100 determines in step S500 whether the lithium precipitation amount is greater than a predetermined threshold. This threshold is set to a value that assumes the lithium precipitation amount precipitated when the battery is abnormal. The battery ECU 100 skips subsequent steps and exits the setting update process when the lithium precipitation amount is equal to or less than the predetermined threshold, and proceeds to step S510 when the lithium precipitation amount is greater than the predetermined threshold. In step S510, the battery ECU 100 resets the CC charging current to be smaller than the current value. For example, the battery ECU 100 resets the current value before the lithium precipitation amount exceeds the predetermined threshold, as the CC charging current. The battery ECU 100 notifies the charger 120 of the setting update of the CC charging current in step S520.

Returning to FIG. 17, when the notification of the setting update of the CC charging current is received from the battery ECU 100, in step S360, the charger 120 updates the CC charging current to the current amount notified from the battery ECU 100. That is, the charger 120 reduces the current amount of the constant current when the lithium precipitation amount increases beyond the predetermined threshold during the CC charging. The process in step S360 is executed by the charging control unit 123 of the charger 120.

When the voltage of the battery module BM reaches the predetermined voltage, the charger 120 proceeds to step S370 and starts the CV charging. The charger 120 charges the battery module BM using the CV charging voltage set by the battery ECU 100 as the target voltage.

Subsequently, the charger 120 determines in step S380 whether the current flowing through the battery module BM is equal to or less than a predetermined value, or whether an elapsed time from the start of the charging of the battery module BM is equal to or longer than a predetermined time.

When the current flowing through the battery module BM is greater than the predetermined value and the elapsed time from the start of the charging is within the predetermined time, the charger 120 continues the CV charging. When the current flowing through the battery module BM is equal to or less than the predetermined value or the elapsed time from the start of the charging exceeds the predetermined time, in step S390, the charger 120 executes the present control process after executing the charge termination process. In the charging termination process, for example, the notification device ND notifies the user of the completion of the charging, the charging amount, the battery state, and the like.

The charging system BCS described above includes the charger 120 for the battery module BM including the lithium ion battery. The charger 120 includes the information acquisition unit 121 that acquires the battery information from the battery-side device, the charging determination unit 122 that determines whether the battery module BM can be charged, based on the battery information, and the charging control unit 123 that charges the battery module BM based on the determination result of the charging determination unit 122. In this way, in the configuration in which the charger 120 is configured to determine whether the battery module BM can be charged, based on the battery information acquired from the battery-side device, the charging time can be shortened as compared with a configuration in which it is determined whether the battery module BM can be charged by executing the preliminary charging.

The charging system BCS of the present embodiment has the following features.

Figure 19:
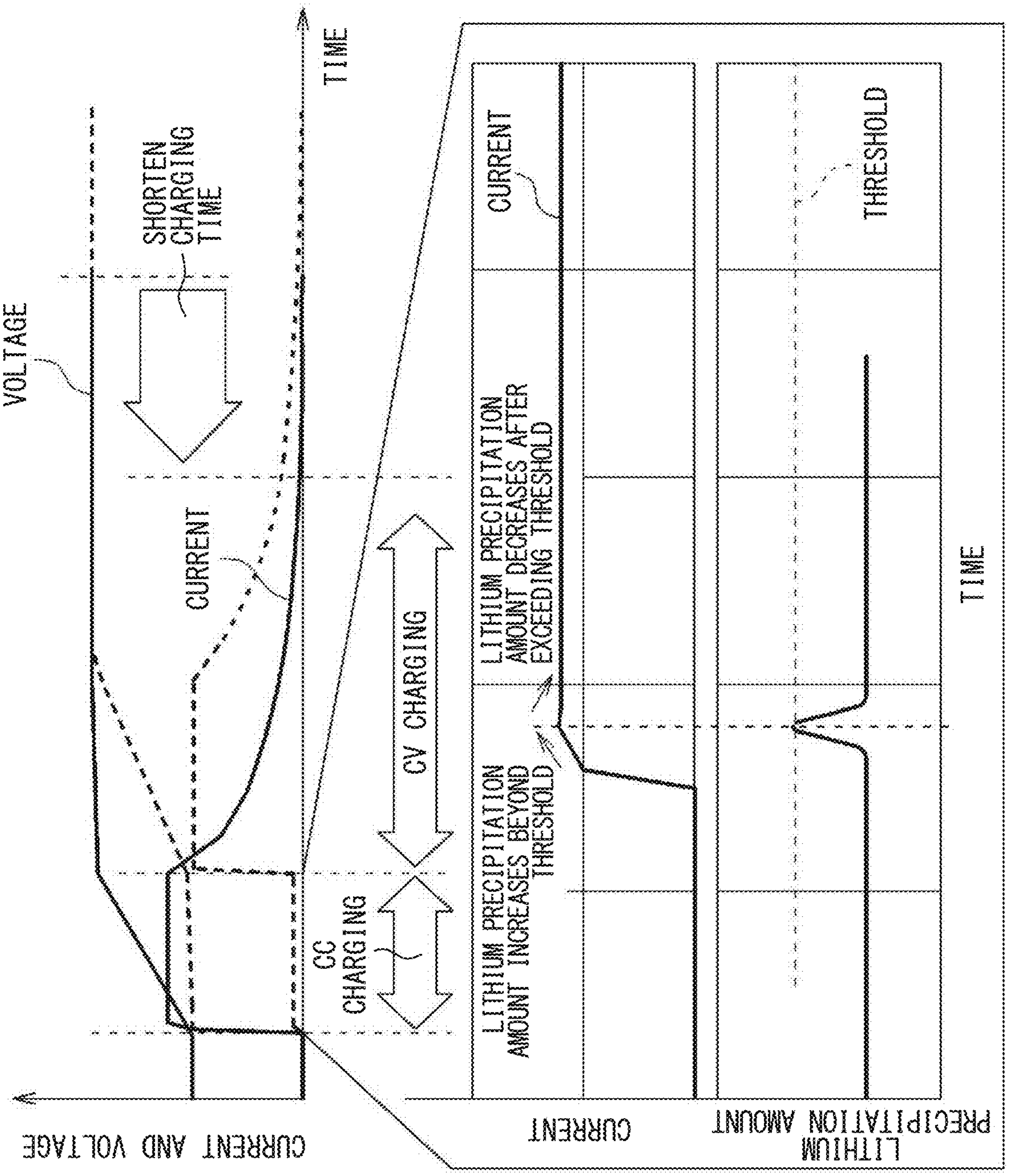
FIG. 19 is an explanatory diagram showing a current and a voltage during the charging of the battery module in the charging system of the first embodiment.

(1) The charging control unit 123 of the charger 120 is configured to charge the battery module BM using the CCCV charging method in which the charging is executed with the constant current and then with the constant voltage. For example, as shown in FIG. 19, the charging control unit 123 reduces the current amount of the constant current when the lithium precipitation amount increases beyond the predetermined threshold during the CC charging. Accordingly, since the lithium precipitation amount during the CC charging is restricted, it is possible to reduce the charging time of the battery module BM from increasing while securing the safety of the battery module BM.

(2) When the charging via the charger 120 is started, the battery-side device periodically determines whether the lithium precipitation amount has increased beyond the threshold. When the lithium precipitation amount increases beyond the threshold, the battery-side device sets the target current amount during the constant current charging to a value smaller than the present current amount, and notifies the charger 120 of the target current amount. When the target current amount is acquired from the battery-side device during the CC charging, the charging control unit 123 adjusts the current amount of the constant current based on the target current amount. In this way, in the configuration in which the battery-side device periodically monitors the lithium precipitation amount, and the current amount appropriate for the constant current charging is adjusted on the charger 120 side based on the monitoring result, it is possible to execute control of maximizing the charging rate such that the lithium precipitation does not occur. Accordingly, a waiting time caused by the user's charging time can be appropriately shortened.

(3) The charger 120 estimates the required charging time required for the charging based on the battery state, and notifies the outside of the information indicating the estimated required charging time by using the notification device ND. Accordingly, since the user can grasp an approximate waiting time, it is possible to reduce a psychological burden on the user when the battery module BM is charged.

(4) The charger 120 notifies the outside of the information indicating the lithium precipitation amount by using notification device ND. In this way, when it is possible to provide the user with the information indicating the required charging time as well as the information indicating the lithium precipitation amount, the user can grasp the safety of the lithium ion battery, and the user's uneasiness with respect to the lithium ion battery can be reduced.

[Modification of Charging System BCS]

The charging system BCS need not be the same as the above-described charging system BCS, and may be partially different from the above-described charging system BCS. The above-described technical matters can be applied to a device or a system other than an in-vehicle device.

[Battery Evaluation System BRS and Battery Evaluation Method]

In the lithium ion battery, lithium may precipitate due to charging at a low temperature or charging at high speed. As the lithium precipitation progresses, an internal short-circuit may occur, leading to ignition and smoke. Therefore, when the storage battery including the lithium ion battery is reused, it is desirable to understand the degree of deterioration as well as the safety considering a degree of lithium precipitation.

Taking this fact into account, in the battery evaluation system BRS and the battery evaluation method of the present embodiment, the safety of the storage battery is determined based on the lithium precipitation amount. The battery evaluation system BRS functions as a support system that supports reusing and rebuilding of the battery module BM. The battery evaluation system BRS and the battery evaluation method will be described below with reference to FIGS. 20 to 22.

Figure 20:
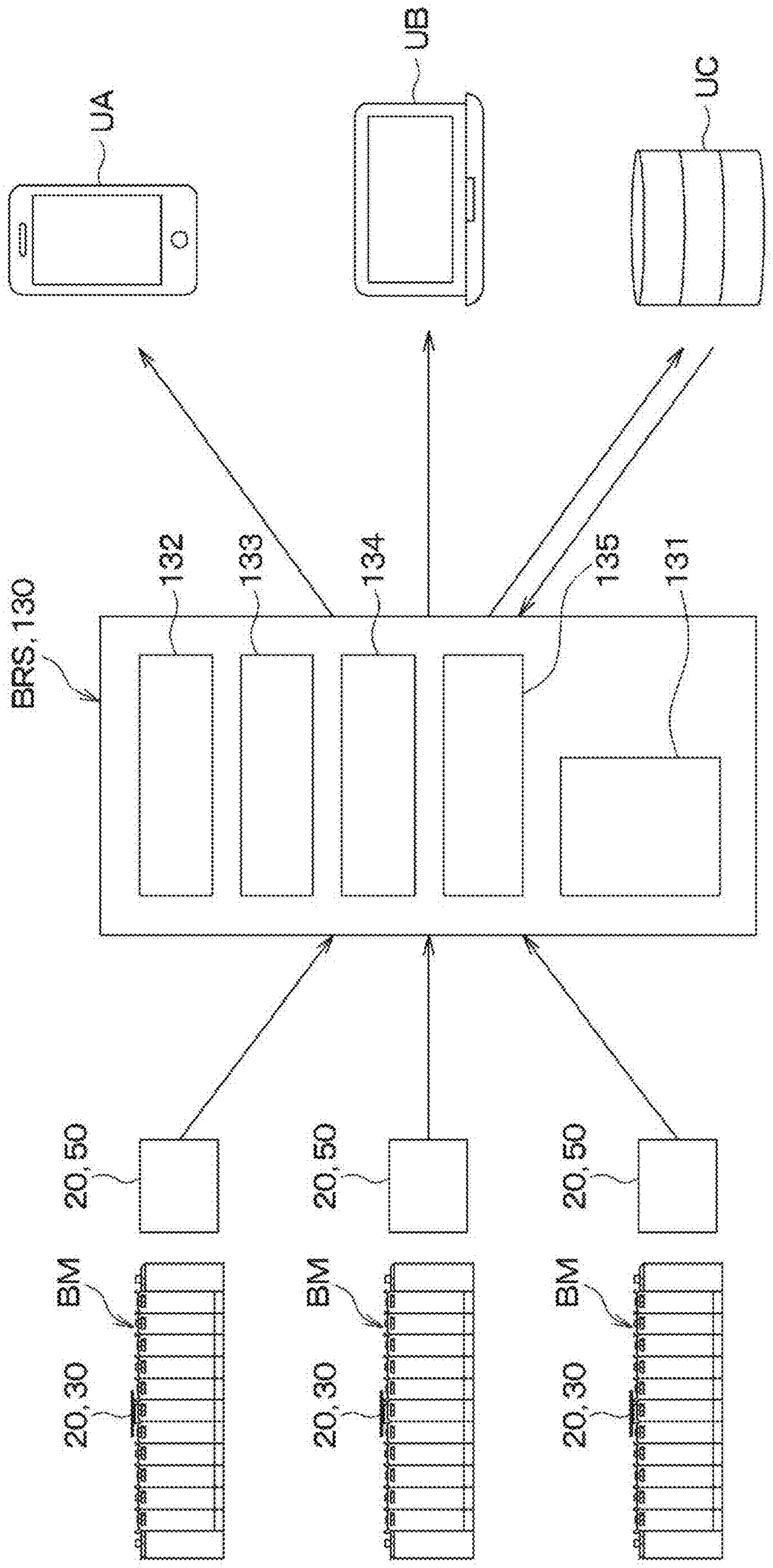
FIG. 20 is a schematic configuration diagram of a battery evaluation system.

As shown in FIG. 20, the battery evaluation system BRS includes the battery monitoring device 20 as the battery monitoring unit that monitors the battery state of the battery module BM, and an evaluation device 130 that evaluates the battery module BM.

The battery monitoring device 20 is basically formed in the same manner as described above. The battery monitoring device 20 is configured to calculate the lithium precipitation amount in the lithium ion battery included in the battery module BM as one index indicating the battery state. The battery monitoring device 20 is capable of outputting the battery state information including the monitoring result of the battery state including the lithium precipitation amount, and the like to the outside by using the wireless communication unit 52 of the monitoring module 50. In addition to the lithium precipitation amount, this battery state information includes battery type information indicating the intended use of the battery module BM, a usage history of the battery module BM, and the like. The battery monitoring device 20 may be configured to output the battery state information and the like to the outside using a communication device other than the wireless communication unit 52 of the monitoring module 50.

The evaluation device 130 is configured to communicate with the battery monitoring device 20, a data center where market trading information on the reused battery is stored, information terminals UA, UB, and UC owned by the user, the seller, the secondary user, and the like via a wired or wireless communication network. The evaluation device 130 acquires the battery state information from the battery monitoring device 20, and evaluates the battery module BM based on the battery state information. The evaluation device 130 of the present embodiment includes a safety determination unit 131, a value calculation unit 132, an intended use proposal unit 133, a reuse determination unit 134, and an information output unit 135.

The safety determination unit 131 determines the safety of the battery module BM based on the lithium precipitation amount in the lithium ion battery included in the battery module BM. The safety determination unit 131 determines that the safety is higher as the lithium precipitation amount is smaller, and determines that the safety is lower as the lithium precipitation amount is larger. When the battery module BM includes even one unsafe lithium battery, the safety of the battery module BM is impaired. Therefore, the safety determination unit 131 can rank the safety of each of multiple lithium ion batteries included in the battery module BM based on the lithium precipitation amount.

The value calculation unit 132 calculates the value of the battery module BM by taking the safety determination result of the battery module BM into account. The value calculation unit 132 calculates the value on the assumption that, for example, the battery module BM with higher safety is higher in price than the battery module BM with lower safety.

Figure 21:
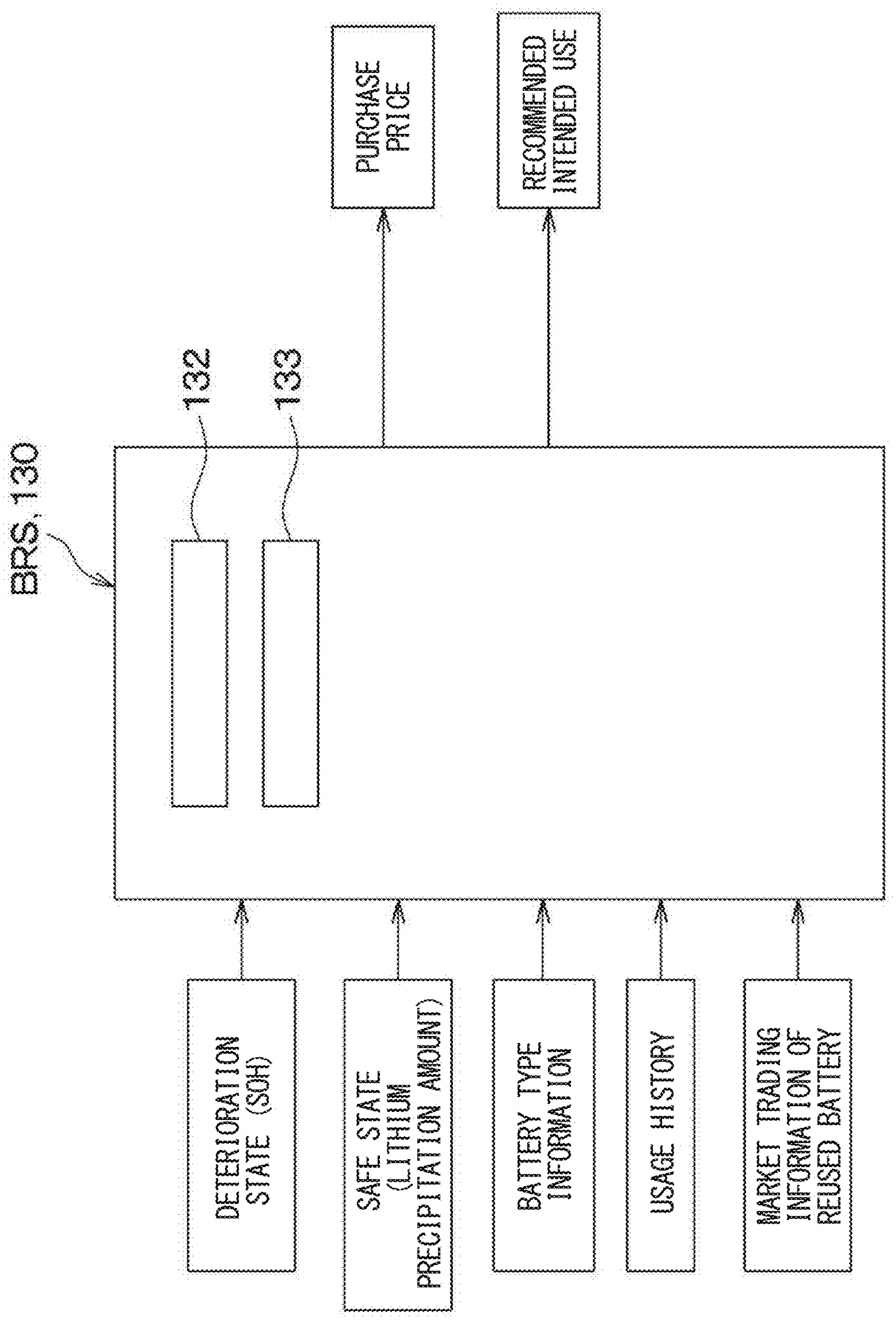
FIG. 21 is a schematic block diagram showing value calculation and intended use proposal of the battery module via the battery evaluation system.

For example, as shown in FIG. 21, the value calculation unit 132 acquires the deterioration state based on the capacity ratio SOH, the safety based on the lithium precipitation amount, the battery type information including the intended use, and the usage history from the battery monitoring device 20, and acquires the market trading information of the reused battery from the data center. The value calculation unit 132 calculates a purchase price of the battery module BM based on the deterioration state, the safety, the battery type information, the usage history, and the market trading information. For example, the value calculation unit 132 refers to a map that associates the deterioration state, the safety, the battery type information, the usage history, the market trading information, and the purchase price of the battery module BM with each other, and calculates the purchase price of the battery module BM based on the information acquired from the battery monitoring device 20 and the data center. The value calculation unit 132 may calculate a selling price of the battery module BM.

The intended use proposal unit 133 proposes a recommended intended use of the battery module BM at the time of reuse, by taking the determination result of the safety of the battery module BM into account. For example, as shown in FIG. 21, the intended use proposal unit 133 proposes a recommended intended use at the time of reuse of the battery module BM based on the deterioration state, the safety, the battery type information, and the usage history. For example, the intended use proposal unit 133 refers to a map that associates the deterioration state, the safety, the battery type information, the usage history, and the intended use at the time of reuse with each other, and obtains the recommended intended use at the time of reuse of the battery module BM based on the information acquired from the battery monitoring device 20.

The reuse determination unit 134 determines whether the lithium ion battery can be reused, by taking the safety of each of the multiple lithium ion batteries forming the battery module BM into account. For example, the reuse determination unit 134 determines that the reuse is possible when the lithium precipitation amount is equal to or less than a predetermined value, and determines that the reuse is not possible when the lithium precipitation amount exceeds the predetermined value.

Figure 22:
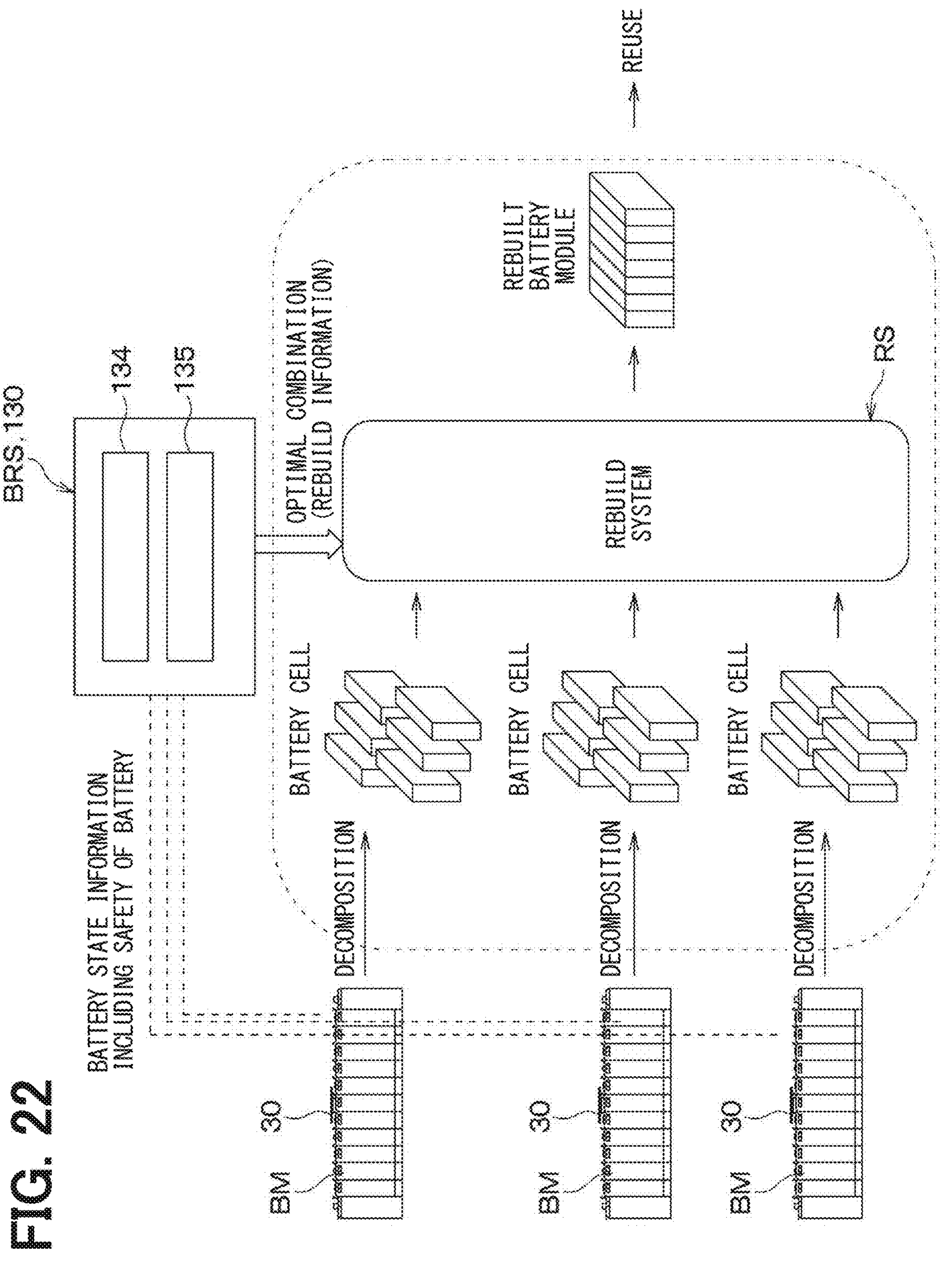
FIG. 22 is an explanatory diagram showing rebuild information generated by the battery evaluation system.

When a different battery is rebuilt by recombining reusable lithium ion batteries, as shown in FIG. 22, the information output unit 135 outputs a combination of the lithium ion batteries appropriate for a different battery intended use, as rebuild information, by taking the safety of the lithium ion battery into account.

The optimal combination of the lithium ion batteries may differ depending on the usage mode of the rebuilt battery. For this reason, it is desirable that the information output unit 135 outputs the combination corresponding to the usage mode of the rebuilt battery to a rebuild system RS that manufactures the rebuilt battery. For example, when the usage mode of the rebuilt battery is a long-period usage, such as a stationary type, the information output unit 135 outputs a combination that provides a long lifetime and high safety as the rebuild information. For example, when the rebuilt battery is to be used for a short period, the information output unit 135 outputs a combination that emphasizes matters other than lifetime as the rebuild information.

In the battery evaluation system BRS and the battery evaluation method described above, the battery state of the battery module BM is monitored, and the battery module BM is evaluated based on the battery state information including the monitoring result of the battery state. The battery monitoring device 20 calculates the lithium precipitation amount in the lithium ion battery as one index indicating the battery state. The evaluation device 130 determines the safety of the battery module BM based on the lithium precipitation amount. Accordingly, an index related to the safety of the battery module BM, such as a lithium precipitation state, is determined, so that it is possible to appropriately perform an evaluation including whether safety requirements are met.

The battery evaluation system BRS and the battery evaluation method of the present embodiment have the following features.

(1) The evaluation device 130 includes the value calculation unit 132 that calculates the value of the battery module BM by taking the safety determination result of the battery module BM into account. Accordingly, an appropriate value of the battery module BM can be provided to the user as information.

(2) The evaluation device 130 includes the intended use proposal unit 133 that proposes the intended use at the time of reuse of the battery module BM by taking the determination result of the safety of the battery module BM into account. Accordingly, an appropriate intended use of the battery module BM can be provided to the user as information.

(3) The evaluation device 130 ranks the safety of each of the multiple lithium ion batteries included in the battery module BM based on the lithium precipitation amount. Accordingly, it is possible to provide appropriate states of the multiple lithium ion batteries forming the battery module BM to the user as information.

(4) The evaluation device 130 includes the reuse determination unit 134 that determines whether the lithium ion battery can be reused, by taking the safety of each of the multiple lithium ion batteries into account. Accordingly, even when the battery module BM cannot be reused as a whole, a highly safe lithium ion battery in the battery module BM can be easily reused.

(5) When a battery different from the battery module BM is rebuilt by recombining reusable lithium ion batteries, the evaluation device 130 outputs the combination of the lithium ion batteries appropriate for a different battery intended use, as the rebuild information, by taking the safety of the lithium ion battery into account. Accordingly, even when the battery module BM cannot be reused as a whole, a highly safe lithium ion battery in the battery module BM can be easily used to construct another storage battery and reuse the other storage battery.

(6) In addition to the lithium precipitation amount, the battery state information includes at least one of the intended use, the usage history, or the deterioration state of the lithium ion battery. In this way, in the configuration in which the battery module BM is evaluated by using various information, it is possible to evaluate the battery module BM from multiple aspects.

[Modifications of Battery Evaluation System BRS and Battery Evaluation Method]

The battery evaluation system BRS and the battery evaluation method need not be the same as the above-described battery evaluation system BRS and the above-described battery evaluation method, and may be partially different from the above-described battery evaluation system BRS and the above-described battery evaluation method. The above-described technical matters can be applied to a device or a system other than an in-vehicle device.

Second Embodiment

Figure 23:
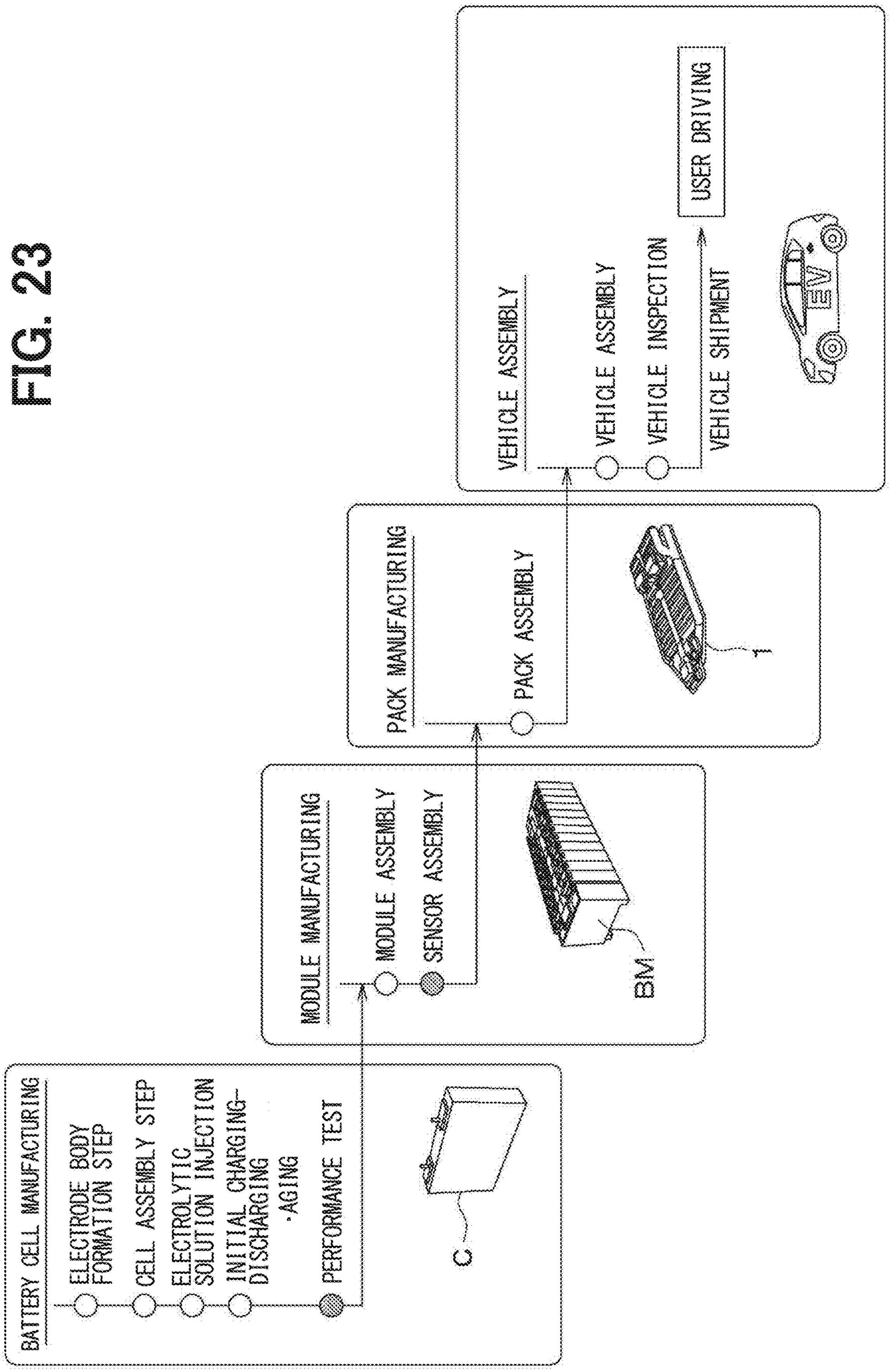
FIG. 23 is an explanatory diagram showing a manufacturing process up to mounting of the battery pack in a vehicle.

Next, a second embodiment will be described with reference to FIGS. 23 to 25. In the present embodiment, an example in which an occurrence factor of the abnormality in the battery module BM is specified based on the usage history and a manufacturing history of the battery module BM will be described.

First, a manufacturing process up to mounting of the battery pack 1 in the vehicle will be described with reference to FIG. 23. As shown in FIG. 23, the battery pack 1 is mounted in the vehicle through a step of manufacturing the battery cell C→a step of manufacturing the battery module BM→a step of manufacturing the battery pack 1→a step of assembly to the vehicle.

In the step of manufacturing the battery cell C, the formation of an electrode body, the cell assembly, the electrolytic solution injection, the initial charging-discharging, and the performance test are executed in this order. In this performance test, for example, an inspection device executes an external appearance inspection of a single battery cell C, a foreign matter inspection, a battery characteristic inspection, and the like.

In the lithium ion battery, lithium ions may be reduced and precipitated on the negative electrode. In particular, when the charging is executed at a high current or a low temperature, or when a metal foreign matter is mixed to the battery and the current density is concentrated, the lithium ions released from the positive electrode active material do not fully enter the negative electrode active material, and are likely to be precipitated on the negative electrode surface. When lithium is precipitated on the negative electrode, an amount of lithium ions that contribute to the battery reaction decreases, which may result in a decrease in the capacity or the occurrence of the internal short-circuit.

For this reason, in the step of manufacturing the battery cell C, the current and temperature conditions under which the lithium precipitation does not occur are calculated and mapped, and the manufacturing techniques or inspections are executed to reduce the metal foreign matter from being mixed to the battery cell C. In the step of manufacturing the battery cell C, for example, light is applied onto the electrode surface of the battery cell C to inspect whether lithium is precipitated, or the resistance distribution on the negative electrode active material surface is measured to inspect the ease of the lithium precipitation.

In the subsequent step of manufacturing the battery module BM, module assembly in which the battery cells C are assembled together, and sensor assembly in which the sensor unit 30 and the like are assembled to the assembly of the battery cell C are executed. In this step of manufacturing the battery module BM, the battery monitoring device 20 is attached to the battery module BM. Accordingly, the battery monitoring device 20 can monitor the lithium precipitation amount and the like at the manufacturing stage of the battery module BM.

In the subsequent step of manufacturing the battery pack 1, pack assembly in which the assembled battery modules BM are stored in the airtight container 11 is executed. In this step, inspections such as continuity check are executed as appropriate.

In the subsequent vehicle assembly step, the battery pack 1 is assembled to the vehicle and the vehicle is inspected. During vehicle inspections, the continuity with an in-vehicle device is checked. Thereafter, the vehicle on which the battery pack 1 is mounted is shipped from a factory to the user.

By the way, it is also possible to disassemble the battery cell C and inspect the lithium precipitation amount, but this inspection method is not applicable to the battery cell C that is actually used or the battery cell C that is in the manufacturing step, setting aside the development stage.

Figure 24:
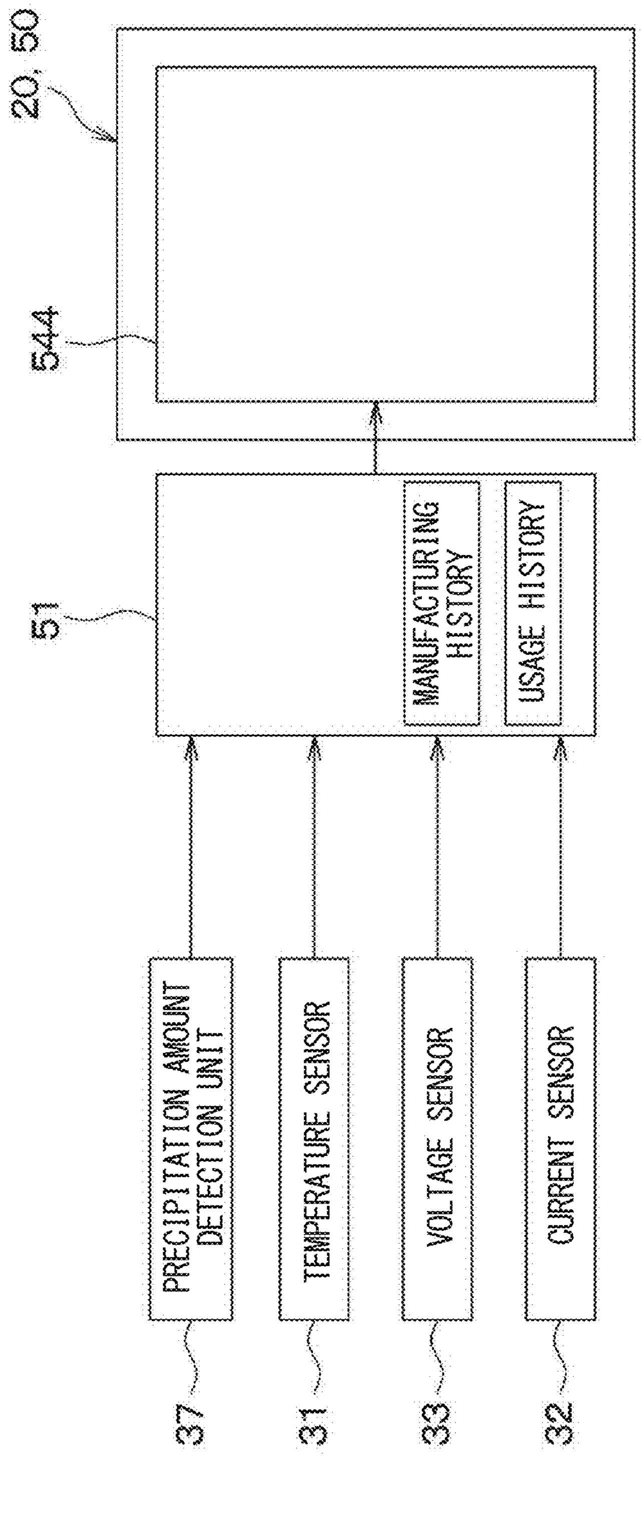
FIG. 24 is an explanatory diagram showing some functions of a battery monitoring device according to a second embodiment.
Figure 25:
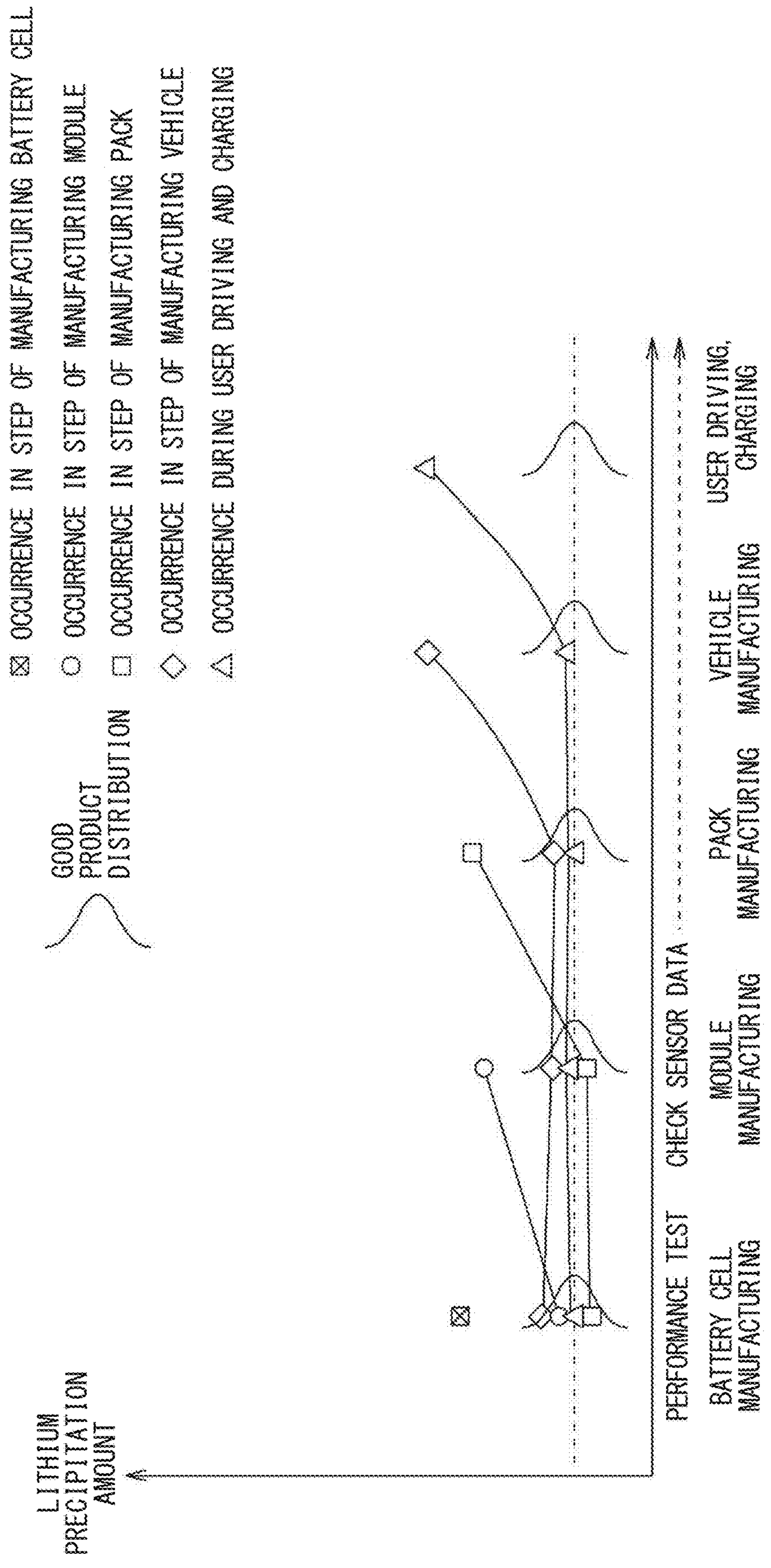
FIG. 25 is an explanatory diagram showing a time when lithium in a lithium ion battery is precipitated.

Meanwhile, as shown in FIG. 24, the battery monitoring device 20 includes the precipitation amount detection unit 37 that calculates the lithium precipitation amount by using the output of the sensor installed in the battery module BM, and a storage unit 51 that stores a temporal change in the lithium precipitation amount as one of the usage histories of the battery.

The battery monitoring device 20 stores, for example, the lithium precipitation amount or the like as one of the usage histories in the storage unit 51, which is a storage medium, when the user drives the vehicle. The battery monitoring device 20 stores the lithium precipitation amount in the step of manufacturing the battery module BM, the step of manufacturing the battery pack 1, the vehicle assembly step, or the like in the storage unit 51 or an external storage device, as one of the manufacturing histories.

The battery monitoring device 20 includes an abnormality specifying unit 544 that specifies the occurrence factor of the abnormality of the lithium ion battery based on the usage history stored in the storage unit 51 and the manufacturing history stored in the storage unit 51 or the external storage device when the abnormality occurs in the lithium ion battery. The abnormality specifying unit 544 uses the manufacturing history as reference data, compares the manufacturing history with the usage history to specify an occurrence time of the abnormality in the lithium ion battery, and verifies the battery state before and after the occurrence time to specify the occurrence factor of the abnormality in the lithium ion battery. For example, as shown in FIG. 25, the abnormality specifying unit 544 specifies a timing at which the lithium precipitation amount increases as an occurrence time of the abnormality in the lithium ion battery.

Other aspects are the same as those in the first embodiment. The battery monitoring device 20 of the present embodiment can obtain the same effects as the first embodiment from the common or equivalent configuration to the first embodiment.

The battery monitoring device 20 of the present embodiment has the following features.

(1) The battery monitoring device 20 includes the storage unit 51 that stores the temporal change in the lithium precipitation amount as one of the usage histories or the manufacturing histories of the lithium ion battery. With this configuration, the lithium precipitation amount can be appropriately detected nondestructively and in a short time, and the lithium precipitation state can be inspected. In particular, since a sensor for detecting the lithium precipitation is installed in the battery module BM, the lithium precipitation state can be detected regardless of time or place. By storing the temporal change in the lithium precipitation amount in the storage unit 51 as one of the usage histories or the manufacturing histories of the lithium ion battery, it is possible to clearly grasp when lithium is precipitated. This configuration has the advantage of clarifying a location of responsibility for the lithium precipitation.

(2) The battery monitoring device 20 also includes the abnormality specifying unit 544 that specifies the factor of the abnormality in the lithium ion battery based on the usage history and the manufacturing history of the lithium ion battery when the abnormality occurs in the lithium ion battery. In this way, when the occurrence factor of the abnormality in the lithium ion battery is specified based on the history information including the usage history as well as the manufacturing history, the occurrence factor of the abnormality can be investigated at the usage stage and also investigated by tracing back to the manufacturing stage. This configuration greatly contributes to clarifying the location of responsibility.

Modification of Second Embodiment

The battery monitoring device 20 of the second embodiment need not be the same as the above-described battery monitoring device 20, and may be partially different from the above-described battery monitoring device 20. The technical matters described in the second embodiment can be applied to a device or a system other than an in-vehicle device.

Third Embodiment

Next, a third embodiment will be described with reference to FIGS. 26 to 33. In the present embodiment, an example will be described in which the battery management unit BMU of the present disclosure is applied to a large-capacity power storage system BSS that is a stationary type.

Figure 26:
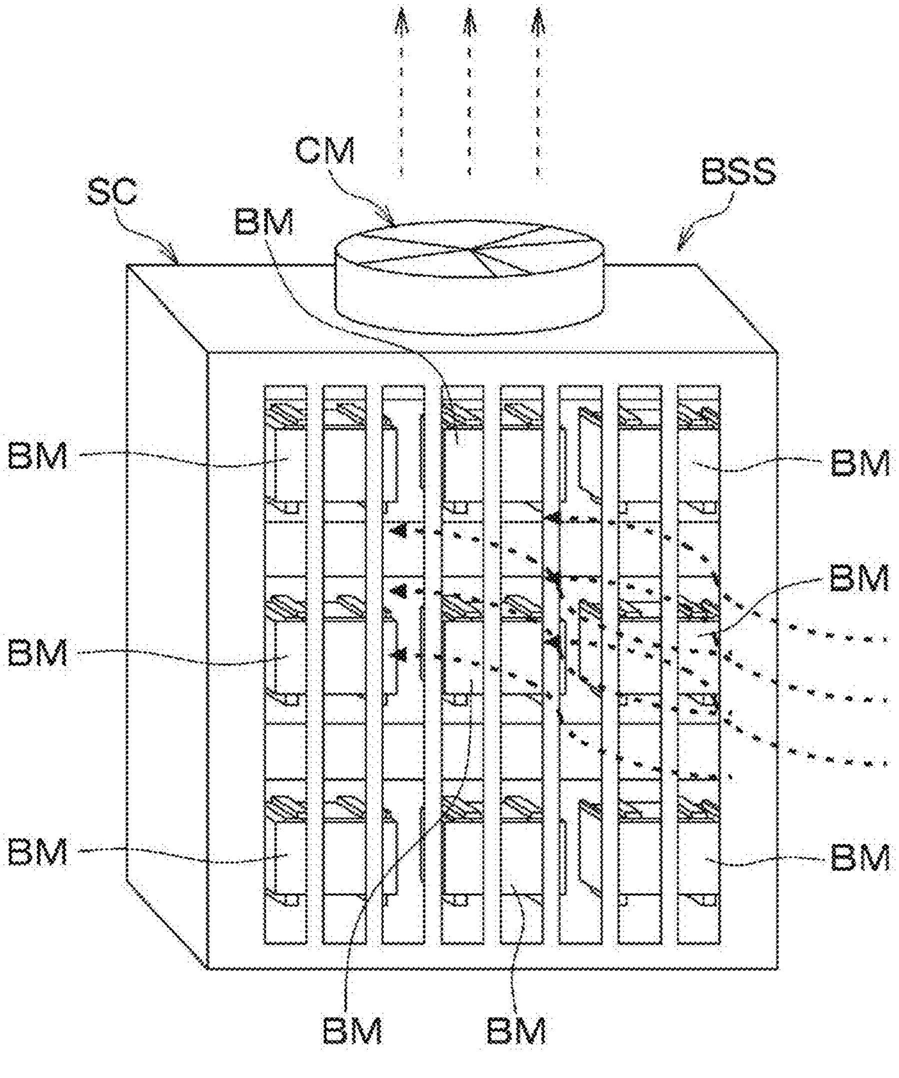
FIG. 26 is a schematic configuration diagram of a large-capacity power storage system according to a third embodiment.
Figure 27:
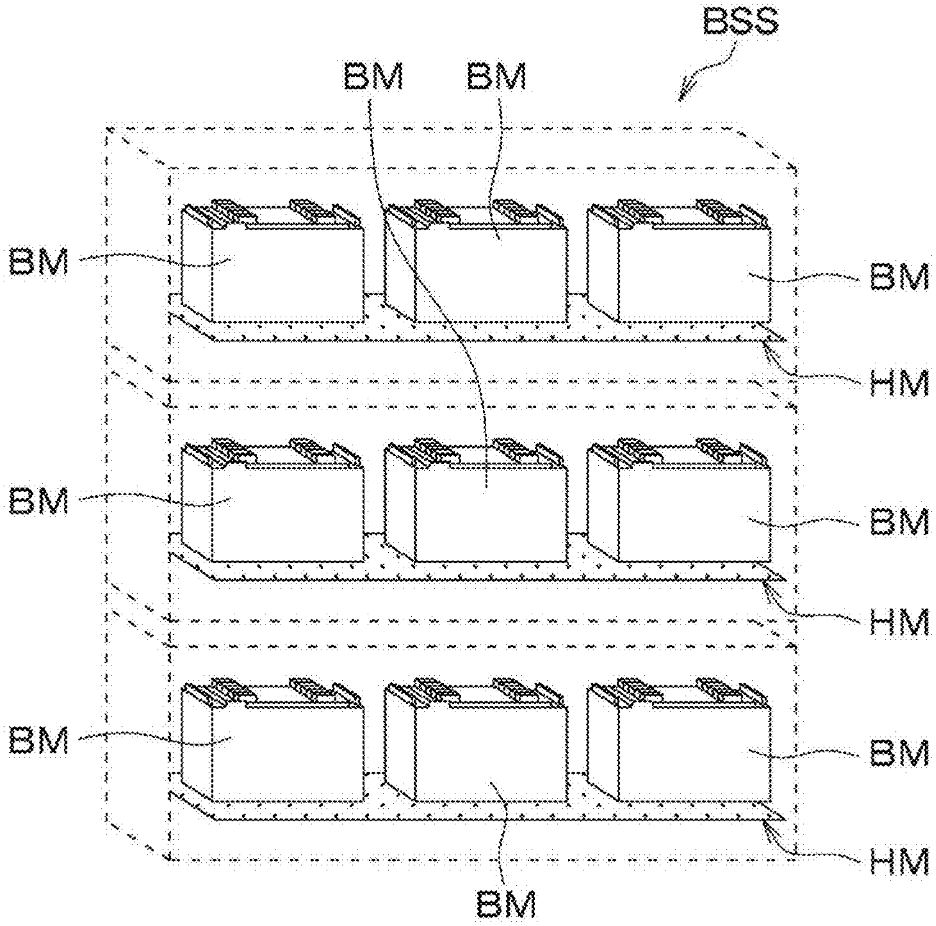
FIG. 27 is an explanatory diagram showing an internal configuration of the large-capacity power storage system.
Figure 28:
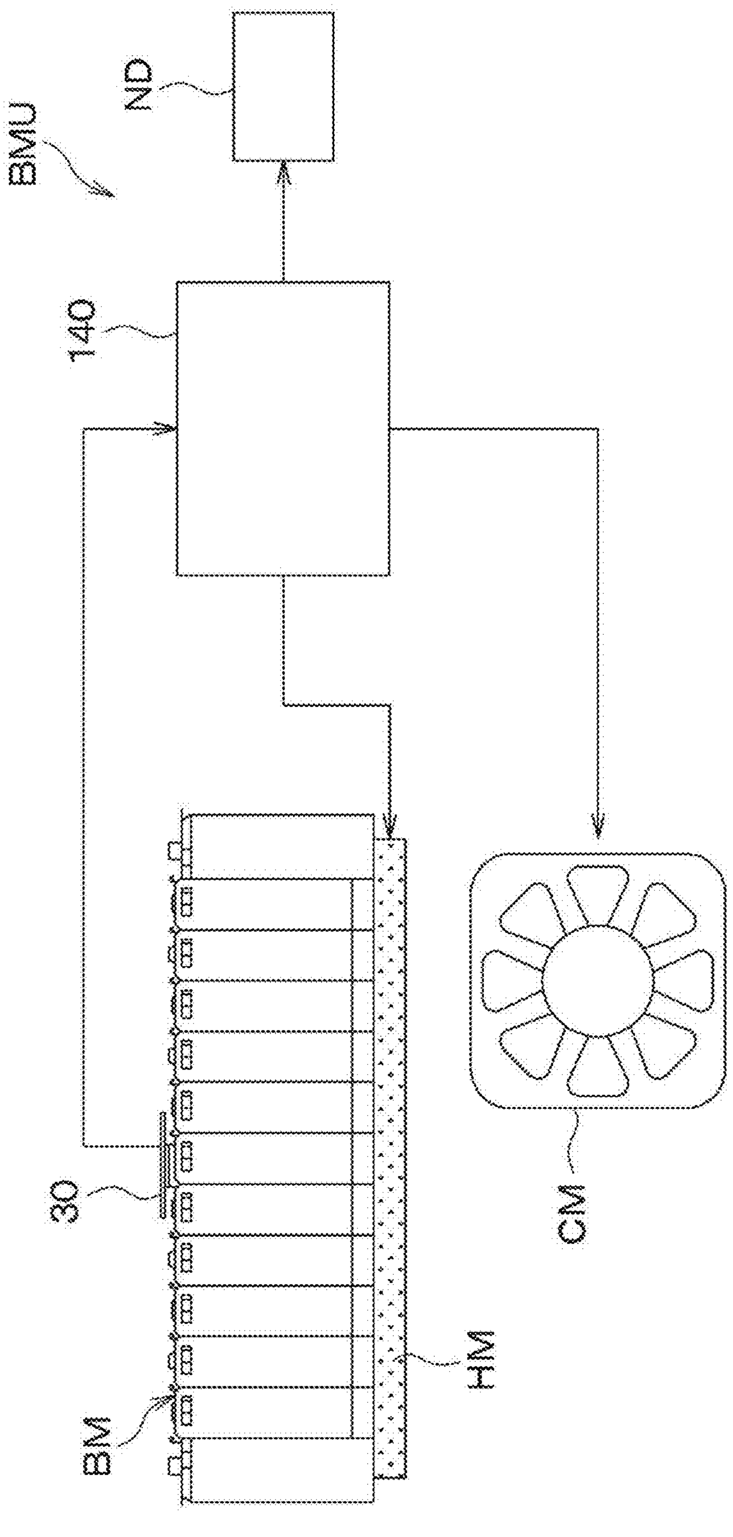
FIG. 28 is a schematic system configuration diagram of the large-capacity power storage system.

As shown in FIGS. 26, 27, and 28, the large-capacity power storage system BSS includes a storage container SC, multiple battery modules BM, a blowing device CM, a heater device HM, the battery management unit BMU, and the like.

Each of the multiple battery modules BM is a storage battery including the lithium ion battery. The sensor unit 30 is installed in each of the multiple battery modules BM. This sensor unit 30 is formed in the same manner as described in the first embodiment.

The storage container SC is a container that stores the multiple battery modules BM. The storage container SC is appropriately provided with openings to secure ventilation. The storage container SC is provided with the blowing device CM and the heater device HM.

The blowing device CM is a cooling element of the battery module BM, and generates an air flow inside the storage container SC. The blowing device CM may be formed as a type of device that sucks air into the storage container SC, or may be formed as a type of device that forces air into the storage container SC. The operation of the blowing device CM is controlled in response to a control signal from a battery control device 140, which will be described later.

The heater device HM is a heating element of the battery module BM, and includes a heat generating element that generates heat when energized. The heater device HM may be configured to directly heat the battery module BM, or may be configured to indirectly heat the battery module BM. The operation of the blowing device CM is controlled in response to a control signal from a battery control device 140, which will be described later.

The battery management unit BMU manages the multiple battery modules BM. The battery management unit BMU includes the sensor unit 30 that monitors the battery state including the lithium precipitation amount in the lithium ion battery, and the battery control device 140 that executes charging control for the multiple battery modules BM.

The battery control device 140 executes the charging control for the multiple battery modules BM based on the battery state monitored by the sensor unit 30. The battery control device 140 charges the multiple battery modules BM by using, for example, electric power obtained from solar power generation or the like or electric power during a time period when electricity costs are low.

The battery control device 140 is connected to the notification device ND. The battery control device 140 notifies the outside of the battery state and the like monitored by the sensor unit 30, via the notification device ND.

In the lithium ion battery, since the electrode potential during the charging drops to near an oxidation-reduction potential of lithium, lithium is likely to precipitate in situations such as low-temperature charging, large-capacity charging, and overcharging. The lithium precipitation reduces available lithium ions inside the battery, and causes a rapid decrease in the battery capacity. When the lithium precipitation continues, an internal short-circuit may occur, which in the worst case may lead to thermal runaway of the battery.

Once the battery fails, there is a possibility that it is not possible to store the generated energy until the battery is restored, and the user and a business operator may suffer significant losses. Therefore, in order to continue using the battery safely and securely, in addition to properly managing the temperature of the lithium ion battery while charging and discharging the lithium ion battery, it is necessary to detect a sign of the battery failure such as the internal short-circuit at an early stage and minimize a downtime.

Figure 29:
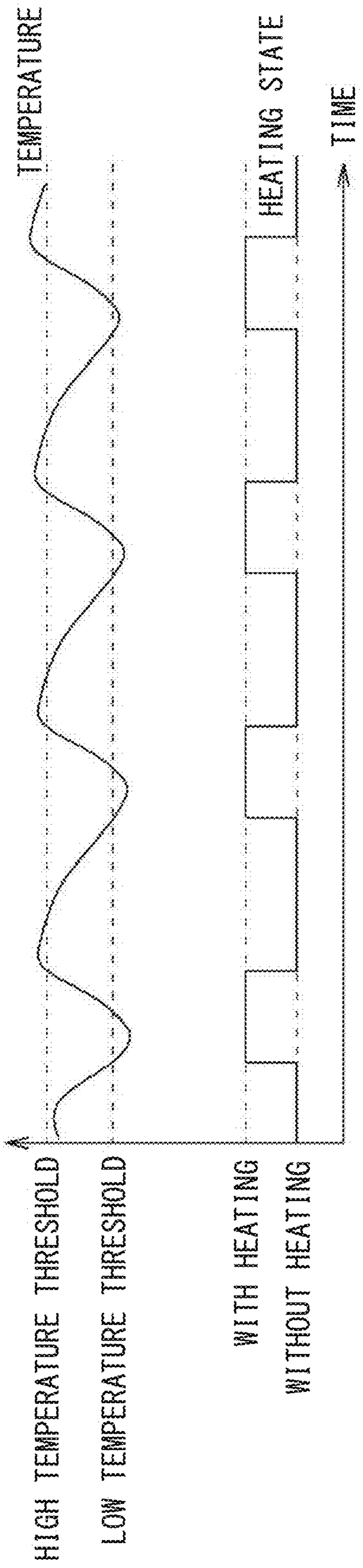
FIG. 29 is an explanatory diagram showing temperature control of a large-capacity power storage system that is a comparative example of the third embodiment.

On the other hand, for example, as shown in FIG. 29, when the temperature of the lithium ion battery is equal to or less than a predetermined low temperature threshold, the electric power stored in the battery may be as a power source, and the battery may be heated by the heating element such as the heater device HM.

However, the above-described method is a control method that focuses only on the battery temperature, and it may not be always necessary to raise the temperature of the battery depending on the charging-discharging rate of the battery. When only the temperature of the battery is focused, the temperature of the battery may be controlled excessively, and as a result, the electric power stored in the battery may be used excessively. In a case of large-scale power storage equipment such as the large-capacity power storage system BSS, a temperature distribution of the battery is complicated, and it is difficult to appropriately grasp the temperature of the battery. Since it is difficult to detect the battery failure such as the internal short-circuit at an initial stage by using only the temperature information of the lithium ion battery, and the system fails before the business operator secures an appropriate amount of maintenance time, there is a possibility of significant downtime. The charging-discharging rate is a speed of the charging and discharging.

Taking these facts into account, the battery control device 140 heats the lithium ion battery according to the lithium precipitation amount during the charging control. The lithium precipitation may occur other than during the charging control. For this reason, it is desirable that the battery control device 140 executes heat the lithium ion battery according to the lithium precipitation amount, in addition to the charging control.

Figure 30:
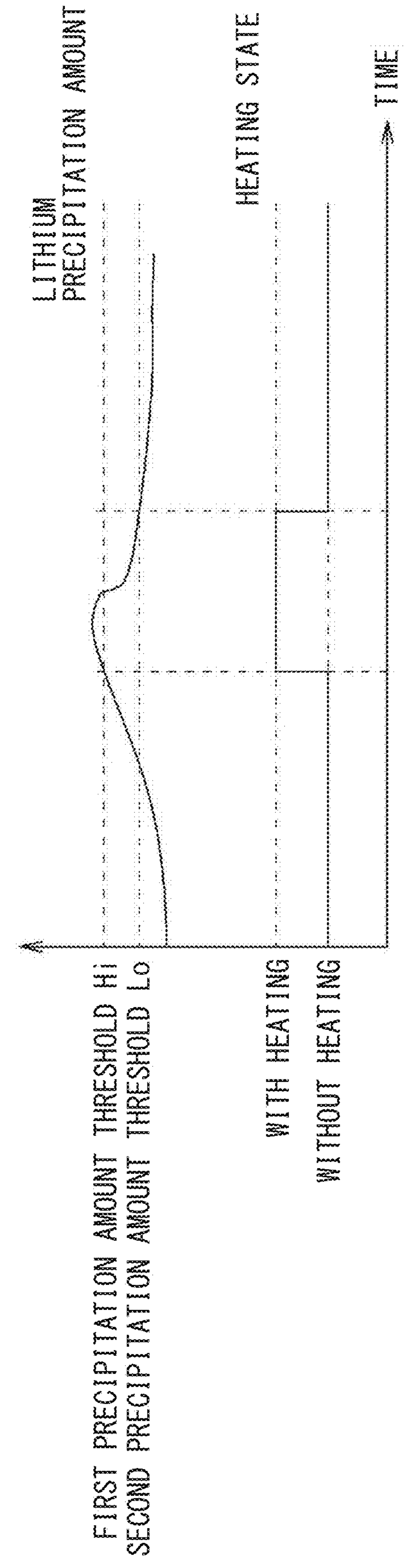
FIG. 30 is an explanatory diagram showing temperature control of the large-capacity power storage system according to the third embodiment.

For example, as shown in FIG. 30, when the lithium precipitation amount increases beyond a first precipitation threshold Hi, the battery control device 140 starts energizing the heater device HM to heat the battery module BM. The lithium precipitation amount decreases by heating the battery module BM. When the lithium precipitation amount falls below a second precipitation threshold Lo, which is smaller than the first precipitation threshold Hi, the battery control device 140 stops energizing the heater device HM to stop heating the battery module BM.

As described above, the lithium precipitation occurs in the situations such as the large-capacity charging and the overcharging, in addition to the low-temperature charging. In the situations such as the large-capacity charging or the overcharging, the battery temperature of the battery module BM may be high to some extent.

Figure 31:
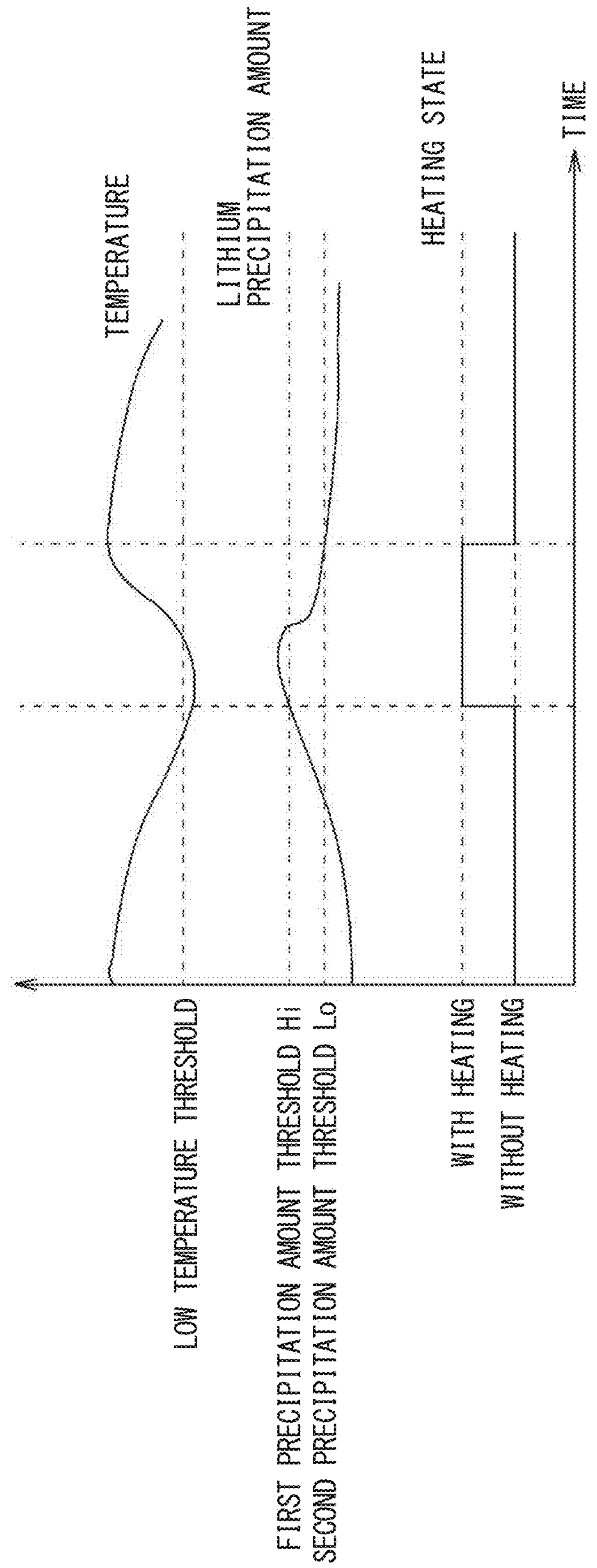
FIG. 31 is an explanatory diagram showing a modification of the temperature control.

Therefore, the battery control device 140 may heat the lithium ion battery according to the lithium precipitation amount and the temperature of the battery module BM. For example, as shown in FIG. 31, the battery control device 140 energizes the heater device HM to heat the battery module BM when the lithium precipitation amount increases beyond the first precipitation threshold Hi and the battery temperature of the battery module BM is equal to or less than the predetermined low temperature threshold.

When the lithium precipitation amount exceeds the first precipitation threshold Hi in a state where the battery temperature of the battery module BM exceeds the low temperature threshold, the battery control device 140 restricts the charging and discharging of the battery module BM, or notifies the outside of the abnormality in the battery by using the notification device ND.

Figure 32:
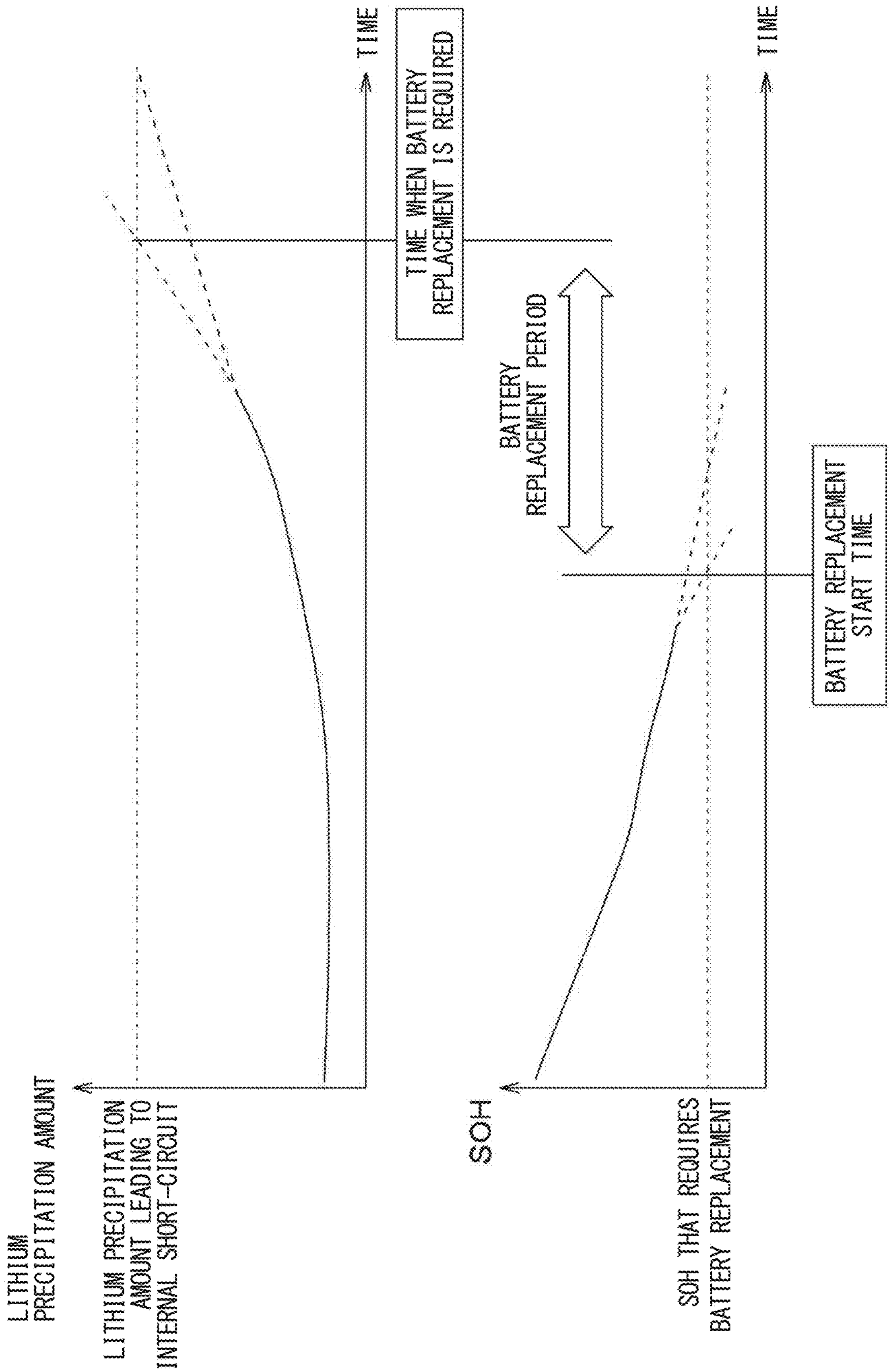
FIG. 32 is an explanatory diagram showing an appropriate time for battery replacement.

In order to reduce the downtime, for example, as shown in FIG. 32, it is desirable to replace the battery in a period from when the capacity ratio SOH of the battery decreases to a certain extent due to the deterioration until the lithium precipitation amount reaches an amount that causes the internal short-circuit in the battery.

Taking this fact into account, the battery control device 140 of the present embodiment estimates a desired battery replacement period based on the change in the capacity ratio SOH and the change in the lithium precipitation amount output by the sensor unit 30, and notifies the outside of the battery replacement period as a recommended period by using the notification device ND. Accordingly, the business operator and the like can know a recommended period for the battery replacement, and thus it is possible to reduce the downtime caused by the system failure including the maintenance or the battery failure.

Other aspects are the same as those in the first embodiment. The battery management unit BMU of the present embodiment can obtain the same effects as the first embodiment from the common or equivalent configuration to the first embodiment.

The battery management unit BMU of the present embodiment has the following features.

(1) When the lithium precipitation amount increases beyond the predetermined threshold, the battery management unit BMU heats the battery module BM via the heater device HM that raises the temperature of the battery module BM. Accordingly, the lithium ion battery is heated at the timing when the lithium precipitation amount increases, to appropriately restrict the increase in the lithium precipitation amount, so that the lithium ion battery can be used in a safe and highly efficient manner. In particular, the battery management unit of the present disclosure is suitable for the large-scale power storage equipment in which the temperature distribution is likely to expand.

(2) The sensor unit 30 includes the temperature sensor 31 that detects the battery temperature of the lithium ion battery. The battery control device 140 may heat the battery module BM via the heater device HM when the lithium precipitation amount increases beyond the predetermined threshold and the battery temperature is equal to or less than the predetermined low temperature threshold. Accordingly, it is also possible to use the lithium ion battery in a safe and highly efficient manner.

Modification of Third Embodiment

In the third embodiment, the battery management unit BMU of the large-capacity power storage system BSS is described in detail, but the battery management unit BMU need not be the same as the above-described battery management unit BMU, and may be partially different from the above-described battery management unit BMU.

The technical matters described in the third embodiment can be applied to a device or a system other than the large-capacity power storage system BSS. The battery management unit BMU can be used, for example, for management of a power supply of a mobile object such as the vehicle.

In the third embodiment, the heating element is formed by the heater device HM, but the heating element is not limited to this, and the heating element may be formed by a load device around the battery. The heating element may be heated by the electric power supplied from a source other than the battery module BM.

Figure 33:
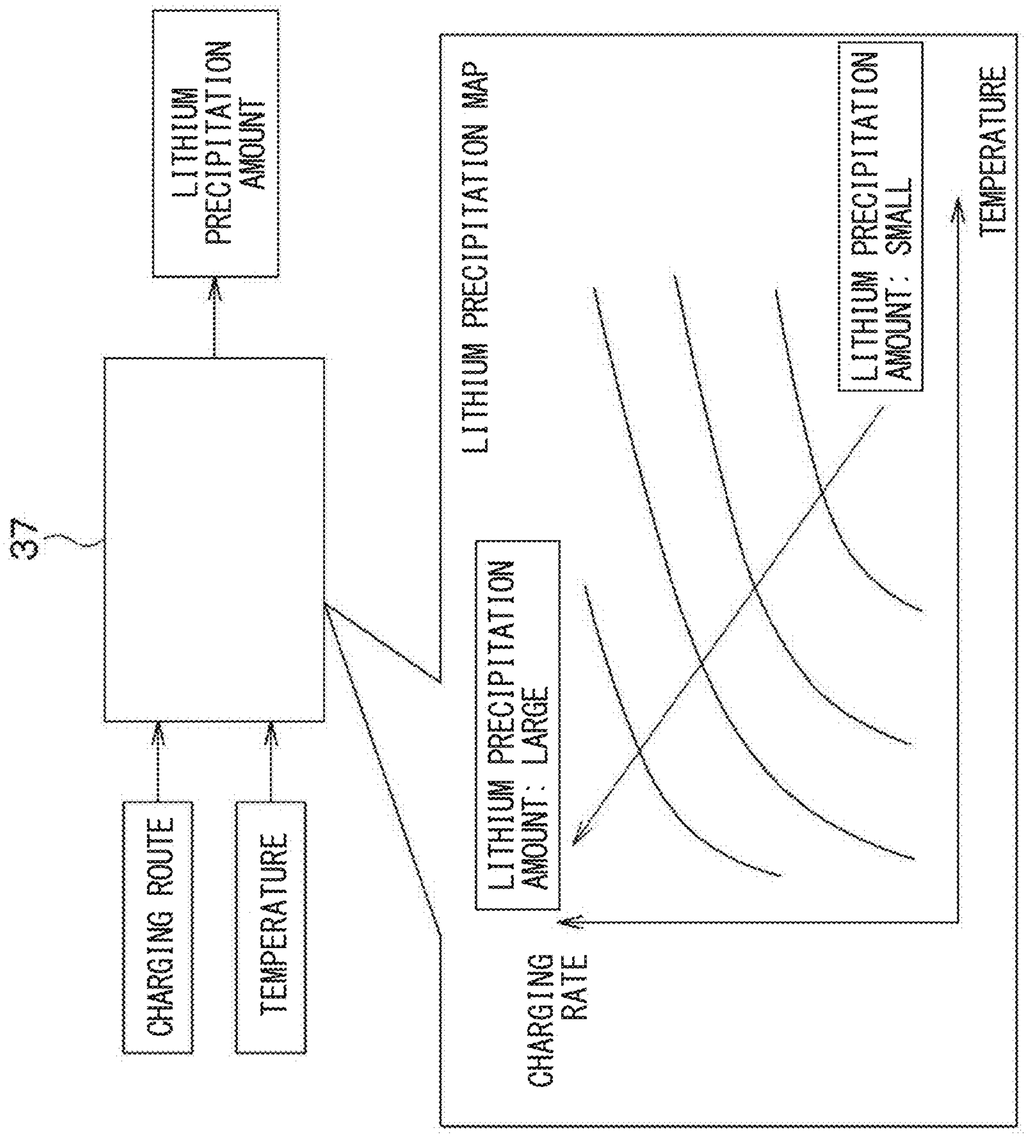
FIG. 33 is an explanatory diagram showing a relationship between a charging rate, a temperature, and the lithium precipitation amount.

The lithium precipitation amount tends to increase when the battery temperature is low and the charging rate is high, and the lithium precipitation amount tends to decrease when the battery temperature is high and the charging rate is low. As described above, there is a certain correlation between the lithium precipitation amount, the charging rate, and the battery temperature. For this reason, the precipitation amount detection unit 37 may calculate the lithium precipitation amount by referring to a control map that defines a correlation among the lithium precipitation amount, the charging rate, and the battery temperature, as shown in FIG. 33, for example. The same applies to the embodiments other than the present embodiment.

Fourth Embodiment

Next, a fourth embodiment will be described with reference to FIGS. 34 and 35. In the present embodiment, a battery transport apparatus BSC that stores the battery in the storage container SC and transports the battery will be described.

The lithium ion battery also contains toxic and flammable chemicals, so the lithium ion battery should be transported safely. For example, international regulations stipulate packaging standards for transport by air depending on a lithium content. The assembled battery used in an electric vehicle has a high lithium content and is legally difficult to transport by air, so the assembled battery is generally transported by sea via a ship. Sea transport takes a longer time than the transport by air. For example, during the summer, transport may take a long time under high temperature and high humidity conditions, and during the winter, transport may take a long time under low temperature conditions. Under such stress environments, once the lithium ion battery enters the unsafe state, it is difficult to control the lithium ion battery and there is a risk of damage to other cargos or occupants, so that it is important to monitor a safe state of the lithium ion battery.

On the other hand, when the lithium ion battery is transported by using a transport container made of non-combustible material and having a cooling mechanism, and an unsafe event of the battery is detected by using the gas sensor 35, the cooling mechanism may deactivate the lithium ion battery.

However, a chemical reaction that causes the lithium ion battery to be in the unsafe state is a chain reaction of an exothermic reaction, and when the gas sensor 35 is used to detect the unsafe event in the battery as in the above method, the chain reaction has already begun at a point in time when gas is ejected from the lithium ion battery. Since the chain reaction proceeds rapidly, it is difficult to deactivate the lithium ion battery at such a point in time. The ejected gas is harmful and may cause damage to the cargo and the occupant.

Taking these facts into account, the battery transport apparatus BSC of the present embodiment is configured to monitor the factor that leads to the abnormal heat generation phenomenon in which the temperature of the battery continues to rise unintentionally, and detect the abnormal state that occurs in the battery at the initial stage of the occurrence of the abnormal heat generation phenomenon based on the monitoring result.

Figure 34:
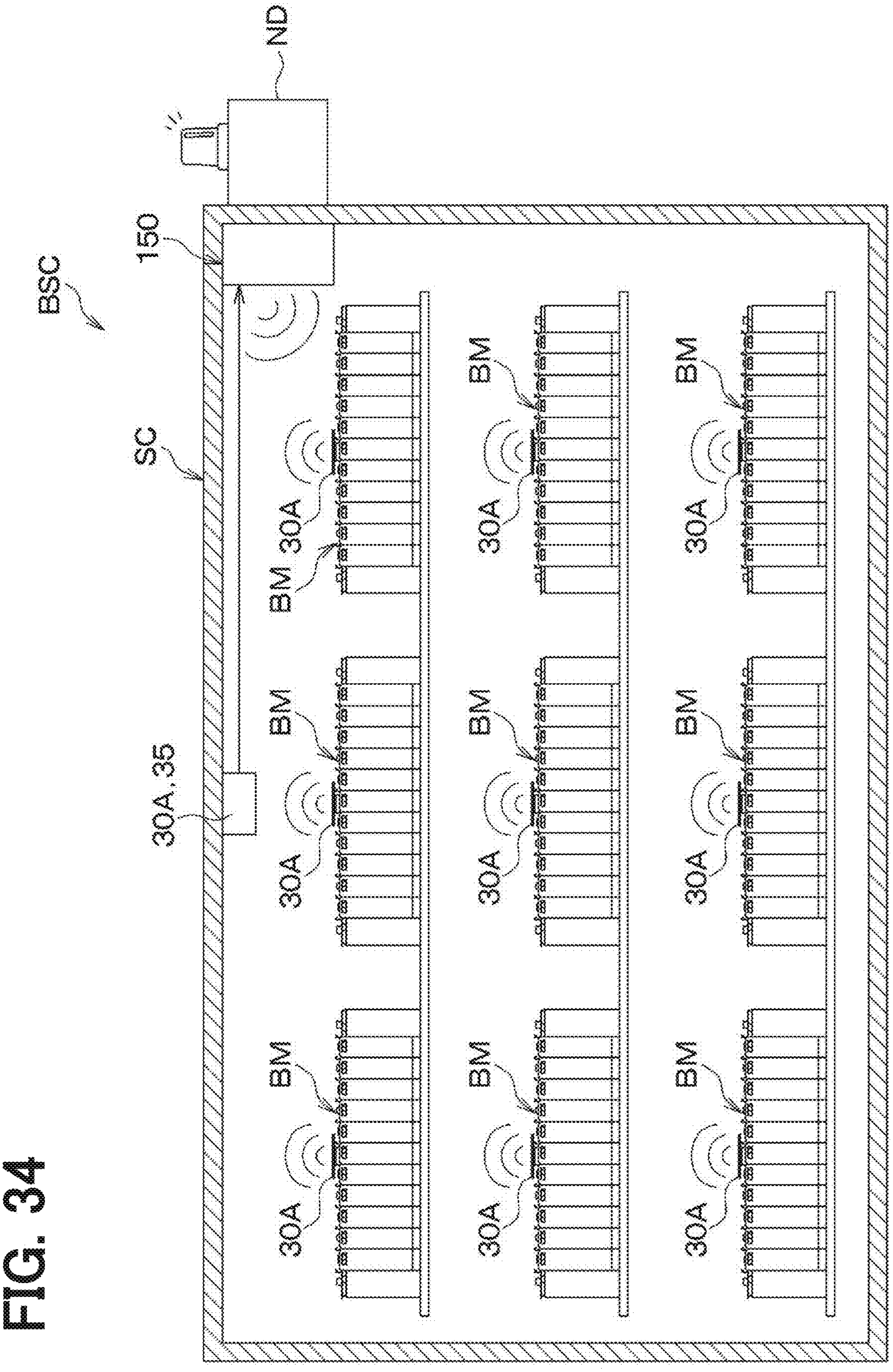
FIG. 34 is a schematic configuration diagram of a battery transport apparatus according to a fourth embodiment.

As shown in FIG. 34, the battery transport apparatus BSC includes the storage container SC that stores the multiple battery modules BM, the sensor unit 30A that detects the battery states of the multiple battery modules BM, and the abnormality detection unit 150.

Figure 35:
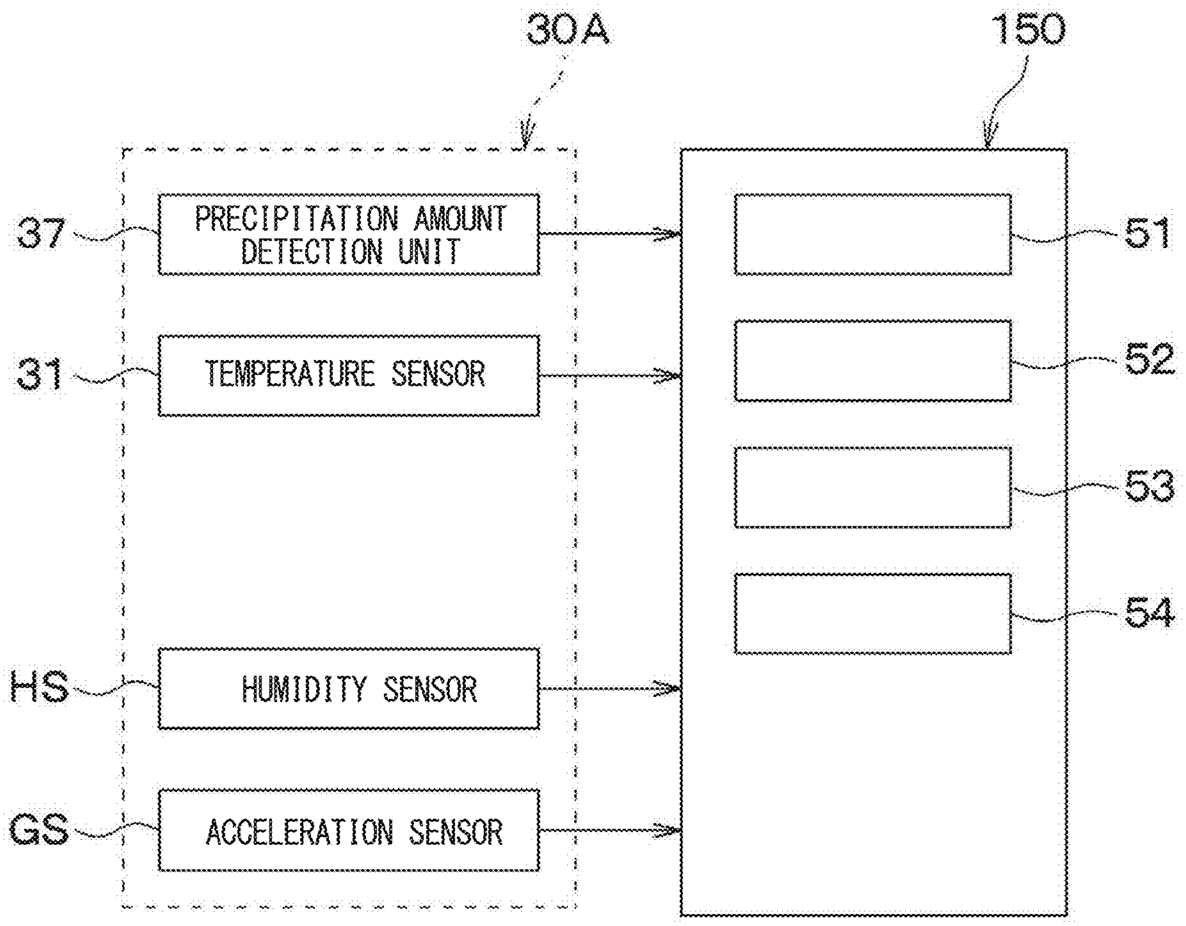
FIG. 35 is a schematic system configuration diagram of the battery transport apparatus.

As shown in FIG. 35, the sensor unit 30A includes a humidity sensor HS and an acceleration sensor GS in addition to the temperature sensor 31, the gas sensor 35, and the precipitation amount detection unit 37 described in the first embodiment. The humidity sensor HS is installed inside the storage container SC to detect the humidity inside the storage container SC. The acceleration sensor GS is set in the storage container SC to detect a vibration or a shock applied to the storage container SC. The sensor unit 30A may include other sensors.

The sensor unit 30A of the present embodiment includes a wireless communication device (not shown) for wireless communication with the abnormality detection unit 150. The sensor unit 30A may include a communication device for wired communication with the abnormality detection unit 150.

The abnormality detection unit 150 reduces the occurrence of the abnormal heat generation phenomenon in advance based on the monitoring result of the factor that leads to the abnormal heat generation phenomenon, and detects the abnormal state that occurs in the battery at the initial stage of the occurrence of the abnormal heat generation phenomenon to implement the countermeasure against the abnormal heat generation phenomenon based on the detection result of the abnormal state. The abnormality detection unit 150 is formed in the same manner as the monitoring module 50 described in the first embodiment. That is, the abnormality detection unit 150 includes the storage unit 51, the wireless communication unit 52, the internal resistance detection unit 53, the monitoring IC 54, and the like.

The abnormality detection unit 150 executes the control process shown in FIG. 12 described in the first embodiment in order to reduce the abnormal heat generation phenomenon in advance and early detect the abnormal heat generation phenomenon. The abnormality detection unit 150 executes the external notification process, the battery protection process, or the like described in the first embodiment as the countermeasure against the abnormal heat generation phenomenon.

In the external notification process, the signal indicating the occurrence of the abnormal heat generation phenomenon is output to the notification device ND, and the occurrence of the abnormal heat generation phenomenon is notified to the outside via the notification device ND. In this external notification process, for example, it is desirable to notify the outside of at least one of the sensor outputs of the temperature sensor 31, the humidity sensor HS, the acceleration sensor GS, or the position information of the battery module BM in which the abnormal heat generation phenomenon has occurred. The reason is that it is easier to clarify the location of responsibility for the occurrence of the abnormal heat generation phenomenon. As the position information of the battery module BM, for example, information specified based on a radio wave intensity of the signal emitted by the sensor unit 30A can be used.

Other aspects are the same as those in the first embodiment. The battery transport apparatus BSC of the present embodiment can obtain the same effects as the first embodiment from the common or equivalent configuration to the first embodiment.

The battery transport apparatus BSC of the present embodiment has the following features.

(1) The battery transport apparatus BSC includes the storage container SC, the factor monitoring unit that monitors the factor that leads to the abnormal heat generation phenomenon in which the temperature of the battery continues to rise unintentionally, and the abnormality detection unit 150 that detects the abnormality in the battery. The abnormality detection unit 150 reduces the occurrence of the abnormal heat generation phenomenon in advance based on the monitoring result of the factor monitoring unit, and detects the abnormal state that occurs in the battery at the initial stage of the abnormal heat generation phenomenon to implement the countermeasure against the abnormal heat generation phenomenon based on the detection result of the abnormal state. According to the above aspect, when the battery is transported, the occurrence of the abnormal heat generation phenomenon can be reduced in advance, and even when the abnormal heat generation phenomenon occurs, an effective heat countermeasure can be implemented, such as implementing the countermeasure from the initial stage of the occurrence of the abnormal heat generation phenomenon.

Modification of Fourth Embodiment

In the fourth embodiment, the battery transport apparatus BSC is described in detail, but the battery transport apparatus BSC need not be the same as the above-described battery transport apparatus BSC, and may be partially different from the above-described battery transport apparatus BSC. The technical matters described in the fourth embodiment can be applied to a device or a system other than the battery transport apparatus BSC.

Other Embodiments

Although the representative embodiments of the present disclosure are described above, the present disclosure is not limited to the above-described embodiments, and various modifications can be made, for example, as follows.

In the battery monitoring device 20 of the present disclosure, the countermeasure against the detection of the lithium precipitation amount of the lithium ion battery via the battery monitoring device 20 is essential, but the countermeasure against the abnormal heat generation of the battery and the estimation of the battery capacity ratio SOH are not essential.

In the above-described embodiment, the lithium precipitation amount and the internal resistance of the battery are monitored as the factors that lead to the abnormal heat generation phenomenon, but physical quantities other than the lithium precipitation amount and the internal resistance of the battery may also be monitored as the factors that lead to the abnormal heat generation phenomenon.

In the above-described embodiment, multiple processes are described as the countermeasures against the abnormal heat generation phenomenon, but the battery monitoring device 20 may execute a part of the processes. The countermeasure against the abnormal heat generation phenomenon may include a process other than the processes described above.

In the above-described embodiment, the abnormality in the internal pressure of the airtight container 11, the abnormality in the temperature of the battery, the abnormality in the voltage of the battery, and the abnormality in the gas inside the airtight container 11 are described as the abnormal states occurring in the battery at the initial stage of the occurrence of the abnormal heat generation phenomenon, but the abnormal state is not limited to this. The battery state other than these battery states may be detected as the abnormal state that occurs at the initial stage of the abnormal heat generation phenomenon.

Although the battery monitoring device 20 described above includes the flexible board FPC or the ASIC circuit, the configuration is not limited thereto. The flexible board FPC and the ASIC circuit are not essential components of the battery monitoring device 20.

As in the above-described embodiment, it is desirable that the battery monitoring device 20 corrects the estimation value of the lithium precipitation amount based on the battery temperature or the parasitic resistance value, but of course this is not essential.

As in the above-described embodiment, it is desirable that the battery monitoring device 20 compares the predetermined battery state estimated from the lithium precipitation amount with the predetermined battery state estimated from other factors to diagnose the appropriateness of the precipitation amount detection unit 37, but of course this is not essential.

In the above-described embodiment, the capacity ratio SOH is estimated based on the lithium precipitation amount and the thickness of the SEI layer of the battery, but the capacity ratio SOH may also be estimated based on other physical quantities. The battery monitoring device 20 may, for example, detect the deterioration state including the crack in the positive electrode of the battery, and calculate the capacity ratio SOH based on the deterioration state.

As in the above-described embodiment, it is desirable that the battery monitoring device 20 can form the battery management system BMS that manages the battery module BM together with the battery management device 60, but of course this is not essential. The same applies to the charging system BCS and the battery evaluation system BRS. The battery evaluation system BRS may be formed as one functional unit in the battery management system BMS.

The monitoring target of the battery monitoring device 20 is not limited to an in-vehicle battery mounted in the vehicle. The battery monitoring device 20 can also be used as a device that monitors a stationary storage battery and a portable storage battery, for example.

The battery monitoring device 20 basically monitors the lithium ion battery, but is not limited to this, and can also monitor any battery that may pose the same problem as battery lithium ion battery. The battery that is the monitoring target of the battery monitoring device 20 need not be the battery in which the multiple battery cells C are modularized.

The battery monitoring device 20 may be connected to the battery ECU 100 in a wired manner instead of a wireless manner. The battery monitoring device 20 is not limited to being completely the same as the above-described battery monitoring device 20, and may be partially different from the above-described battery monitoring device 20.

In the above-described embodiments, it is needless to say that elements forming the embodiments are not necessarily essential except in a case of being particularly noted as being essential, a case of being deemed as being apparently essential in principle, and the like.

In the above-described embodiments, when referring to the number, the numerical value, the amount, the range, and the like of the components of the embodiment, the present disclosure is not limited to a specific number of components of the embodiments, except in a case of being particularly noted as being essential, a case of being limited to a specific number in principle, and the like.

In the above-described embodiments, when referring to the shape, the positional relationship, and the like of the component and the like, the present disclosure is not limited to the shape, the positional relationship, and the like, except in a case of being particularly noted, a case of being limited to a specific shape, a specific positional relationship in principle, and the like.

The control unit and the method therefor of the present disclosure may be realized by a dedicated computer provided by including a processor and a memory that are programmed to execute one or more functions embodied by a computer program. The control unit and the method therefor of the present disclosure may be realized by a dedicated computer provided by including a processor with one or more dedicated hardware logic circuits. The control unit and the method therefor of the present disclosure may be realized by one or more dedicated computers, each including a combination of a processor and a memory that are programmed to execute one or more functions and a processor formed of one or more hardware logic circuits. The computer program may be stored in a computer-readable non-transitory tangible recording medium as an instruction to be executed by the computer.

Features of the Present Disclosure

The present disclosure has the following features.

[Disclosure 1]

A battery monitoring device that monitors a lithium precipitation amount in a lithium ion battery, comprising: a precipitation amount detection unit that includes a short circuit that temporarily shorts both ends of the lithium ion battery to discharge the lithium ion battery, and calculates an estimation value of the lithium precipitation amount based on a change in at least one of current or voltage when both the ends of the lithium ion battery are shorted by the short circuit; and a temperature sensor that detects a battery temperature of the lithium ion battery, wherein the precipitation amount detection unit calculates, as the lithium precipitation amount, a correction value obtained by correcting the estimation value with the battery temperature.

[Disclosure 2]

A battery monitoring device that monitors a lithium precipitation amount in a lithium ion battery, comprising: a precipitation amount detection unit that includes a short circuit that temporarily shorts both ends of the lithium ion battery to discharge the lithium ion battery, and calculates an estimation value of the lithium precipitation amount based on a change in at least one of current or voltage when both the ends of the lithium ion battery are shorted by the short circuit; and a storage unit in which a parasitic resistance value occurring between the lithium ion battery and the short circuit is stored in advance, wherein the precipitation amount detection unit calculates, as the lithium precipitation amount, a correction value obtained by correcting the estimation value with the parasitic resistance value.

[Disclosure 3]

The battery monitoring device as in the disclosure 2, further comprising: a temperature sensor that detects a battery temperature of the lithium ion battery, wherein the precipitation amount detection unit calculates, as the lithium precipitation amount, a correction value obtained by correcting the estimation value with both the parasitic resistance value and the battery temperature.

[Disclosure 4]

The battery monitoring device as in the disclosure 3, wherein the precipitation amount detection unit corrects the parasitic resistance value stored in the storage unit according to the battery temperature, and calculates lithium precipitation amount by using the corrected parasitic resistance value.

[Disclosure 5]

The battery monitoring device as in any one of the disclosures 2 to 4, wherein the parasitic resistance value is obtained by connecting the short circuit to a calibration device having a known impedance before connecting the short circuit to the lithium ion battery.

[Disclosure 6]

The battery monitoring device as in any one of the disclosures 1 to 5, further comprising: a diagnosis unit that compares a predetermined battery state estimated from the lithium precipitation amount with the battery state that is estimated from another element other than the lithium precipitation amount, and diagnoses an appropriateness of the precipitation amount detection unit.

[Disclosure 7]

A battery monitoring device that monitors a lithium precipitation amount in a lithium ion battery, comprising: a precipitation amount detection unit that includes a short circuit that temporarily shorts both ends of the lithium ion battery to discharge the lithium ion battery, and calculates an estimation value of the lithium precipitation amount based on a change in at least one of current or voltage when both the ends of the lithium ion battery are shorted by the short circuit; and a diagnosis unit that compares a predetermined battery state estimated from the lithium precipitation amount with the battery state that is estimated from another element other than the lithium precipitation amount, and diagnoses an appropriateness of the precipitation amount detection unit.

[Disclosure 8]

The battery monitoring device as in any one of the disclosures 1 to 7, further comprising: a storage medium that stores a temporal change in the lithium precipitation amount as one of usage histories or one of manufacturing histories of the lithium ion battery.

[Disclosure 9]

A battery monitoring device that monitors a lithium precipitation amount in a lithium ion battery, comprising: a precipitation amount detection unit that calculates the lithium precipitation amount using an output of a sensor installed in a storage battery including the lithium ion battery; and a storage unit that stores a temporal change of the lithium precipitation amount as one of usage histories or one of manufacturing histories of the lithium ion battery.

[Disclosure 10]

The battery monitoring device as in the disclosure 8 or 9, further comprising: an abnormality specifying unit that specifies, when an abnormality occurs in the lithium ion battery, an occurrence factor of the abnormality based on the one of the usage histories and the one of the manufacturing histories.

[Disclosure 11]

The battery monitoring device as in any one of the disclosures 1 to 9, wherein, when the lithium precipitation amount increases beyond a predetermined threshold, the lithium ion battery is heated by a heating element that rises a temperature of the lithium ion battery.

[Disclosure 12]

A battery management unit that manages a storage battery including a lithium ion battery, comprising: a sensor unit that monitors a battery state including a lithium precipitation amount in the lithium ion battery; and a battery control device that executes a charging control of the storage battery, wherein, when the lithium precipitation amount increases beyond a predetermined threshold, the battery control device heats the storage battery by a heating element that rises a temperature of the storage battery.

[Disclosure 13]

The battery management unit as in the disclosure 12, wherein the sensor unit includes a temperature sensor that detects a battery temperature of the lithium ion battery, and the battery control device heats the storage battery by the heating element when the lithium precipitation amount increases beyond the predetermined threshold and the battery temperature is equal to or lower than a predetermined low temperature threshold in the charging control.

What is claimed is:

1. A battery monitoring device that monitors a lithium precipitation amount in a lithium ion battery, comprising:

a precipitation amount detection unit that includes a short circuit that temporarily shorts both ends of the lithium ion battery to discharge the lithium ion battery, and calculates an estimation value of the lithium precipitation amount based on a change in at least one of current or voltage when both the ends of the lithium ion battery are shorted by the short circuit; and a temperature sensor that detects a battery temperature of the lithium ion battery, wherein the precipitation amount detection unit calculates, as the lithium precipitation amount, a correction value obtained by correcting the estimation value with the battery temperature.

2. The battery monitoring device according to claim 1, further comprising:

a diagnosis unit that compares a predetermined battery state estimated from the lithium precipitation amount with the battery state that is estimated from another element other than the lithium precipitation amount, and diagnoses an appropriateness of the precipitation amount detection unit.

3. The battery monitoring device according to claim 1, further comprising:

a storage medium that stores a temporal change in the lithium precipitation amount as one of usage histories or one of manufacturing histories of the lithium ion battery.

4. The battery monitoring device according to claim 1, wherein when the lithium precipitation amount increases beyond a predetermined threshold, the lithium ion battery is heated by a heating element that rises a temperature of the lithium ion battery.

5. A battery monitoring device that monitors a lithium precipitation amount in a lithium ion battery, comprising:

a precipitation amount detection unit that includes a short circuit that temporarily shorts both ends of the lithium ion battery to discharge the lithium ion battery, and calculates an estimation value of the lithium precipitation amount based on a change in at least one of current or voltage when both the ends of the lithium ion battery are shorted by the short circuit; and a storage unit in which a parasitic resistance value occurring between the lithium ion battery and the short circuit is stored in advance, wherein the precipitation amount detection unit calculates, as the lithium precipitation amount, a correction value obtained by correcting the estimation value with the parasitic resistance value.

6. The battery monitoring device according to claim 5, wherein the parasitic resistance value is obtained by connecting the short circuit to a calibration device having a known impedance before connecting the short circuit to the lithium ion battery.

7. The battery monitoring device according to claim 5, further comprising:

a diagnosis unit that compares a predetermined battery state estimated from the lithium precipitation amount with the battery state that is estimated from another element other than the lithium precipitation amount, and diagnoses an appropriateness of the precipitation amount detection unit.

8. The battery monitoring device according to claim 5, further comprising:

a storage medium that stores a temporal change in the lithium precipitation amount as one of usage histories or one of manufacturing histories of the lithium ion battery.

9. The battery monitoring device according to claim 5, wherein when the lithium precipitation amount increases beyond a predetermined threshold, the lithium ion battery is heated by a heating element that rises a temperature of the lithium ion battery.

10. The battery monitoring device according to claim 5, further comprising:

a temperature sensor that detects a battery temperature of the lithium ion battery, wherein the precipitation amount detection unit calculates, as the lithium precipitation amount, a correction value obtained by correcting the estimation value with both the parasitic resistance value and the battery temperature.

11. The battery monitoring device according to claim 10, wherein the precipitation amount detection unit corrects the parasitic resistance value stored in the storage unit according to the battery temperature, and calculates the lithium precipitation amount by using the corrected parasitic resistance value.

12. A battery monitoring device that monitors a lithium precipitation amount in a lithium ion battery, comprising:

a precipitation amount detection unit that includes a short circuit that temporarily shorts both ends of the lithium ion battery to discharge the lithium ion battery, and calculates an estimation value of the lithium precipitation amount based on a change in at least one of current or voltage when both the ends of the lithium ion battery are shorted by the short circuit; and a diagnosis unit that compares a predetermined battery state estimated from the lithium precipitation amount with the battery state that is estimated from another element other than the lithium precipitation amount, and diagnoses an appropriateness of the precipitation amount detection unit.

13. The battery monitoring device according to claim 12, further comprising:

a storage medium that stores a temporal change in the lithium precipitation amount as one of usage histories or one of manufacturing histories of the lithium ion battery.

14. The battery monitoring device according to claim 12, wherein when the lithium precipitation amount increases beyond a predetermined threshold, the lithium ion battery is heated by a heating element that rises a temperature of the lithium ion battery.

* * * * *